(12) United States Patent
Lim et al.

(10) Patent No.: US 11,251,236 B2
(45) Date of Patent: Feb. 15, 2022

(54) DISPLAY DEVICE AND METHOD FOR INSPECTING ALIGNMENT

(71) Applicant: Samsung Display Co., LTD., Yongin-si (KR)

(72) Inventors: Sang Hoon Lim, Cheonan-si (KR); Jin Hyeong Kim, Asan-si (KR); Young Jin Oh, Bucheon-si (KR); Kyung Ha Choi, Cheonan-si (KR); Ku Hyun Kang, Suwon-si (KR); Hee Cheol Im, Asan-si (KR); Ho Yun Kang, Busan (KR); Jae Young Kim, Asan-si (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

(21) Appl. No.: 16/941,449

(22) Filed: Jul. 28, 2020

(65) Prior Publication Data

US 2021/0210565 A1    Jul. 8, 2021

(30) Foreign Application Priority Data

Jan. 2, 2020 (KR) .......................... 10-2020-0000304

(51) Int. Cl.
*G06F 3/044* (2006.01)
*H01L 27/32* (2006.01)
*G06T 7/00* (2017.01)

(52) U.S. Cl.
CPC ........ *H01L 27/3223* (2013.01); *G06F 3/0446* (2019.05); *G06T 7/001* (2013.01); *H01L 27/323* (2013.01); *H01L 27/3276* (2013.01); *G06F 2203/04111* (2013.01); *G06F 2203/04112* (2013.01); *G06T 2207/30121* (2013.01); *G06T 2207/30204* (2013.01)

(58) Field of Classification Search
CPC .. G06F 2203/04111; G06F 2203/04112; G06F 3/0446; G06T 2207/30121; G06T 2207/30204; G06T 7/001; H01L 27/3223; H01L 27/323; H01L 27/3234; H01L 27/3276; H01L 51/0031
USPC .................................................. 345/170–178
See application file for complete search history.

(56) References Cited

U.S. PATENT DOCUMENTS

| 9,978,781 B2 | 5/2018 | Shin et al. |
| 10,437,113 B2 | 10/2019 | Lee et al. |

(Continued)

FOREIGN PATENT DOCUMENTS

| CN | 110571254 | 12/2019 |
| CN | 110610970 | 12/2019 |

(Continued)

OTHER PUBLICATIONS

Extended European Search Report dated May 4, 2021, issued in European Patent Application No. 20212052.3.

*Primary Examiner* — Tony O Davis
(74) *Attorney, Agent, or Firm* — H.C. Park & Associates, PLC

(57) ABSTRACT

A display device and a method configured to inspect alignment in which the display device includes a substrate having a hole, a non-display area surrounding the hole, and a display area surrounding the non-display area; a display unit disposed on the substrate and having pixels disposed in the display area; and sensing electrodes disposed in the display area and a first alignment mark disposed in the non-display area on the display unit.

24 Claims, 30 Drawing Sheets

(56) References Cited

U.S. PATENT DOCUMENTS

| | | |
|---|---|---|
| 2010/0245271 A1 | 9/2010 | Park |
| 2015/0261365 A1 | 9/2015 | Hong et al. |
| 2016/0306450 A1* | 10/2016 | Chen .................... G06F 3/0446 |
| 2016/0364041 A1* | 12/2016 | He .......................... C23C 14/34 |
| 2017/0045793 A1* | 2/2017 | Cheng ............... H01L 29/78696 |
| 2017/0060309 A1* | 3/2017 | Chen ................. G02F 1/133512 |
| 2019/0087040 A1* | 3/2019 | Zhang ................... G06F 3/0412 |
| 2019/0172790 A1 | 6/2019 | Kim et al. |
| 2019/0235694 A1* | 8/2019 | Aoki ..................... G06F 3/0445 |
| 2020/0168675 A1* | 5/2020 | Kim .................... H01L 27/3223 |
| 2020/0278584 A1* | 9/2020 | Kajita ................. G02F 1/1337 |
| 2020/0294446 A1* | 9/2020 | Long .................. H01L 27/3258 |
| 2020/0299128 A1* | 9/2020 | Suzuki ................. B81B 7/0041 |
| 2021/0004099 A1* | 1/2021 | Sun ...................... G06F 3/0414 |
| 2021/0041986 A1* | 2/2021 | Hsiao ................... G06F 3/0445 |

FOREIGN PATENT DOCUMENTS

| | | |
|---|---|---|
| KR | 10-1097306 | 12/2011 |
| KR | 2015-0108479 | 9/2015 |
| KR | 2017-0031837 | 3/2017 |
| KR | 2018-0021965 | 3/2018 |

* cited by examiner

ND METHOD FOR
DISPLAY DEVICE AND METHOD FOR
INSPECTING ALIGNMENT

This application claims priority from and the benefit of Korean Patent Application No. 10-2020-0000304, filed on Jan. 2, 2020, which is hereby incorporated by reference for all purposes as if fully set forth herein.

BACKGROUND

Field

The present disclosure relates to a display device, and a method of inspecting alignment of a display device.

Discussion of the Background

Display devices become more and more important as multimedia technology evolves. Accordingly, a variety of types of display devices such as organic light-emitting display (OLED) devices and liquid-crystal display (LCD) devices are currently used.

A sensing unit is a kind of information input device and may be incorporated into a display device. In a sensing unit a touch sensor may be attached to one surface of a display panel of a display device or may be fabricated integrally with the display panel. A user can input information by pressing or touching the sensing unit while watching images displayed on the screen of the display device.

The above information disclosed in this Background section is only for understanding of the background of the inventive concepts, and, therefore, it may contain information that does not constitute prior art.

SUMMARY

Exemplary embodiments of the present disclosure provide a display device capable of inspecting whether a hole is properly aligned by using a relative distance between the hole and alignment marks disposed in a non-display area surrounding the hole regardless of the shape and number of the hole formed in the display device.

Exemplary embodiments of the present disclosure also provide a display device capable of reducing a non-display area.

It should be noted that objects of the present disclosure are not limited to the above-mentioned object; and other objects of the present invention will be apparent to those skilled in the art from the following descriptions.

An exemplary embodiment of the present disclosure provides a display device including: a substrate having a hole, a non-display area surrounding the hole, and a display area surrounding the non-display area; a display unit disposed on the substrate and having pixels disposed in the display area; and sensing electrodes disposed in the display area and a first alignment mark disposed in the non-display area on the display unit.

The details of one or more exemplary embodiments of the subject matter described in this specification are set forth in the accompanying drawings and the description below.

The substrate may further include a peripheral area disposed between the non-display area and the display area, and the display device may further include: connection lines disposed in the peripheral area and connecting between the sensing electrodes on the display unit.

The display device may further include a second alignment mark disposed in the non-display area on the display unit and spaced apart from the first alignment mark.

A minimum distance between the first alignment mark and the second alignment mark may be greater than a diameter of the hole.

The first alignment mark may be symmetric to the second alignment mark with respect to a center point of the hole.

The display device may further include a third alignment mark disposed in the non-display area on the display unit and spaced apart from the first alignment mark and the second alignment mark.

The sensing electrode may include first sensing electrodes electrically connected in a direction, second sensing electrodes electrically connected in a direction crossing the direction, and connectors connecting between the first sensing electrodes adjacent to each other in the direction. The connectors may be disposed on the display unit, and the first sensing electrodes and the second sensing electrodes may be disposed on a sensing insulating layer disposed on the connectors.

The first alignment mark may be disposed on the sensing insulating layer.

The first alignment mark may include a same material as the first sensing electrodes and the second sensing electrodes.

The first alignment mark may be disposed on the display unit.

The first alignment mark may include a same material as the connectors.

The display device may further include a test line disposed in the non-display area on the display unit and overlapping the first alignment mark.

A light transmittance of the test line may be greater than a light transmittance of the first alignment mark.

A width of the test line may be less than a width of the first alignment mark.

The test line may be disposed on the display unit, and the first alignment mark may be disposed on the sensing insulating layer.

The test line may include a same material as the connectors, and the first alignment mark may include a same material as the first sensing electrodes and the second sensing electrodes.

The first alignment mark may include a first main alignment mark and a first auxiliary alignment mark having different sizes and spaced apart from each other in a direction.

The display device may further include a second alignment mark disposed in the non-display area on the display unit and spaced apart from the first alignment mark in another direction intersecting the direction.

The first alignment mark may be symmetric to the second alignment mark with respect to a center point of the hole.

Another exemplary embodiment of the disclosure provides a method of inspecting alignment, including placing a display panel on a support, the display panel including a hole, a non-display area surrounding the hole and including a first alignment mark, and a display area surrounding the non-display area; capturing an image for inspection on the hole and the first alignment mark in the non-display area from above the hole and the non-display area; and determining that the display panel is normal if a distance between a first alignment image pattern and a hole image pattern of the image for inspection in a direction is within a tolerance range The first alignment image pattern may be associated with the first alignment mark, and the hole image pattern may be associated with the hole.

The method may further include determining that the display panel is defective if the distance between the first alignment image pattern and the hole image pattern in the image for inspection is not within the tolerance range.

The display panel may further include a second alignment mark disposed in the non-display area, and a side of the first alignment image pattern and a side of the second alignment image pattern associated with the second alignment mark may be arranged in parallel in the image for inspection.

According to an exemplary embodiment of the present disclosure, it is possible to inspect whether a hole is properly aligned by using a relative distance between the hole and alignment marks disposed in a non-display area surrounding the hole regardless of the shape and number of the hole formed in the display device.

According to another exemplary embodiment of the present disclosure, it is possible to reduce a non-display area by overlapping a test line with alignment marks disposed in the non-display area.

It should be noted that effects of the present disclosure are not limited to those described above and other effects of the present disclosure will be apparent to those skilled in the art from the following descriptions.

It is to be understood that both the foregoing general description and the following detailed description are exemplary and explanatory and are intended to provide further explanation of the invention as claimed.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION

Figure 1:
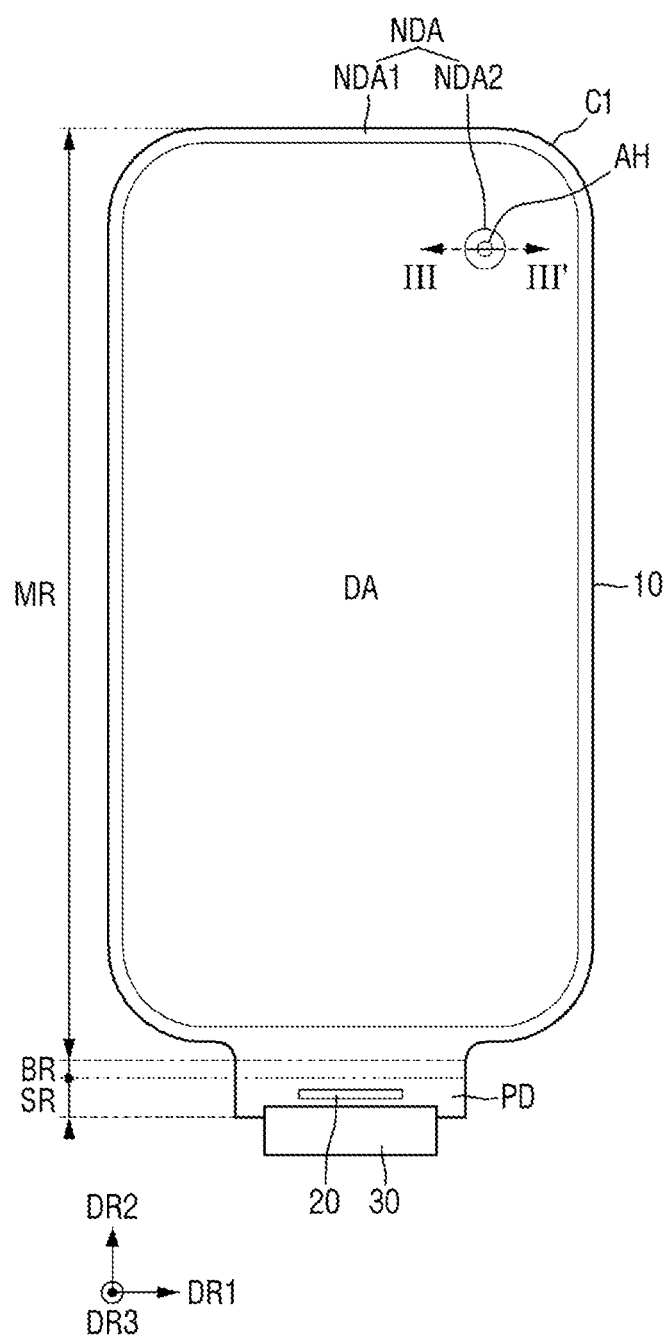
FIG. 1 is a plan view illustrating the layout of a display device according to an exemplary embodiment of the present disclosure.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1 and D1-axis, the DR2 and D2-axis, and the DR3 and D3-axis are not limited to three axes of a rectangular coordinate system, such as the x, y, and z-axes, and may be interpreted in a broader sense. For example, the DR1 and D1-axis, the DR2 and D2-axis, and the DR3 and D3-axis may be perpendicular to one another, or may represent different directions that are not perpendicular to one another. As used herein, the term "and/or" includes any and all combinations of one or more of the associated listed items.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present invention. Similarly, the second element could also be termed the first element.

The present invention and exemplary embodiments will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will filly convey the scope of the invention to those skilled in the art.

Figure 2:
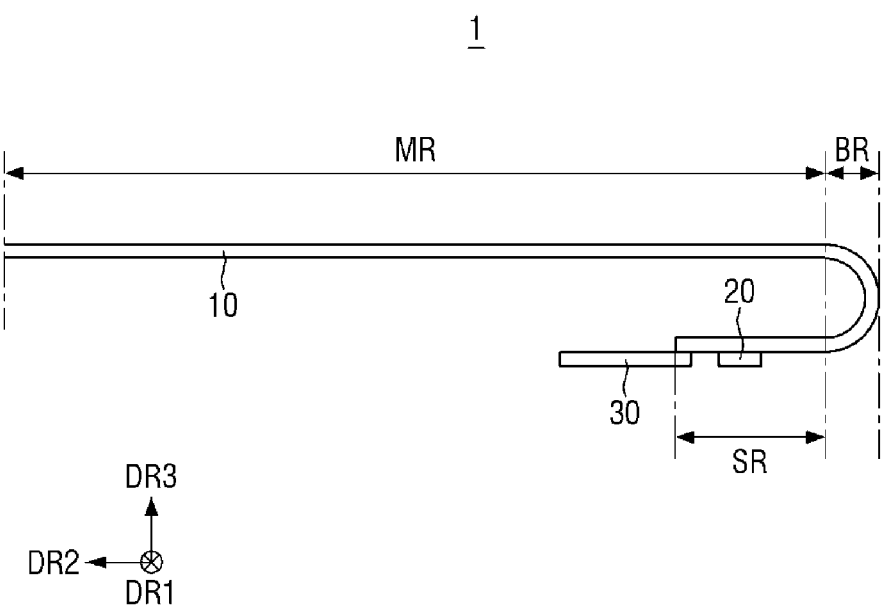
FIG. 2 is a cross-sectional view illustrating a part of a display device according to an exemplary embodiment of the present disclosure.

FIG. 1 is a plan view illustrating the layout of a display device according to an exemplary embodiment of the present disclosure. FIG. 2 is a cross-sectional view of a part of a display device according to an exemplary embodiment of the present disclosure.

In the drawings, a first direction DR1, a second direction DR2 and a third direction DR3 are defined. The first direction DR1 may be perpendicular to the second direction DR2 in a plane The third direction DR3 may be perpendicular to the plane where the first direction DR1 and the second direction DR2 are located. The third direction DR3 may be perpendicular to each of the first direction DR1 and the second direction DR2. In the following description, the third direction DR3 may refer to the thickness direction of a display device 1. Aspects of exemplary embodiments may be referred to in relationship to the direction along which they reside or extend, and relationships between one component and another may use directional attributes as one way of identifying differences.

In the following description, the first direction DR1 indicates the right direction, the opposite direction of the first direction DR1 indicates the left direction, the second direction DR2 indicates the upper direction, and the opposite direction of the second direction DR2 indicates the lower direction, unless specifically stated otherwise. In addition, the upper portion indicates a side in the third direction DR3 where images are displayed, and likewise the upper surface indicates a surface facing the side in the third direction DR3. In addition, the lower portion indicates the opposite side in the third direction DR3, and likewise the lower surface indicates a surface facing the opposite side in the third direction DR3. One skilled in the art will recognize that these are relative terms in regards to what orientation is being used to view objects, and the terms may be used for convenience when desired.

Referring to FIGS. 1 and 2, the display device 1 is configured to display moving images or still images. The display device 1 may be used as the display screen of portable electronic devices such as a mobile phone, a smart phone, a tablet PC, a smart watch, a watch phone, a mobile communications terminal, an electronic notebook, an electronic book, a portable multimedia player (PMP), a navigation device and a ultra mobile PC (UMPC), as well as the display screen of various products such as a television, a notebook, a monitor, a billboard and the Internet of Things. Examples of the display device 1 may be an organic light-emitting display device, a liquid-crystal display device, a plasma display device, a field emission display device, an electrophoretic display device, an electro-wetting display device, a quantum dot light-emitting display device, a micro LED display device and the like. In the following description, an organic light-emitting display device will be described as an example of the display device 1. It is, however, to be understood that the present disclosure is not limited thereto.

The display device 1 according to an exemplary embodiment of the present disclosure may include a display panel 10, a driving circuit 20 and a circuit board 30.

The display panel 10 may include a flexible substrate including a flexible polymer material such as polyimide. Accordingly, the display panel 10 may be curved, bent, folded, or rolled.

The display panel 10 may include a main region MR and a protruding region BR/SR protruding from one side of the main region MR.

The main region MR may have a shape generally similar to the appearance of the display device 1 when viewed from the top. According to an exemplary embodiment of the present disclosure, when the display device 1 has a rectangular shape having shorter sides in the first direction DR1 and longer sides in the second direction DR2 when viewed from the top, the main region MR may have a rectangular shape having shorter sides in the first direction DR1 and longer sides in the second direction DR2. Each of the corners where the short side in the first direction DR1 meets the longer side in the second direction DR2 may be rounded with a predetermined curvature or may be a right angle. The shape of the display device 1 when viewed from the top is not limited to a quadrangular shape, but may be formed in another polygonal shape, circular shape, or elliptical shape. The main region MR may be a flat region located in one plane. It is, however, to be understood that the present disclosure is not limited thereto. At least one of the edges of the main region MR except for the edge (side) connected to the protruding region BR/SR may be bent to form a curved surface or may be bent at a right angle.

A hole AH (or an internal groove) penetrating through the display panel 10 may be formed in the main region MR. The hole AH may be disposed adjacent one corner Cl of the main region MR, but embodiments are not limited thereto. The hole AH may be positioned different distances from the corner Cl or be disposed adjacent other corners of the main region MR or other locations on the main region MR.

The main region MR may include a display area DA displaying images and a non-display area NDA not displaying images.

The display area DA may be an area where images are displayed. The display area DA may be disposed at a center portion of the main region MR. Pixels may be disposed in the display area of the display panel 10. Scan lines, data lines and power lines connected to the pixels may also be disposed in the display area DA of the display panel 10. In addition, a sensing area configured to sense a user's touch may overlap the display area DA or may be disposed in the display area DA. The sensing area may take up the entire area DA or a portion of it.

Similar to the main region MR, the display area DA may have a rectangular shape or a rectangular shape with rounded corners. In the example illustrated in FIG. 1, the shape of the display area DA is a rectangle that has rounded corners and has its sides in the second direction DR2 longer than its sides in the first direction DR1. It is, however, to be understood that the present disclosure is not limited thereto. The display area DA may have various shapes such as a rectangular shape with its sides in the first direction DR1 longer than its sides in the second direction DR2, a square shape, other polygonal shapes, a circular shape, and an elliptical shape.

The non-display area NDA may be defined as an area where no image is displayed. The non-display area NDA may include a first non-display area NDA1 surrounding the display area DA, and a second non-display area NDA2 disposed inside the display area DA. The NDA extends around a periphery of the MR and includes the protruding portion BR/SR.

The first non-display area NDA1 may surround the edges of the display area DA. The NDA1 may include a scan driver configured to apply scan signals to scan lines, fan-out lines connecting the data lines with the driving circuit 20, and sensing signal lines configured to apply signals to the sensing area.

The second non-display area NDA2 may be located in the display area DA and may be surrounded by the display area DA. The second non-display area NDA2 may surround the hole AH formed in the display panel 10. The second non-display area NDA2 may include the scan lines and data lines or connection lines that electrically connect sensing electrodes to each other. Aspects of the scan lines, data lines, and connection lines disposed the second non-display area NDA2 are described herein.

The protruding region BR/SR may protrude from one side of the main region MR. For example, the protruding region may protrude from the lower side of the main region MR as illustrated in FIG. 1. A length of the protruding region in the first direction DR1 may be smaller than the length of the main region MR in the first direction DR1.

The protruding region BR/SR may include a bending region BR where the display panel 10 is bent, and a subsidiary region SR including a pad area PD. As illustrated, the main region MR may be disposed on one side of the bending region BR as compared to the subsidiary region, and the subsidiary region SR may be disposed on the other side of the bending region BR in relation to the main region MR. For example, the main region MR may be disposed on the upper side of the bending region BR, and the subsidiary region SR may be disposed on the lower side of the bending region BR.

The bending region BR is connected to one side of the main region MR in the second direction DR2. For example, the bending region BR may be connected to a lower shorter side of the main region MR. The portions where the main region MR meet the bending region BR may be cut in an L-shape.

As illustrated in FIG. 2, the main region MR ends at a relative point where the bending region BR begins to bend. Likewise the subsidiary region SR has a demarcation point relative to the location where another portion of the bending region stops bending.

In the bending region BR, the display panel 10 may be bent downward (into the page in FIG. 1) in the thickness direction DR3, i.e., in the direction away from the display surface with a curvature. Although the bending region BR may have a constant radius of curvature, the present disclosure is not limited thereto. It may have different radii of curvature for different sections. As the display panel 10 is bent at the bending region BR, the surface of the display panel 10 may be reversed. As illustrated in FIG. 2, the protruding portion BR/SR of the surface of the display panel 10 that originally faced upward may be bent so that it faces outward at the bending region BR and then faces downward.

The subsidiary region SR extends from the bending region BR. As illustrated in FIG. 2, the subsidiary region SR may be extended in a direction parallel to the main region MR after the display device has been bent. The sub region SR may overlap a portion of the main region MR in the thickness direction DR3 of the display panel 10. The width of the subsidiary region SR may be, but is not limited to being, equal to the width of the bending region BR.

The driving circuit 20 may be disposed on the subsidiary region SR of the display panel 10. The driving circuit 20 may be configured to output signals and voltages to drive the display panel 10. For example, the driving circuit 20 may apply data voltages to the data lines. In addition, the driving circuit 20 may apply supply voltage to power lines and may apply scan control signals to the scan driver. The driving circuit 20 is disposed on the surface of the display panel 10 which is the display surface. As the bending region BR is bent and reversed as described above and illustrated in FIG. 2, the driving circuit 20 is mounted on the surface of the display panel 10 facing downward in the thickness direction DR3 of the display device 1, such that the upper surface of the driving circuit 20 may face downward.

The driving circuit 20 may be implemented as an integrated circuit (IC) and may be attached to the display panel 10 in the subsidiary region SR by a chip-on-glass (COG) technique, a chip-on-plastic (COP) technique, or an ultrasonic bonding. A width of the driving circuit 20 in the first direction DR1 may be smaller than the width of the display panel 10 in the first direction DR1 and smaller than a width of the protruding region BR/SR in the first direction DR1. The driving circuit 20 may be disposed at a center portion of the subsidiary region SR in the first direction DR1, and both side surfaces of the driving circuit 20 may be spaced apart from the left and right edges of the subsidiary region SR, respectively.

The pad area PD may be disposed towards one end of the subsidiary region SR of the display panel 10, away from the main region MR. The pad area PD may include a plurality of display pads (illustrated in FIG. 4) electrically connected to the driving circuit 20, and a plurality of sensing pads (illustrated in FIG. 4) electrically connected to sensing lines.

The circuit board 30 may be connected to the pad area PD disposed at one end of the subsidiary region SR. The circuit board 30 may be attached to the above-described display pads using an anisotropic conductive film. In this manner, the lead lines of the circuit board 30 may be electrically connected to the display pads. The circuit board 30 may be a flexible printed circuit board, a printed circuit board, or a flexible film such as a chip-on-film. The circuit board 30 may be an integrated driving circuit board which drives a display unit DU (see FIG. 3) and a sensing unit TDU (see FIG. 3) together. It is to be understood that the present disclosure is not limited thereto. A separate sensing driving circuit board may be attached to the subsidiary region SR of the display panel 10.

Figure 3:
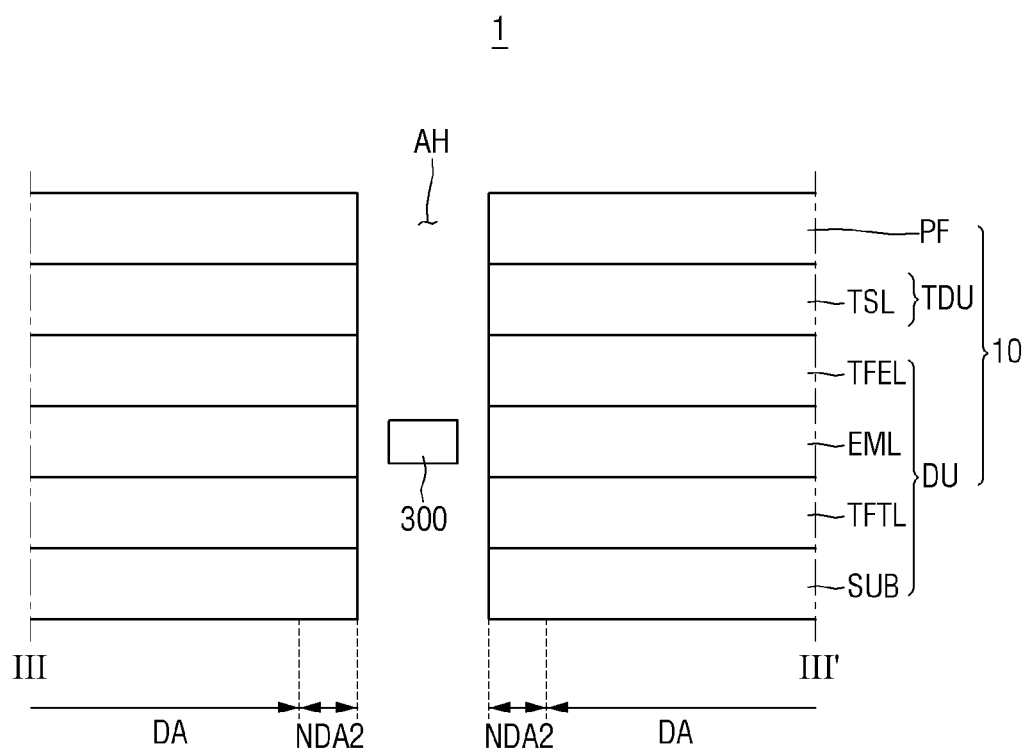
FIG. 3 is a cross-sectional view taken along line III-III' of FIG. 1.

FIG. 3 is a cross-sectional view taken along line III-III' of FIG. 1.

Referring to FIGS. 1 and 3, the display device 1 may include a display unit DU having a substrate SUB, a thin-film transistor layer TFTL disposed on the substrate SUB, a light-emitting element layer EML disposed on the TFTL, and a thin-film encapsulation layer TFEL disposed on the EML. A sensing unit TDU may have a sensing layer TSL that is disposed on the TFEL. The display panel 10 may further include a polarization layer PF atop the sensing unit TDU. The sensing unit TDU may thereby be disposed on the display unit DU, and a polarization layer PF may be disposed on the sensing unit TDU. Thus the display panel 10 may be composed of the light-emitting layer EML and thin-film encapsulation layer TFEL of the display unit DU, as well as the sensing unit TDU and polarization layer PF.

As described above and as illustrated in FIGS. 1 and 3, the second non-display area NDA2 may surround the hole AH. The hole AH may be formed through front and rear surfaces of the display unit DU, the sensing unit TDU, and the polarization layer PF of the display panel 10. That is to say, a through hole (or an opening or a hole) corresponding to the hole AH may be formed in each of the display unit DU, the sensing unit TDU and the polarization layer PF. In the following description, the through hole formed in the display unit DU and the sensing unit TDU will be referred to as the hole AH of the display panel for convenience of illustration and description.

The hole AH may have a circular shape when viewed from the top. The hole AH may also be formed of a cylindrical shape. It is, however, to be understood that the present disclosure is not limited thereto. The hole AH may have a variety of shapes. In some exemplary embodiments, the hole AH may have a polygonal shape including a quadrangle or an amorphous shape when viewed from the top or from cross-section. The hole AH may have a shape of a polygonal pillar or an irregular pillar.

The display unit DU may be disposed in the display area DA, the first non-display area NDA1 and the second non-display area NDA2. The hole AH (or through hole) penetrating the display unit DU and corresponding to the hole AH of the display panel 10 may be formed in the display unit DU. The second non-display area NDA2 may surround the through hole AH or the hole formed in the display unit DU.

The hole AH may include a functional module 300 that may be disposed under a window area (not illustrated) and spaced apart from the window. The functional module 300 may be disposed inside the hole area AH of the display area DA.

The functional module 300 may include a camera module configured to take a photo of (or recognize) an image of an object located in front of the display device 1, a face recognition sensor module configured to sense a face of a user, a pupil recognition sensor module configured to sense pupils of a user, an acceleration sensor module configured to determine a movement of the display device, a proximity sensor module and an infrared sensor module configured to detect proximity to a front surface of the display device, an ambient light sensor module configured to measure external brightness, or the like. The functional module 300 may sense or recognize the object or the user located in front of the display device 1 through the window area.

The substrate SUB may be made of an insulating material such as glass, quartz and a polymer resin. Examples of the polymer material may include polyethersulphone (PES), polyacrylate (PA), polyacrylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP) or a combination thereof. Alternatively, the substrate SUB may include a metallic material.

The substrate SUB may be a rigid substrate or a flexible substrate that can be bent, folded, rolled, and so on. When the substrate SUB is a flexible substrate, it may be formed of, but is not limited to, polyimide (PI).

The thin-film transistor layer TFTL may be disposed on the substrate SUB. On the thin-film transistor layer TFTL numerous lines such as scan lines, data lines, power supply lines, scan control lines, fan-out lines, and routing lines connecting the pads with the data lines may be formed as well as thin-film transistors in the pixels. Each of the thin-film transistors may include a gate electrode, a semiconductor layer, a source electrode and a drain electrode.

The light-emitting element layer EML may be disposed on the thin-film transistor layer TFTL. The light-emitting element layer EML may be an organic emissive layer including an organic material. The light-emitting element layer EML may include a hole transporting layer, an organic light-emitting layer and an electron transporting layer. In operation but not illustrated, when a first voltage is applied to a first electrode and a cathode voltage is applied to a second electrode through a thin-film transistor on the thin-film transistor layer TFTL, holes and electrons move to the organic light-emitting layer through the hole transporting layer and the electron transporting layer, respectively, such that they combine in the organic light-emitting layer to emit light. The pixels on the light-emitting element layer EML may be disposed in the display area DA.

The thin-film encapsulation layer TFEL may be disposed on the light-emitting element layer EML. The thin-film encapsulation layer TFEL serves to prevent oxygen or moisture from permeating into the light-emitting element layer EML. In addition, the thin-film encapsulation layer TFEL protects the light-emitting element layer EML from foreign substances such as dust. To this end, the thin-film encapsulation layer TFEL may include an inorganic layer or a stack of an inorganic layer and an organic layer.

The sensing unit TDU may be disposed on the thin-film encapsulation layer TFEL. The sensing unit TDU may be disposed in the display area DA and the first non-display area NDA1. In addition, the sensing unit TDU may be extended from the display area DA to the second non-display area NDA2 and may be disposed in a part of the second non-display area NDA2. The part of the second non-display area NDA2 where the sensing unit TDU is disposed may not overlap the hole AH.

The sensing unit TDU may include the sensing layer TSL.

The sensing layer TSL may be disposed on the thin-film encapsulation layer TFEL. The sensing layer TSL may be configured to sense a user's touch input and may perform the functions of a touch member. The sensing layer TSL may include sensor electrodes configured to sense a user's touch by mutual capacitive sensing, and sensing lines configured to connect pads with the sensing electrodes. The sensing layer TSL may include alignment marks in the second non-display area NDA2 that are used to inspect an alignment of the hole AH of the display device 1 as described herein.

As the sensing layer TSL is disposed directly on the thin-film encapsulation layer TFEL, the thickness of the display device 1 can be reduced, compared with a display device in which a separate touch panel including the sensing layer TSL is attached on the thin-film encapsulation layer TFEL.

The polarization layer PF may be disposed on the sensing layer TSL. The polarization layer PF may be disposed in the display area DA and the first non-display area NDA1. In addition, the polarization layer PF may be extended from the display area DA to the second non-display area NDA2 and may be disposed in a part of the second non-display area NDA2. The part of the second non-display area NDA2 where the polarization layer PF is disposed may not overlap the hole AH.

In an exemplary embodiment, the polarization layer PF may be a polarizing film. The polarizing film may include a linear polarizer and a phase retardation film such as a $\lambda/4$ (quarter-wave) plate. In such case, the phase retardation film may be disposed on the sensing layer TSL, and the linear polarizer may be disposed on the phase retardation film.

Although not illustrated in the drawings, the display panel 10 may further include a protective layer disposed on the polarization layer PF. The protective layer may include, for example, a window member. The protective layer may be attached on the polarization layer PF by a transparent adhesive member such as an optically clear adhesive (OCA) film. In such case, the protective layer does not include the hole AH, and may be disposed on the polarization layer PF to completely cover the display area DA, the first non-display area NDA1, the second non-display area NDA2, and the area overlapping the hole. That is to say, the protective layer may be disposed on the polarization layer PF to cover the hole AH formed under the protective layer. It is, however, to be understood that the present disclosure is not limited thereto. The protective layer may include the hole AH formed through the protective layer.

Figure 4:
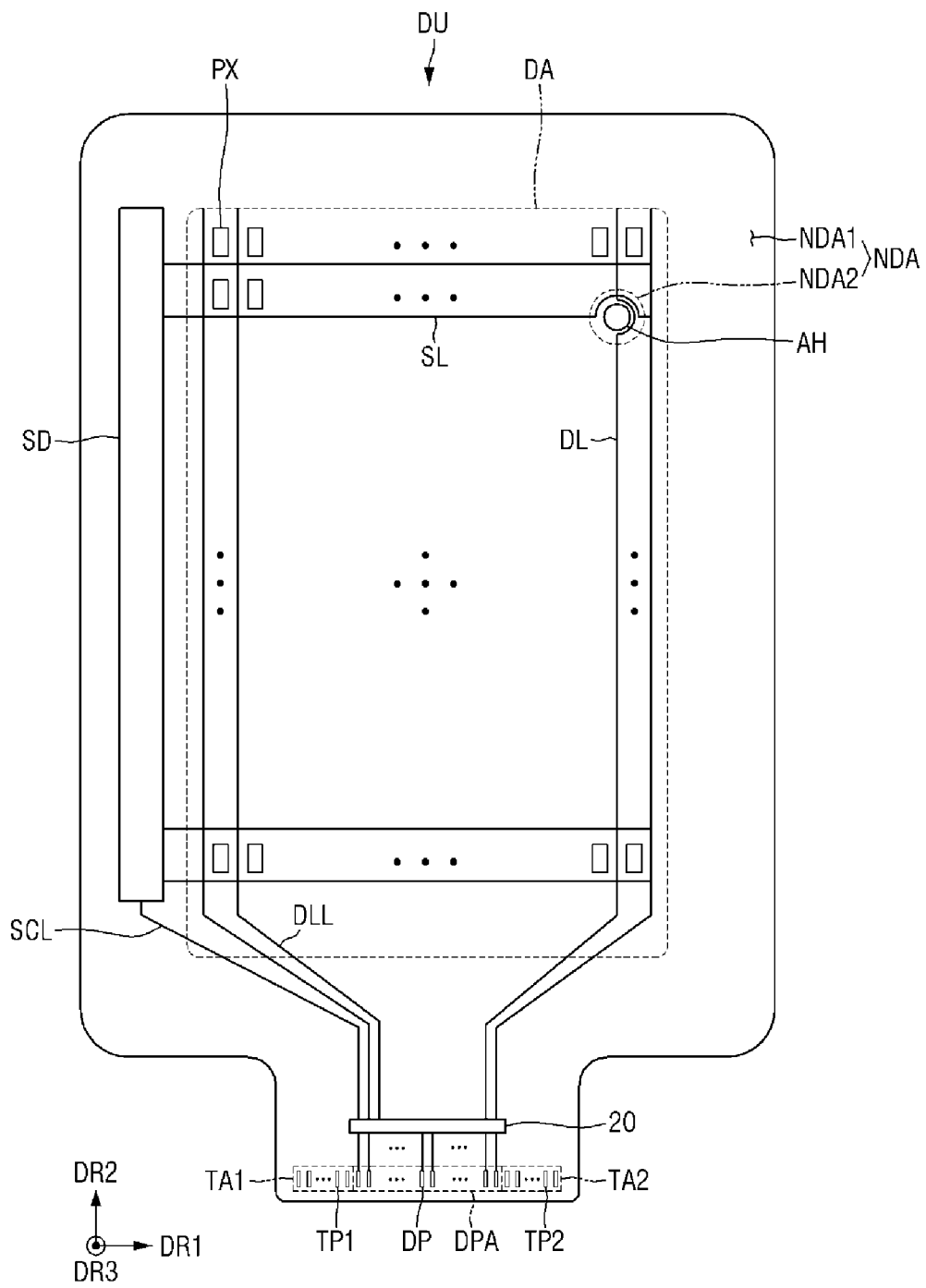
FIG. 4 is a plan view illustrating a display unit and associated elements according to an exemplary embodiment of the present disclosure.

FIG. 4 is a plan view illustrating a display unit DU and associated elements according to an exemplary embodiment of the present disclosure.

For convenience of illustration, FIG. 4 illustrates aspects of the display unit DU including pixels PX, scan lines SL, data lines DL, scan control lines SCL, fan-out lines DLL, a scan driver SD, a driving circuit 20 and display pads DP of the display unit DU.

Referring to FIG. 4, in the display unit DU, the display area DA, the first non-display area NDA1 and the second non-display area NDA2 are defined. The display area DA, the first non-display area NDA1 and the second non-display area NDA2 of the display unit DU may correspond to the display area DA, the first non-display area NDA1 and the second non-display area NDA2 of the display panel 10, respectively.

The pixels PX may be disposed in the display area DA. The scan lines SL and the data lines DL may be disposed in the display area DA and the second non-display area NDA2.

The scan lines SL may be extended in the first direction DR1 in the display area DA, and the data lines DL may be extended in the display area DA in the second direction DR2 intersecting the first direction DR1. Some of the scan lines SL and some of the data lines DL may be extended around the hole AH. Because some of the scan lines SL and/or the data lines EL are extended around the hole AH, at least a part of the some lines may be disposed in the second non-display area NDA2.

Each of the pixels PX may be connected to at least one of the scan lines SL and at least one of the data lines DL. Each of the pixels PX may include thin-film transistors including a driving transistor and at least one switching transistor, a light-emitting element, and a capacitor. When a scan signal is applied from a scan line SL, each of the pixels PX receives a data voltage of a data line DL and supplies a driving current to the light-emitting element according to the data voltage applied to the gate electrode, so that light is emitted. Although an organic light-emitting element including an anode electrode, an organic emitting layer and a cathode electrode has been described as an example of the light-emitting element, the present disclosure is not limited thereto. The light-emitting element may be implemented as a quantum-dot light-emitting element including an anode electrode, a quantum-dot emitting layer and a cathode electrode, as an inorganic light-emitting element including an anode electrode, an inorganic emitting layer having an inorganic semiconductor and a cathode electrode, or side a micro light-emitting element including a micro light-emitting diode.

The scan driver SD is connected to the driving circuit 20 through a plurality of scan control lines SCL. The scan driver SD may receive a scan control signal from the driving circuit 20 through the scan control lines SCL. The scan driver SD generates scan signals according to the scan control signal and supplies the scan signals to the scan lines SL.

Although the scan driver SD is formed in the first non-display area NDA1 on the left side of the display area DA in FIG. 4, the present disclosure is not limited thereto. For example, the scan driver SD may be formed in the first non-display area NDA1 on the left side as well as right side of the display area DA.

The driving circuit 20 is connected to the display pads DP to receive digital video data and timing signals. The driving circuit 20 converts the digital video data into analog positive/negative data voltages and supplies them to the data lines DL through the fan-out lines DLL. In addition, the driving circuit 20 generates and supplies the scan control signal configured to control the scan driver SD through the scan control lines SCL. The pixels PX to which the data voltages are to be supplied are selected by the scan signals of the scan driver SD, and the data voltages are supplied to the selected pixels PX.

As illustrated in FIG. 4, the display unit DU may include display pads DP electrically connected to the driving circuit 20 and sensing pads TP1 and TP2 electrically connected to sensing lines. A display pad area DPA in which the display pads DP are disposed may be located between the first touch pad area TPA1 in which first touch pads TP1 are disposed and the second touch pad area TPA2 in which second touch pads TP2 are disposed. As illustrated in FIG. 4, the display pad area DPA may be disposed at the center of one end of the subsidiary region SR, the first sensor pad area TPA1 may be disposed at the left side of the end of the subsidiary region SR, and the second sensor pad area TPA2 may be disposed on the right side of the end of the subsidiary region SR.

The circuit board 30 described above may be attached on the display pads DP and the sensing pads TP1 and TP2 using an anisotropic conductive film. Accordingly, the lead lines of the circuit board 30 may be electrically connected to the display pads DP and the sensing pads TP1 and TP2.

Figure 5:
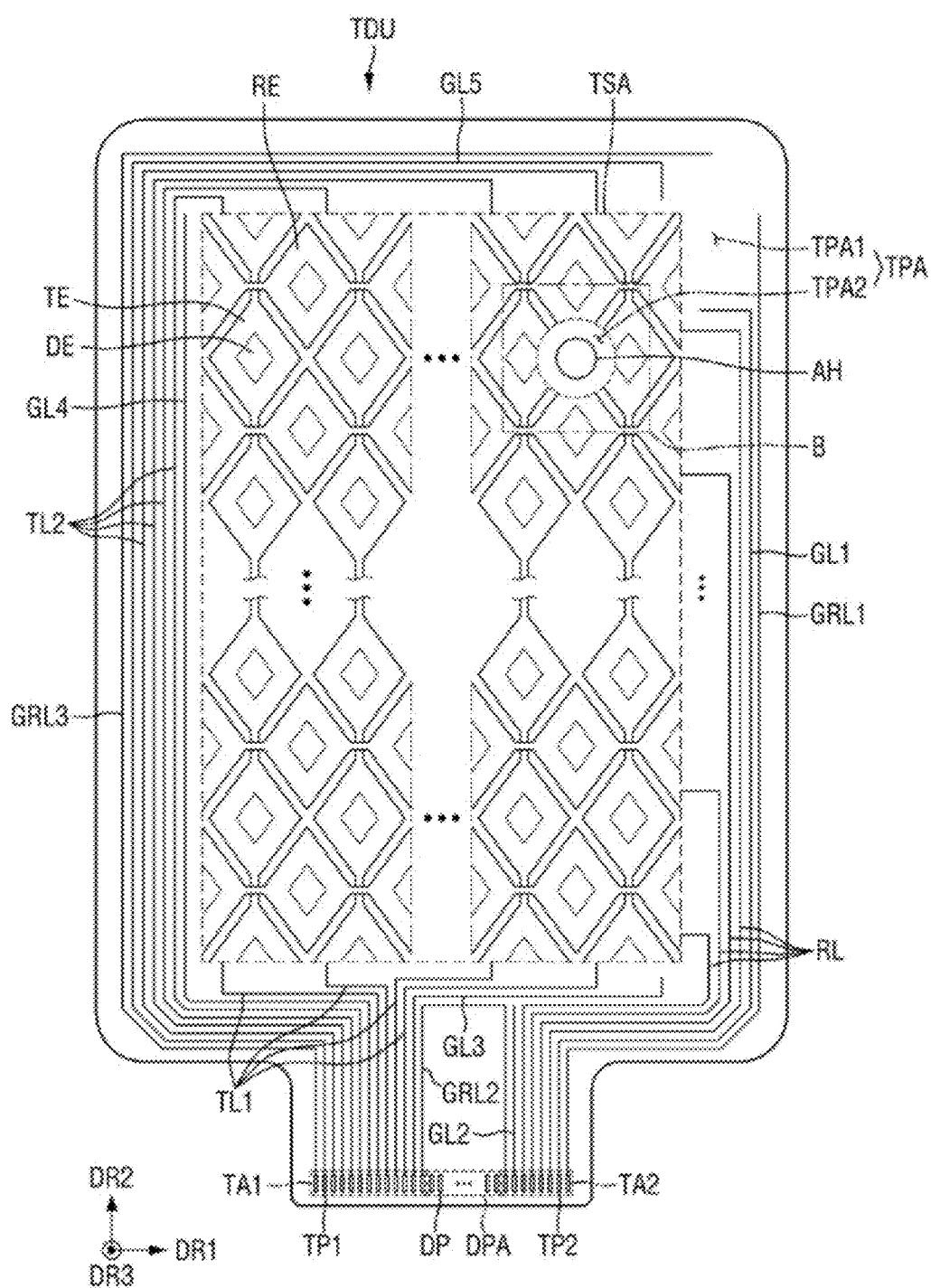
FIG. 5 is a plan view illustrating a sensing unit and associated elements according to an exemplary embodiment of the present disclosure.
Figure 6:
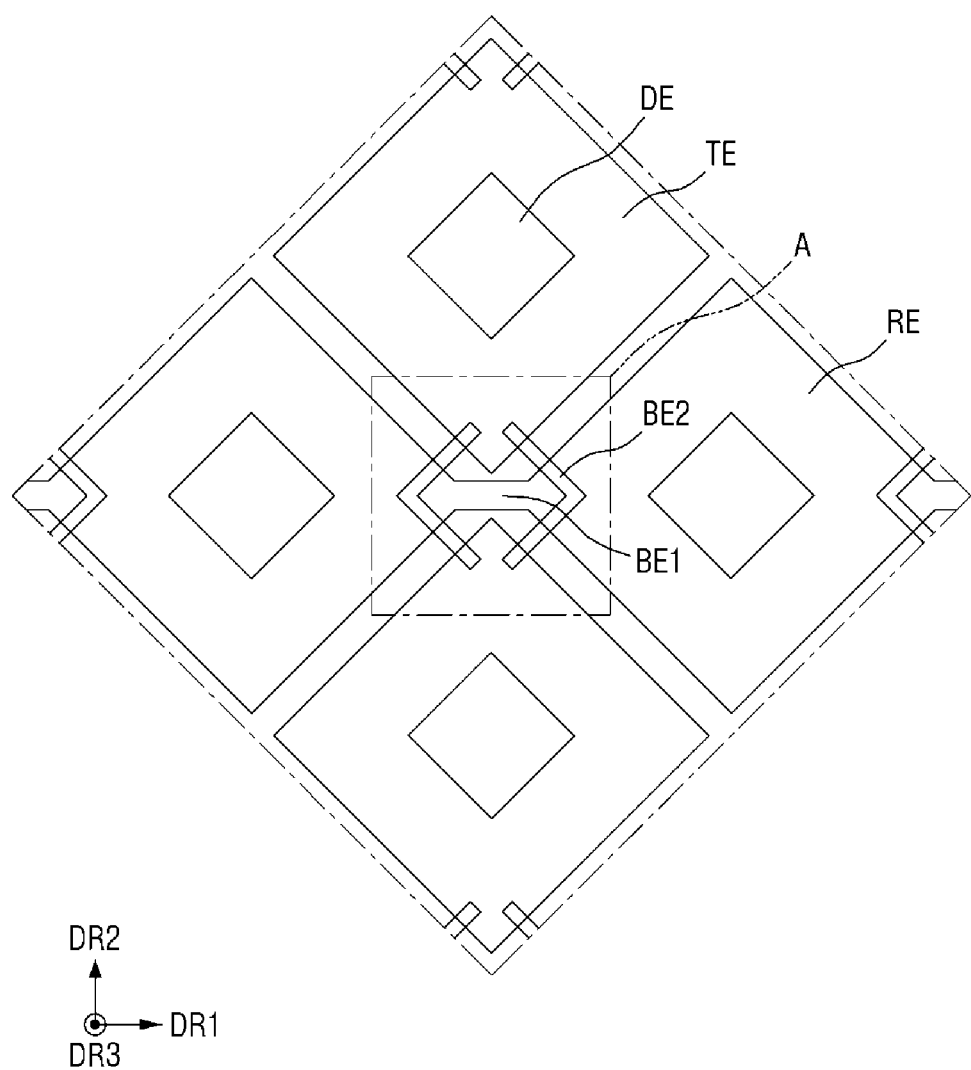
FIG. 6 is an enlarged view illustrating a part of a sensing area of FIG. 5.

FIG. 5 is a plan view illustrating a sensing unit and associated elements according to an exemplary embodiment of the present disclosure. FIG. 6 is an enlarged view of a part of a sensing area of FIG. 5.

Referring to FIG. 5, the sensing unit TDU includes a sensing area TSA configured to sense a user's touch and a non-sensing area TPA. The non-sensing area TPA may include a first non-sensing area TPA1 disposed around the sensing area TSA and a second non-sensing area TPA2 disposed inside the sensing area TSA. The sensing area TSA may overlap the display area DA described above, the first non-sensing area TPA1 may overlap the first non-display area NDA1, and the second non-sensing area TPA2 may overlap the second non-sensing area TPA2.

Although the hole AH and the second non-sensing area TPA2 are relatively wider than the hole AH and the second non-display area NDA2 of FIG. 4 in the example illustrated in FIG. 5, the shape of the second non-sensing area TPA2 may be substantially identical to that of the second non-display area NDA2.

The sensing unit TDU may include sensing electrodes RE and TE, sensing lines RL and TL, and sensing pads TP1 and TP2.

The sensing electrodes RE and TE may be disposed in the sensing area TSA. The sensing electrodes RE and TE may include first sensing electrodes RE and second sensing electrodes TE. The first sensing electrodes RE or the second sensing electrodes TE may be driving electrodes and the others may be sensing electrodes. In the example illustrated in FIG. 5, the first sensing electrodes RE are sensing electrodes while the second sensing electrodes TE are driving electrodes.

Referring to FIGS. 5 and 6, the first sensing electrodes RE may be extended in the first direction DR1 and may be repeatedly arranged in a plurality of rows. The first sensing electrodes RE may be electrically connected to each other. The second sensing electrodes TE may be extended in the second direction DR2 and may be repeatedly arranged in a plurality of columns. The second sensing electrodes TE may be electrically connected to each other. The first sensing electrodes RE adjacent to each other in the first direction DR1 may be electrically connected through first connectors BE1, and the second sensing electrodes TE adjacent to each other in the second direction DR2 may be electrically connected through second connectors BE2.

The first sensing electrodes RE may be electrically separated from the second sensing electrodes TE. The first sensing electrodes RE may be physically spaced apart from the second sensing electrodes TE. In order to electrically separate the first sensing electrodes RE from the second sensing electrodes TE at their intersections, the first connectors BE1 and the second connectors BE2 are formed as conductive layers on different layers, thereby achieving insulation between the first sensing electrodes RE and the second sensing electrodes TE.

At least some of the first sensing electrodes RE and the second sensing electrodes TE may have a diamond shape. Some of the first sensing electrodes RE and the second sensing electrode TE may have a truncated diamond shape. For example, the first sensing electrodes RE and the second sensing electrodes TE may have a diamond shape except for those located at the both ends of the extension direction. The first sensing electrodes RE and the second sensing electrodes TE located at the both ends may have a triangular shape which is the cut half of the diamond. The first sensing electrodes RE and the second sensing electrodes TE in the diamond shape may have substantially the same size and shape. The first sensing electrodes RE and the second sensing electrodes TE in the triangular shape may have substantially the same size and shape. It is, however, to be understood that the present disclosure is not limited thereto. The shape and size of the first sensing electrodes RE and the second sensing electrodes TE may be altered in a variety of ways.

The first connectors BE1 may have a shape extended from the first sensing electrodes RE. Each of the first connectors BE1 may connect the vertexes of the diamond or triangle of the adjacent first sensing electrodes RE. The first connectors BE1 may be disposed on the same layer as the first sensing electrodes RE.

Figure 7:
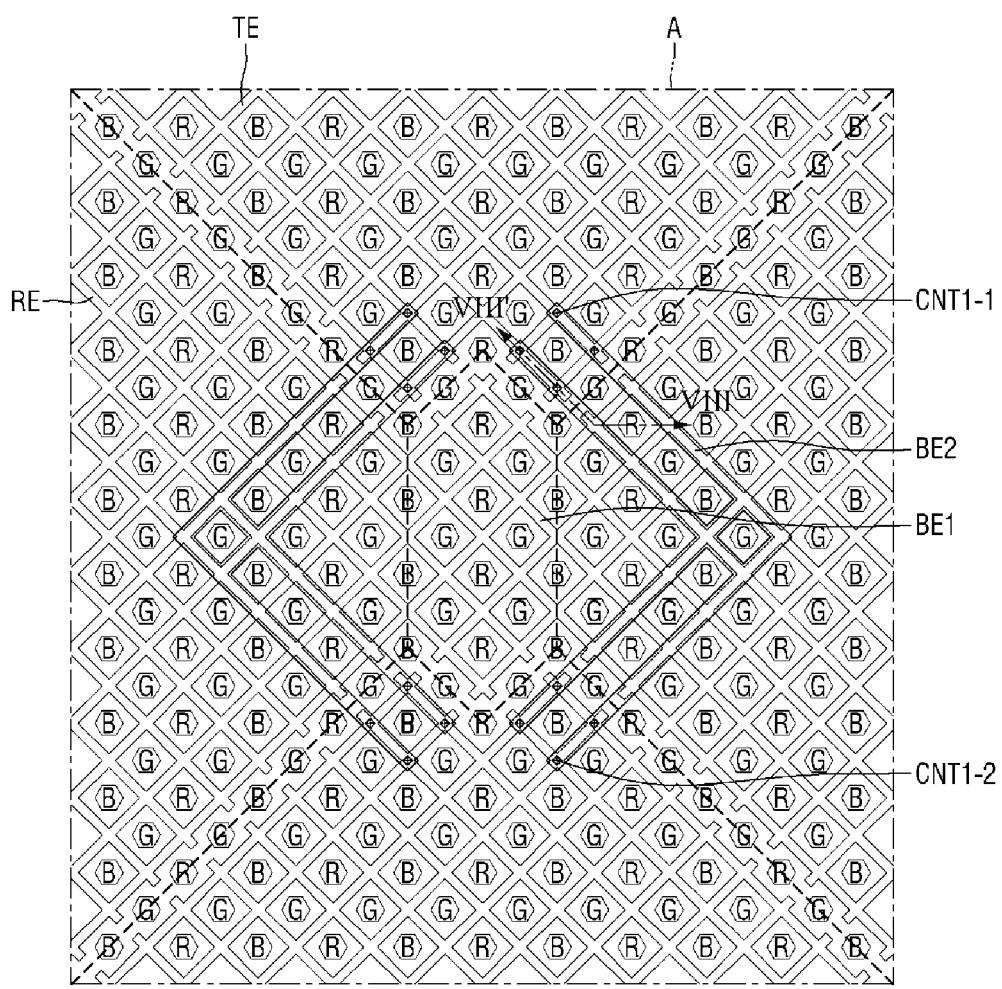
FIG. 7 is an enlarged view illustrating portion A of FIG. 6.

The second connectors BE2 may be connected to the second sensing electrodes TE through first contact holes CNT1-1 (see FIG. 7). Each of the second connectors BE2 may have a shape bent at least once. In FIG. 6, the second connectors BE2 are bent in the shape of "<" or ">", but the shape of the second connectors BE2 is not limited thereto. In addition, because the second sensing electrodes TE adjacent to each other in the second direction DR2 are connected by the plurality of second connectors BE2, even when any one of the second connectors BE2 is disconnected, the second sensing electrodes TE adjacent to each other in the second direction DR2 may be stably connected to each other. Although the second sensing electrodes TE adjacent to each other are connected by two second connectors BE2 in the example illustrated in FIG. 6, the number of second connectors BE2 is not limited thereto.

The conductive patterns DE may be electrically separated from the first sensing electrodes RE and the second sensing electrodes TE. That is to say, the conductive patterns DE may be spaced apart from the first sensing electrodes RE and the second sensing electrodes TE. Each of the conductive patterns DE may be surrounded by the respective first sensing electrodes RE and the respective second sensing electrodes TE.

Each of the conductive patterns DE may be smaller than the respective first sensing electrodes RE and the respective second sensing electrodes TE. Although each of the first sensing electrodes RE, the second sensing electrodes TE and the conductive patterns DE has the diamond shape when viewed from the top in the example illustrated in FIG. 6, the shape of each of the first sensing electrodes RE, the first sensing electrodes RE and the conductive patterns DE is not limited thereto.

The parasitic capacitance between the second electrode of the light-emitting element layer EML and the driving electrodes TE or the sensing electrodes RE may be reduced due to the conductive patterns DE. When the parasitic capacitance is reduced, the charging speed at which the mutual capacitance between the first sensing electrodes RE and the second sensing electrodes TE is charged can be increased.

Referring to FIG. 5, a plurality of sensing signal lines may be disposed in the first non-sensing area TPA1 on the outer side of the sensing area TSA. The sensing signal lines are extended to the first non-sensing area TPA1 overlapping the first non-display area NDA1 of the main region MR through the bending region BR from the sensing pad areas TA1 and TA2 located in the subsidiary region SR.

The sensing signal lines may include guard lines GL and ground lines GRL.

The sensing lines RL, TL1, and TL2 may include first sensing lines RL connected to the first sensing electrodes RE and second sensing lines TL1 and TL2 connected to the second sensing electrodes TE. In the exemplary embodiment illustrated in FIG. 5, the first sensing lines RL are sensing lines while the second sensing lines TL1 and TL2 are driving lines.

One ends of the first sensing lines RL may be electrically connected to the first sensing electrodes RE, and the other ends of the first sensing lines RL may be connected to the second sensing pads TP2. Specifically, the first sensing electrodes RE disposed on one side of the sensing area TSA may be connected to one ends of the first sensing lines RL. For example, some of the first sensing electrodes RE electrically connected with one another in the first direction DR1 that are disposed at the right end of the TSA may be connected to the first sensing lines RL as illustrated in FIG. 5.

The first sensing lines RL may be extended from the first non-sensing area TPA1 where the second sensing pads TP2 are disposed to the edge of the sensing area TSA. The first sensing lines RL may be electrically connected to the first sensing electrodes RE at the edge of the sensing area TSA.

One ends of the second sensing lines TL1 and TL2 may be electrically connected to the second sensing electrodes TE, and the other ends of the second sensing lines TL1 and TL2 may be connected to the first sensing pads TP1. Specifically, the second sensing electrodes TE disposed on one side of the sensing area TSA may be connected to one ends of the second sensing lines TL1, and the second sensing electrodes TE disposed another other side of the sensing area TSA may be connected to one ends of the second sensing lines TL2. For example, some of the sensing electrodes TE electrically connected to one another in the second direction DR2 on the lowermost side may be connected to the second sensing lines TL1, while some of the sensing electrodes TE disposed on the uppermost side may be connected to the second sensing lines TL2, as illustrated in FIG. 5.

The second sensing lines TL1 and TL2 may be extended from the first non-sensing area TPA1 on a second side of the TDU where the first sensing pads TP1 are disposed to the edge of the sensing area TSA. The second sensing lines TL1 and TL2 may be electrically connected to the second sensing electrodes TE at the edge of the sensing area TSA into the protruding region BR/SR.

The ground lines GRL may be disposed outside the sensing signal lines. The ground lines GRL may include a first ground line GRL1, a second ground line GRL2, and a third ground line GRL3. The first to third ground lines GRL1, GRL2 and GRL3 may be disposed in the first non-sensing area TPA1 to surround the sensing area TSA and the sensing lines RL, TL1 and TL2 in a ring shape.

The first ground line GRL1 may cover the first sensing lines RL on the outer side of the first sensing lines RL disposed on the right side of the first non-sensing area TPA1. For example, as illustrated in FIG. 5, the first ground line GRL1 may be disposed at the right end of the first sensing lines RL disposed on the right side of the first non-sensing area TPA1 and may be disposed on the right side and lower side of the first sensing lines RL extended to the lower side of the first non-sensing area TPA1.

The second ground line GRL2 may cover the inner side of the first sensing lines RL on the right side of the first non-sensing area TPA1 and the outer side of the second sensing lines TL1 disposed on the lower side of the first non-sensing area TPA1. For example, as illustrated in FIG. 5, the second ground line GRL2 may be disposed at the left end of the first sensing lines RL disposed on the right side of the first non-sensing area TPA1 and may be disposed on the left side of the first sensing lines RL extended to the lower side of the first non-sensing area TPA1, to cover the second sensing lines TL1 disposed on the lower end among the second sensing lines TL1 disposed on the lower side of the first non-sensing area TPA1. The second ground line GRL2 may be connected to the rightmost one of the first sensing pads TP1 and the leftmost one of the second sensing pads TP2.

The third ground line GRL3 may cover the second sensing lines TL2 on the outer side of the second sensing lines TL2 disposed on the upper side and the left side of the first non-sensing area TPA1. For example, as illustrated in FIG. 5, the third ground line GRL3 may be disposed on the upper side, the left side and the lower side of the first sensing lines RL disposed on the upper end and left end among the second sensing lines TL2 disposed on the upper side and the left side of the first non-sensing area TPA1.

Ground voltage may be applied to the first to third ground lines GRL1, GRL2 and GRL3. The first to third ground lines GRL1, GRL2 and GRL3 may serve to mitigate electrostatic shock that may be applied to the first sensing lines RL and the second sensing lines TL1 and TL2.

The guard lines GL may be disposed between the sensing lines RL, TL1 and TL2 and the ground lines GRL. The guard lines GL may include a first guard line GL1, a second guard line GL2, a third guard line GL3, a fourth guard line GL4, and a fifth guard line GL5.

The first guard line GL1 may be disposed between the outermost one of the first sensing lines RL disposed on the right side of the first non-sensing area TPA1 and the first ground line GRL1.

The second guard line GL2 may be disposed between the innermost one of the first sensing lines RL disposed on the lower side of the first non-sensing area TPA1 and the second ground line GRL2. As illustrated in FIG. 5, the innermost one of the first sensing lines RL may be the leftmost one of the first sensing lines RL.

The third guard line GL3 may be disposed between the rightmost one of the second sensing lines TL1 disposed on the lower side of the first non-sensing area TPA1 and the second ground line GRL2.

The fourth guard line GL4 may be disposed between the innermost one of the second sensing lines TL2 disposed on the left side of the first non-sensing area TPA1 and the sensing area TSA.

The fifth guard line GL5 may be disposed between the outermost one of the second sensing lines TL2 disposed on the left side and upper side of the first non-sensing area TPA1 and the third ground line GRL3.

Ground voltage may be applied to the first to fifth guard lines GL1, GL2, GL3, GL4 and GL5. The first to fifth guard lines GL1, GL2, GL3, GL4 and GL5 can prevent signal interference that may occur between adjacent lines.

The second non-sensing area TPA2 may be disposed to surround the hole AH. The hole AH may be disposed generally at the center of the second non-sensing area TPA2.

At least one of the first sensing electrode RE and the second sensing electrode TE disposed adjacent to the second non-sensing area TPA2 may be separated from each other at the hole AH and thus may be spaced apart from each other. In addition, at least one of the first sensing electrodes RE and the second sensing electrodes TE crossing the hole AH may be separated from each other at the hole AH. Therefore, in the second non-sensing area TPA2, a connection line electrically connecting the first sensing electrodes RE spaced apart from each other in the first direction DR1 at the hole AH, and a connection line electrically connecting the second sensing electrodes TE spaced apart from each other in the second direction DR2 at the hole AH may be further disposed. More detailed description thereon will be made below with reference to the other drawings.

In addition, as described above, the sensing unit TDU may include alignment marks. Specifically, after the process of forming the hole AH through the sensing unit TDU, the alignment marks used to inspect the alignment the hole AH may be disposed in the second non-sensing area TPA2 of the sensing unit TDU corresponding to the second non-display area NDA. More detailed description thereon will be made below with reference to the other drawings.

In the following description, the sensing area TSA is referred to as the display area DA, the first non-sensing area TPA2 is referred to as the first non-display area NDA1, and the second non-sensing area TPA2 is referred to as the second non-display area NDA2, unless it is necessary to discern them.

FIG. 7 is an enlarged view of portion A of FIG. 6.

Referring to FIG. 7, the first sensing electrodes RE, the second sensing electrodes TE, the first connectors BE1 and the second connectors BE2 may have a mesh pattern. The conductive patterns DE may also have a mesh pattern. When the first sensing electrodes RE, the second sensing electrodes TE, the first connectors BE1 and the second connectors BE2 have a mesh pattern, the conductive layers forming the first sensing electrodes RE, the second sensing electrodes TE, the first connectors BE1 and the second connectors BE2 may be made of an opaque material. In the following description, the first sensing electrodes RE and the second sensing electrodes TE have a mesh pattern, but the present disclosure is not limited thereto.

The first sensing electrodes RE, the second sensing electrodes TE and the conductive patterns DE may be spaced apart from one another. There may be a gap between the first sensing electrodes RE and the second sensing electrodes TE, between the first sensing electrodes RE and the conductive patterns DE, between the second sensing electrodes TE and the conductive patterns DE, and between the second sensing electrode TE and the first connectors BE1. For convenience of illustration, the boundary between the first sensing electrode RE and the second sensing electrode TE, the boundary between the second sensing electrode TE and the first connector BE1, and the boundary between the first sensing electrode RE and the first connector BE1 are indicated by dashed lines in FIG. 7.

The first connector BE1 may be disposed between the first sensing electrodes RE. The first connector BE1 may be extended from each of the first sensing electrodes RE. Therefore, the first connector BE1 may be connected to the first sensing electrodes RE without any additional contact hole.

The second connectors BE2 may be connected to the second sensing electrodes TE through the contact holes CNT1-1 and CNT1-2, respectively. One end of the second connector BE2 may be connected to one of the second sensing electrodes TE adjacent to each other in the second direction DR2 through the contact hole CNT1-1. The other end of the second connector BE2 may be connected to another one of the second sensing electrodes TE adjacent to each other in the second direction DR2 through the contact hole CNT1-2.

The second connector BE2 may overlap the first sensing electrode RE or the second sensing electrode TE. Alternatively, the second connector BE1 may overlap the first connector BE1 instead of the first sensing electrode RE. Alternatively, the second connector BE2 may overlap the first sensing electrode RE as well as the first connector BE1. The second connector BE2 may be disposed on a different layer from the first connector BE1. Therefore, even if the second connector BE2 overlaps the first connector BE1, it is possible to prevent short-circuit from being created.

The first sensing electrodes RE, the second sensing electrodes TE, the first connectors BE1 and the second connectors BE2 may not overlap with the sub-pixels R, G and B. That is to say, the first sensing electrodes RE, the second sensing electrodes TE, the first connectors BE1 and the second connectors BE2 may be disposed along the edge of each of the sub-pixels R, G and B. That is to say, the first sensing electrodes RE, the second sensing electrodes TE, the first connectors BE1 and the second connectors BE2 may overlap a bank defining each of the sub-pixels R, G and B.

According to an exemplary embodiment of the present disclosure, as described above, as the first sensing electrodes RE, the second sensing electrodes TE, the first connectors BE1 and the second connectors BE2 have a mesh pattern, the sub-pixels R, G and B may not overlap the first sensing electrodes RE, the second sensing electrodes TE, the first connectors BE1 and the second connectors BE2. Accordingly, it is possible to prevent the luminance of the light output from the sub-pixels R, G and B which may happen when the light is hidden by the first sensing electrodes RE, the second sensing electrodes TE, the first connectors BE1 and the second connectors BE2.

The sub-pixels R, G and B may include a first sub-pixel R emitting a first color, a second sub-pixel G emitting a second color, and a third sub-pixel B emitting a third color. Although the first color is red, the second color is green and the third color is blue in the example illustrated in FIG. 7, the present disclosure is not limited thereto. Although the first sub-pixel R, the second sub-pixel G and the third sub-pixel B have a hexagonal shape when viewed from the top in the example illustrated in FIG. 7, the present disclosure is not limited thereto. The first sub-pixel R, the second sub-pixel G and the third sub-pixel B may have a polygonal shape other than a hexagon, or a circular or elliptical shape when viewed from the top. In addition, the first sub-pixel R, the second sub-pixel G and the third sub-pixel B all have substantially the same size, in the example illustrated in FIG. 7, the sizes of the sub-pixels R, G and B are not limited thereto. For example, the third sub-pixel B may have the largest size while the second sub-pixel G may have the smallest size. Alternatively, the size of the first sub-pixel R may be substantially equal to the size of the third sub-pixel B, while the size of the second sub-pixel G may be smaller than the size of each of the first sub-pixel R and the third sub-pixel B.

A pixel PX refers to a group of sub-pixels capable of representing grayscale values. In the example illustrated in FIG. 7, a pixel PX includes a first sub-pixel R, two second sub-pixels G and a third sub-pixel B. It is, however, to be understood that the present disclosure is not limited thereto. For example, a pixel PX may include a first sub-pixel PX1, a second sub-pixel PX2 and a third sub-pixel PX3.

Figure 8:
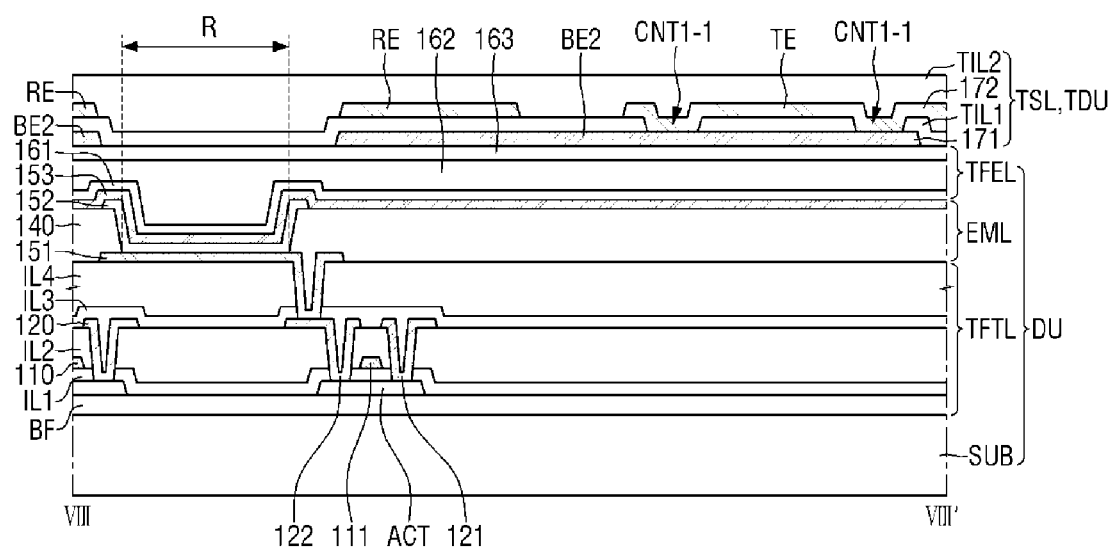
FIG. 8 is a cross-sectional view taken along line VIII-VIII' of FIG. 7.

FIG. 8 is a cross-sectional view taken along line VIII-VIII' of FIG. 7.

Referring to FIGS. 7 and 8, the thin-film transistor layer TFTL is disposed on the substrate SUB. The thin-film transistor layer TFTL includes a buffer layer BF, a semiconductor layer ACT, a first insulating layer ILL a first conductive layer 110, a second insulating layer IL2, a second conductive layer 120, a third insulating layer IL3 and a fourth insulating layer IL4. Each of the layers described above may be made up of a single layer, or a stack of layers including a plurality of layers. Other layers may be further disposed between the layers.

A buffer layer BF may be formed on a surface of the substrate SUB. The buffer layer BF may be formed on one surface of the substrate SUB in order to protect the thin-film transistors and an emissive layer 152 of the light-emitting element layer EML from moisture that is likely to permeate through the substrate SUB. The buffer layer BF may be formed of a plurality of inorganic layers stacked on one another alternately. For example, the buffer layer BF may be made up of multiple layers in which one or more inorganic layers of a silicon nitride layer, a silicon oxynitride layer, a silicon oxide layer, a titanium oxide layer and an aluminum oxide layer are alternately stacked on one another. The buffer layer BF may be eliminated.

The semiconductor layer ACT is disposed on the buffer layer BF. The semiconductor layer ACT forms the channels of a plurality of transistors of pixels. The semiconductor layer ACT may include polycrystalline silicon. The polycrystalline silicon may be formed by crystallizing amorphous silicon. When the semiconductor layer ACT is made of polycrystalline silicon by doping ions into the semiconductor layer ACT, the semiconductor layer ACT can have conductivity. Accordingly, the semiconductor layer ACT may include a source region and a drain region as well as the channel region of each of the plurality of transistors. The source region and the drain region may be connected to both sides of each channel region.

According to another exemplary embodiment, the semiconductor layer ACT may include monocrystalline silicon, low-temperature polycrystalline silicon, amorphous silicon, or an oxide semiconductor. The oxide semiconductor may include, for example, a binary compound (ABx), a ternary compound (ABxCy) and a quaternary compound (ABxCyDz) containing indium, zinc, gallium, tin, titanium, aluminum, hafnium (Hf), zirconium (Zr), magnesium (Mg), etc. According to an exemplary embodiment of the present disclosure, the semiconductor layer ACT may include an oxide including indium, tin and titanium (ITZO) or an oxide including indium, gallium and tin (IGZO).

The first insulating layer IL1 is disposed on the semiconductor layer ACT. The first insulating layer IL1 may be generally disposed over the entire surface of the substrate SUB. The first insulating layer IL1 may be a gate insulating layer having a gate insulating function.

The first insulating layer IL1 may include a silicon compound, a metal oxide, etc. For example, the first insulating layer IL1 may include silicon oxide, silicon nitride, silicon oxynitride, aluminum oxide, tantalum oxide, hafnium oxide, zirconium oxide, titanium oxide, etc. The first insulating layer IL1 may be made up of a single layer or multiple layers of different materials stacked on one another.

The first conductive layer 110 is disposed on the first insulating layer IL1. The first conductive layer may include a gate electrode 111 of a transistor, a scan line connected thereto, and a first electrode of a capacitor. The first conductive layer 110 may include at least one metal selected from the group consisting of: molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The first conductive layer 110 may be made up of a single layer or multiple layers.

The second insulating layer IL2 is disposed on the first conductive layer 110. The second insulating layer IL2 may be generally disposed over the entire surface of the substrate SUB. The second insulating layer IL2 may insulate the first conductive layer 110 from the second conductive layer 120. The second insulating layer IL2 may be an interlayer dielectric layer. The second insulating layer IL2 may include an inorganic insulating material such as silicon oxide, silicon nitride, silicon oxynitride, hafnium oxide, aluminum oxide, titanium oxide, tantalum oxide and zinc oxide.

The second conductive layer 120 is disposed on the second insulating layer IL2. The second conductive layer 120 may include the above-described data lines, a first source/drain electrode 121 and a second source/drain electrode 122 of a transistor. The first source/drain electrode 121 and the second source/drain electrode 122 may be connected to the source region and drain region of the semiconductor layer ACT through contact holes penetrating through the second insulating layer IL2 and the first insulating layer IL1. According to an exemplary embodiment of the present disclosure, the first source/drain electrode 121 may be a source electrode of a transistor, and the second source/drain electrode 122 may be a drain electrode of a transistor.

The second conductive layer 120 may include at least one metal selected from the group consisting of: aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The second conductive layer 120 may be made up of a single layer or multiple layers. For example, the second conductive layer 120 may have a stack structure of Ti/Al/Ti, Mo/Al/Mo, Mo/AlGe/Mo, Ti/Cu, etc.

The third insulating layer IL3 is disposed on the second conductive layer 120. The third insulating layer IL3 may insulate and protect the transistor. The third insulating layer IL3 may be a passivation layer. The third insulating layer IL3 may include an inorganic insulating material such as silicon oxide, silicon nitride, silicon oxynitride, hafnium oxide, aluminum oxide, titanium oxide, tantalum oxide and zinc oxide.

The fourth insulating layer IL4 is disposed on the third insulating layer IL3. The fourth insulation layer 124 may be a via layer. The fourth insulating layer IL4 may provide a flat surface over the level differences of the transistor. The fourth insulating layer IL4 may include an organic insulating material such as polyacrylate resin, epoxy resin, phenolic resin, polyamide resin, polyimide resin, unsaturated polyesters resin, poly phenylen ether resin, poly phenylene sulfide resin, and benzocyclobutene (BCB).

The light-emitting element layer EML is disposed on the thin-film transistor layer TFTL. The light-emitting element layer EML may include a first electrode layer 151, an emissive layer 152, a second electrode layer 153, and a pixel definition film 140.

In each of the sub-pixels R, G and B, the first electrode 151, the light-emitting layer 152 and the second electrode 153 are stacked on one another sequentially, so that holes from the first electrode 151 and electrons from the second electrode 153 are combined with each other in the light-emitting layer 152 to emit light. The second sub-pixel G and the third sub-pixel B may have substantially the same configuration as the first sub-pixel R illustrated in FIG. 8.

The first electrode layer 151 may be disposed on the fourth insulating layer IL4. The anode electrode of the sub-pixels R, G and B may be formed as the first electrode layer 151. The first electrode layer 151 may be electrically connected to the second source/drain electrode 122 (or the drain electrode of the transistor) through a contact hole penetrating through the fourth insulating layer IL4 and the third insulating layer IL3. It is, however, to be understood that the present disclosure is not limited thereto. The anode electrode may be connected to the first source/drain electrode 121 through a contact hole penetrating through the fourth insulating layer IL4 and the third insulating layer IL3.

The first electrode layer 151 may have a stack structure of a material layer having a high work function such as indium-tin-oxide (ITO), indium-zinc-oxide (IZO), zinc oxide (ZnO) and indium oxide (In$_2$O$_3$), and a reflective material layer such as silver (Ag), magnesium (Mg), aluminum (Al), platinum (Pt), lead (Pb), gold (Au), nickel (Ni), neodymium (Nd), iridium (Ir), chromium (Cr), lithium (Li), calcium (Ca) or a mixture thereof. A layer having a higher work function may be disposed on a reflective material layer so that it is disposed closer to the emissive layer 152. The first electrode layer 151 may have, but is not limited to, a multilayer structure of ITO/Mg, ITO/MgF, ITO/Ag, and ITO/Ag/ITO.

The pixel definition film 140 may be disposed on the first electrode layer 151 and the fourth insulating layer IL4. The pixel definition film 140 may be formed to separate the first electrode 151 from one another on the fourth insulating layer IL4 in order to define the sub-pixels R, G and B. The pixel definition film 140 may include an opening exposing at least a part of the first electrode 151. That is to say, the pixel definition film 140 may be formed to cover the edge of the first electrode 151. The opening may define an emission zone of each of sub-pixels R, G and B.

The pixel definition film 140 may include an inorganic insulating material such as silicon oxide, silicon nitride, silicon oxynitride, hafnium oxide, aluminum oxide, titanium oxide, tantalum oxide and zinc oxide, or an organic insulating material such as polyacrylates resin, epoxy resin, phenolic resin, polyamides resin, polyimides resin, unsaturated polyesters resin, poly phenylenethers resin, polyphenylenesulfides resin and benzocyclobutene (BCB). The pixel defining layer 140 may be made up of a single layer or multiple layers of different materials stacked on one another.

The light-emitting layer 152 is disposed in the opening of the pixel definition film 140. The light-emitting layer 152 may include an organic material and emit light of a certain color. For example, the light-emitting layer 152 may include a hole transporting layer, an organic material layer, and an electron transporting layer. In such case, the light-emitting layer 152 of the first sub-pixel R may emit red light, the light-emitting layer 152 of the second sub-pixel G may emit green light, and the light-emitting layer 152 of the third sub-pixel B may emit blue light.

Alternatively, the emitting layers 152 of the sub-pixels R, G and B may be made up of a single layer to emit white light, ultraviolet light, or blue light. In such case, the first sub-pixel R may overlap a red color filter layer transmitting red light, the second sub-pixel G may overlap a green color filter layer transmitting green light, and the third sub-pixel B may overlap a third color filter layer transmitting blue light. The red color filter layer, the green color filter layer and the blue color filter layer may be disposed on the thin-film encapsulation layer TFEL. In addition, the first sub-pixel R may overlap a red wavelength conversion layer that converts ultraviolet light or blue light into red light, the second sub-pixel G may overlap a green wavelength conversion layer that converts ultraviolet light or blue light into green light, and the third sub-pixel B may overlap a blue wavelength conversion layer that converts ultraviolet light or blue light into blue light. The red wavelength conversion layer, the green wavelength conversion layer and the blue wavelength conversion layer may be disposed on the thin-film encapsulation layer TFEL. For example, the red wavelength conversion layer may be disposed between the thin-film encapsulation layer TFEL and the red color filter layer, the green wavelength conversion layer may be disposed between the thin-film encapsulation layer TFEL and the green color filter layer, and the blue wavelength conversion layer may be disposed between the thin-film encapsulation layer TFEL and the blue color filter layer.

The second electrode layer 153 is disposed on the light-emitting layer 152 and the pixel definition film 140. The cathode electrode may be formed as the second conductive layer 153. The cathode electrode may be disposed throughout the display area DA. The second electrode layer 153 may include a material having a small work function such as Li, Ca, LiF/Ca, LiF/Al, Al, Mg, Ag, Pt, Pd, Ni, Au, Nd, Ir, Cr, BaF, Ba, or a compound or mixture thereof. The second electrode layer 153 may further include a transparent metal oxide layer disposed on the material layer having a small work function. A capping layer may be formed on the second electrode layer 153.

The thin-film encapsulation layer TFEL may be disposed on the light-emitting element layer EML. The thin-film encapsulation layer TFEL is disposed on the second electrode layer 153. As described above, the thin-film encapsulation layer TFEL may include at least one inorganic layer to prevent oxygen or moisture from permeating into the light-emitting layer 152 and the second electrode 153. In addition, the thin-film encapsulation layer TFEL may include at least one organic layer to protect the light-emitting element layer EML from particles such as dust. For example, the thin-film encapsulation layer TFEL may include a first inorganic layer 161 disposed on the second electrode 153, an organic layer 162 disposed on the first inorganic layer 161, and a second inorganic layer 163 disposed on the organic layer 162.

The first inorganic layer 161 and the second inorganic layer 163 may be formed of, but is not limited to, a silicon nitride layer, a silicon oxynitride layer, a silicon oxide layer, a titanium oxide layer, or an aluminum oxide layer.

The organic layer 162 may be formed of, but is not limited to, an acryl resin, an epoxy resin, a phenolic resin, a polyamide resin and a polyimide resin.

The sensing layer TSL may be disposed on the thin-film encapsulation layer TFEL. A buffer layer may be further formed between the thin-film encapsulation layer TFEL and the sensing layer TSL.

The sensing layer TSL may include a first sensing conductive layer 171, a first sensing insulating layer TIL1 a second sensing conductive layer 172, and a second sensing insulating layer TIL2.

Each of the layers described above may be made up of a single layer, or a stack of layers including a plurality of layers. Other layers may be further disposed between the layers.

The first sensing conductive layer 171 is disposed on the second inorganic layer 163. The second connector BE2 may be formed as the first sensing conductive layer 171. In some exemplary embodiments, the alignment marks formed in the second non-display area NDA2 may also be formed as the first sensing conductive layer 171. More detailed description thereon will be made below with reference to the other drawings.

The first sensing conductive layer 171 may include a metal or a transparent conductive layer. For example, the metal may include aluminum, titanium, copper, molybdenum, silver, or an alloy thereof. The transparent conductive layer may include a transparent conductive oxide such as indium tin oxide (ITO), indium zinc oxide (IZO), zinc oxide (ZnO) and indium tin zinc oxide (ITZO), a conductive polymer such as PEDOT, metal nanowire, grahpene, etc.

The first sensing insulating layer TIL1 may be disposed on the first sensing conductive layer 171. The first sensing insulating layer TIL1 insulates the first sensing conductive layer 171 from the second sensing conductive layer 172 disposed on the first sensing insulating layer TIL1. The first sensing insulating layer TIL1 may include an organic layer and/or an inorganic layer. The organic layer may include, for example, at least one selected from the group consisting of: an acrylic resin, a methacrylic resin, a polyisoprene, a vinyl resin, an epoxy resin, a urethane resin, a cellulose resin, a siloxane resin, a polyimide resin, a polyamide resin, and a perylene resin. The inorganic layer may include, for example, at least one of aluminum oxide, titanium oxide, silicon oxide, silicon oxynitride, zirconium oxide, and hafnium oxide.

The second sensing conductive layer 172 may be disposed on the first sensing insulating layer TIL1. The first sensing electrode RE, the second sensing electrode TE and the first connector BE1 may be formed as the second sensing conductive layer 172. In some exemplary embodiments, the alignment mark formed in the second non-display area NDA2 may also be formed as the second sensing conductive layer 172. More detailed description thereon will be made below with reference to the other drawings.

The second sensing conductive layer 172 may be electrically connected to a part of the first sensing conductive layer 171 through a contact hole CNT1-1 penetrating the first sensing insulating layer TIL1. Specifically, the second sensing electrode TE included in the second sensing conductive layer 172 may be electrically connected to the second connector BE2 included in the first sensing conductive layer 171 through a contact hole CNT1-1 penetrating the first sensing insulating layer TIL1. Accordingly, as illustrated in FIG. 6, second sensing electrodes TE adjacent to each other in the second direction DR2 may be electrically connected to each other through the second connectors BE2.

The second sensing conductive layer 172 may include the same material as the first sensing conductive layer 171 or may include one or more selected from the materials listed above as the constituent material of the first sensing conductive layer 171.

At least one of the first sensing conductive layer 171 and the second sensing conductive layer 172 may include an opaque conductive layer.

In some exemplary embodiments, the first sensing conductive layer 171 and the second sensing conductive layer 172 may include the same material. In such case, the materials of the first sensing conductive layer 171 and the second sensing conductive layer 172 may include an opaque conductive layer having a low transmittance for a particular light. The particular light may include visible light or infrared light.

In some other exemplary embodiments, the first sensing conductive layer 171 and the second sensing conductive layer 172 may include different materials. For example, the first sensing conductive layer 171 may include an opaque conductive layer, and the second sensing conductive layer 172 may include a transparent conductive layer. In such case, the first sensing conductive layer 171 formed of the opaque conductive layer may include the alignment mark disposed in the second non-display area NDA2. On the other hand, the first sensing conductive layer 171 may include a transparent conductive layer, and the second sensing conductive layer 172 may include an opaque conductive layer. In such case, the second sensing conductive layer 172 formed of the opaque conductive layer may include the alignment mark disposed in the second non-display area NDA2. In addition, the first sensing conductive layer 171 and the second sensing conductive layer 172 may include different opaque conductive layers. In such case, the transmittance of the first sensing conductive layer 171 with respect to the particular light may be different from that of the second sensing conductive layer 172. One of the first and second sensing conductive layers 171 and 172 whichever is made of a material having a lower transmittance may include the alignment marks in the second non-display area NDA2. That is to say, the sensing conductive layer made of a material having a low transmittance for the particular light may include alignment marks in the second non-display area NDA2. A detailed description thereon will be given later.

The second sensing insulating layer TIL2 may be disposed on the second sensing conductive layer 172. The second sensing insulating layer TIL2 may provide a flat surface over the level differences created by the first sensing conductive layer 171 and the second sensing conductive layer 172. The second sensing insulating layer TIL2 may include the same material as the first sensing insulating layer TIL1 or may include one or more selected from the materials listed above as the constituent material of the first sensing insulating layer TIL1.

Figure 9:
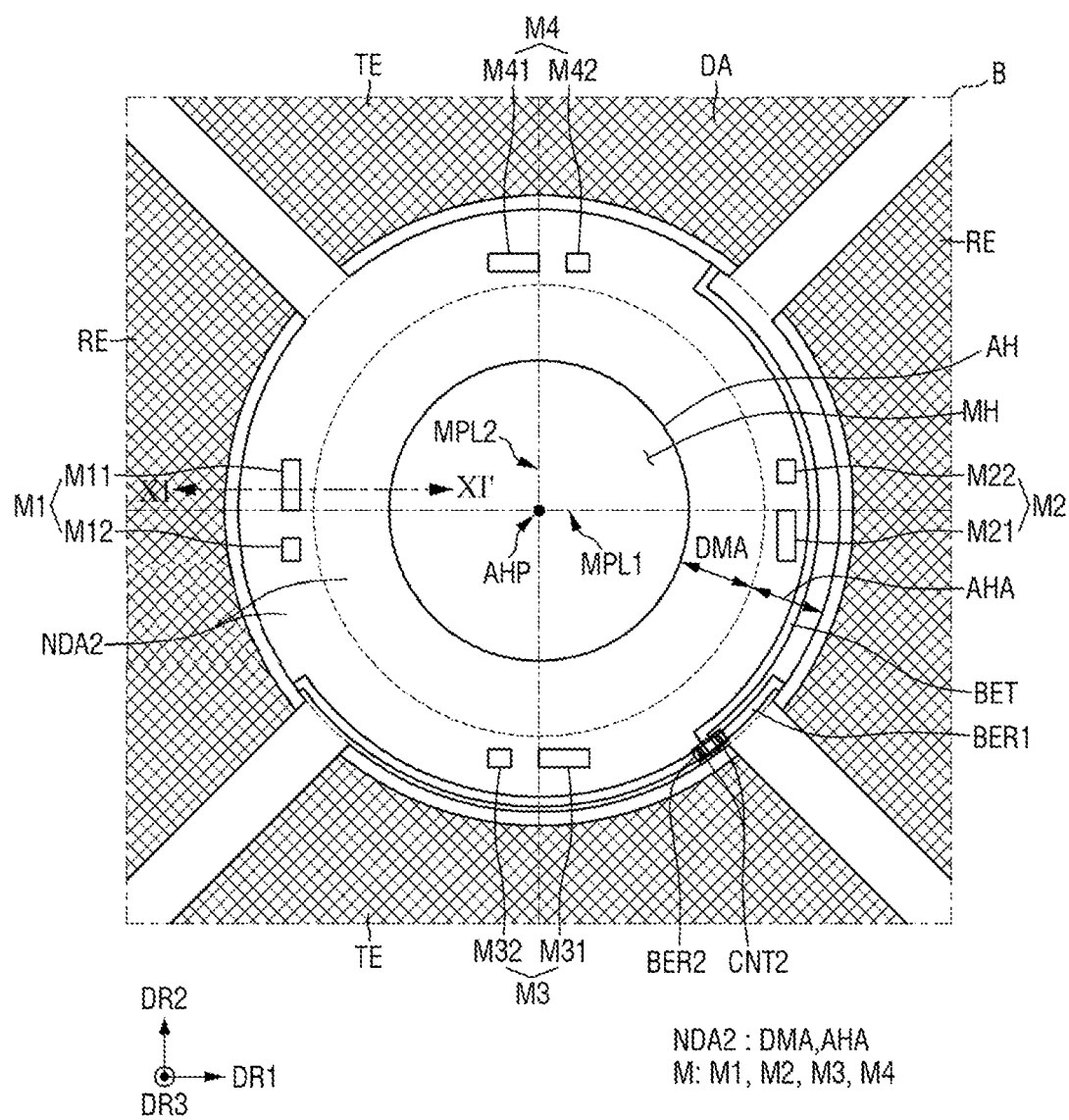
FIG. 9 is an enlarged view illustrating an example of area B of FIG. 5.
Figure 10:
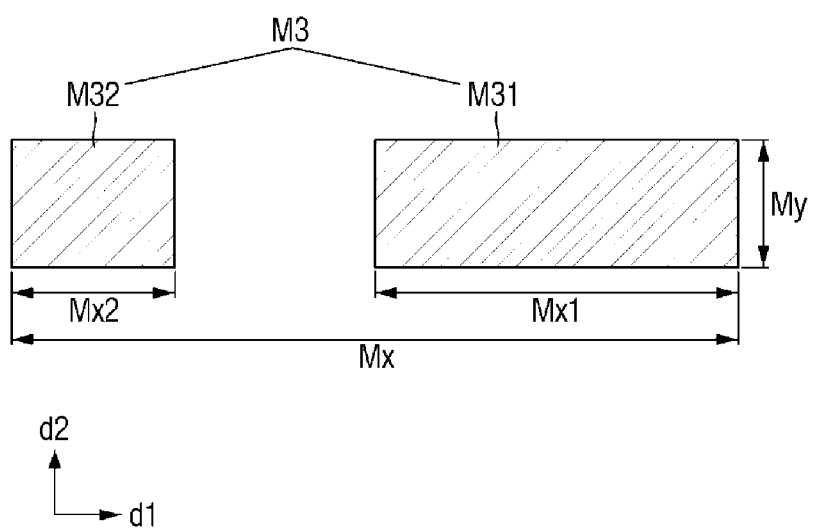
FIG. 10 is a plan view illustrating an alignment mark according to an exemplary embodiment of the present disclosure.

FIG. 9 is an enlarged view illustrating an example of area B of FIG. 5. FIG. 10 is a plan view of an alignment mark according to an exemplary embodiment of the present disclosure.

FIG. 9 is an enlarged view illustrating area B including the second non-display area NDA2 (or the second non-sensing area TPA2) and a part of the display area DA (or the sensing area TSA) adjacent to the second non-display area NDA2. As described above, the sensing area TSA may overlap the display area DA, and the second non-sensing area TPA2 may overlap the second non-display area NDA2. Therefore, for convenience of illustration, the sensing area TSA is referred to as the display area DA, and the second non-sensing area TPA2 is referred to as the second non-display area NDA2. In addition, FIG. 9 illustrates only the first sensing conductive layer 171 (illustrated in FIG. 8) and the second sensing conductive layer 172 included in the sensing layer TSL of the sensing unit TDU.

Referring to FIG. 9, the second non-display area NDA2 may surround the main hole area MH overlapping the area where the hole AH is formed. The second non-display area NDA2 may include a dam area DMA and a peripheral area AHA. The peripheral area AHA may be disposed between the main hole area MH and the display area DA and may be adjacent to the display area DA, and the dam area DMA may be disposed between the main hole area MH and the peripheral area AHA and may be adjacent to the main hole area MH.

The shape and area of the main hole area MH may be the same as the shape and area of the hole AH when viewed from the top. In some exemplary embodiments, the shape of the main hole area MH may be, but is not limited to, a shape similar to the shape of the second non-display area NDA2 when viewed from the top. In some other exemplary embodiments, the shape of the second non-display area NDA2 may be different from the shape of the main hole area MH when viewed from the top.

The peripheral area AHA may be disposed between the main hole area MH and the display area DA, and may be adjacent to the display area DA. The peripheral area AHA may surround the main hole area MH and the dam area DMA. The peripheral area AHA may be formed in, but is not limited to, a ring shape when viewed from the top. That is to say, because the peripheral area AHA surrounds the main hole area MH overlapping the hole AH and the dam area DMA, the shape of the peripheral area AHA may be determined depending on the shapes of the main hole area MH and/or the dam area DMA when viewed from the top.

In the peripheral area AHA, connection lines BER1 and BET configured to connect the sensing electrodes RE and TE respectively spaced apart from each other around the hole AH, and a plurality of alignment marks M configured to inspect the alignment of the hole AH may be disposed.

The connection lines BER1 and BET may include a first connection line BER1 and a second connection line BET. The connection lines BER1 and BET may be disposed along the circumference of the peripheral area AHA.

The first connection line BER1 may electrically connect the first sensing electrodes RE spaced apart from each other around the hole AH in the first direction DR1. The first connection line BER1 may be disposed along a side (e.g., lower side) of the circumference of the peripheral area AHA as a bypass through the peripheral area AHA.

The second connection line BET may electrically connect the second sensing electrodes TE spaced apart from each other around the hole AH in the second direction DR2. The second connection line BET may be disposed along the other side (e.g., right side) of the circumference of the peripheral area AHA as a bypass through the peripheral area AHA.

The first connection line BER1 and the second connection line BET are extended in directions crossing each other and thus may partially overlap each other. The first connection line BER1 and the second connection line BET may be formed as the second sensing conductive layer 172 (illustrated in FIG. 8). Therefore, in order to prevent a short-circuit between the first connection line BER1 and the second connection line BET formed as the same sensing conductive layer (for example, the second sensing conductive layer 172) at their intersection, one of the first connection line BER1 and the second connection line BET may include a bridge line BER2 formed as a sensing conductive layer different from the second sensing conductive layer 172, e.g., the first sensing conductive layer 171.

According to an exemplary embodiment of the present disclosure, the first connection line BER1 may be electrically connected to the second connection line BET through the bridge line BER2 without any physical contact with it. Specifically, one end and the other end of the bridge line BER2 may be electrically connected to the first connection line BER1 through second contact holes CNT2 penetrating the first sensing insulating layer TIL1 (illustrated in FIG. 8) on one end and the other end of the bridge line BER2.

The plurality of alignment marks M may be disposed in the peripheral area AHA to be adjacent to the dam area DMA. According to an exemplary embodiment of the present disclosure, the plurality of alignment marks M may be disposed so as not to overlap the connection lines BER1 and BET. For example, the plurality of alignment marks M may be disposed closer to the main hole area MH than the connection lines BER1 and BET are in the peripheral area AHA when viewed from the top. It is, however, to be understood that the present disclosure is not limited thereto. The plurality of alignment marks M may be disposed to be closer to the display area DA than the connection lines BER1 and BET are in the peripheral area AHA when viewed from the top. In some exemplary embodiments where the plurality of alignment marks M and the connection lines BER1 and BET are formed as different sensing conductive layers, the plurality of alignment marks M and the connection lines BER1 and BET may overlap each other.

The plurality of alignment marks M may include a first alignment mark M1, a second alignment mark M2, a third alignment mark M3 and a fourth alignment mark M4. The first to fourth alignment marks M1, M2, M3 and M4 may be spaced apart from one another.

The alignment marks M1, M2, M3 and M4 may include main alignment marks M11, M21, M31 and M41, and auxiliary alignment marks M12, M22, M32 and M42, respectively. Each of the alignment marks M1, M2, M3 and M4 may have substantially the same function or configuration except for their positions. Specifically, the shapes of the alignment marks M1, M2, M3 and M4 may be substantially the same when viewed from the top, but the orientations of the main alignment marks M11, M21, M31 and M41 may be different from one another.

Referring to FIG. 10, the shape of the third alignment mark M3 when viewed from the top will be described in detail. Hereinafter, common features of the plurality of alignment marks M1, M2, M3 and M4 will be described based on the third alignment mark M3; and, the redundant description will be omitted.

The third alignment mark M3 may have a bar shape when viewed from the top. The third alignment mark M3 may have a rectangular shape having a length Mx in a fourth direction d1 longer than a length My in a fifth direction d2 perpendicular to the fourth direction d1 when viewed from the top. In the following description, the length Mx of the longer side of the third alignment mark M3 is referred to as the length Mx of the third alignment mark M3, and the length My of the shorter side of the third alignment mark M3 is referred to as the width My of the third alignment mark M3 for convenience of illustration.

The third alignment mark M3 may be formed to have a sufficient length Mx and a sufficient width My when viewed from the top for accurate identification of the alignment mark in determining whether the hole AH is aligned properly, which is to be described later. In an exemplary embodiment, the length Mx of the third alignment mark M3 may be approximately 100 μm or more. Preferably, the length Mx of the third alignment mark M3 may be approximately 150 μm or more. The width My of the third alignment mark M3 may range approximately from 50 μm to 100 μm.

The third alignment mark M3 may include a third main alignment mark M31 and a third auxiliary alignment mark M32. In an exemplary embodiment, the third main alignment mark M31 and the third auxiliary alignment mark M32 may have different sizes and may be spaced apart from each other in a direction. It is, however, to be understood that the present disclosure is not limited thereto. In some exemplary embodiments, the main alignment mark and the auxiliary alignment mark may have the same size and shape.

The third main alignment mark M31 may have a rectangular shape having the length Mx1 in the fourth direction d1 longer than the length My in the fifth direction d2 when viewed from the top. The length Mx1 of the third main alignment mark M31 in the fourth direction d1 may be 0.5 times the length Mx of the third alignment mark M3, and the length My of the third main alignment mark M31 in the fifth direction d2 may be equal to the width My of the third alignment mark M3 when viewed from the top. It is, however, to be understood that the present disclosure is not limited thereto.

The third auxiliary alignment mark M32 may be spaced apart from the third main alignment mark M31. The length Mx2 of the third auxiliary alignment mark M32 may be smaller than the length Mx1 of the third main alignment mark M31, and the length My of the third auxiliary alignment mark M32 may be equal to the length My of the third main alignment mark M31.

Referring back to FIG. 9, the first alignment mark M1 may be disposed on the left side of the peripheral area AHA when viewed from the top. The longer sides of the first alignment mark M1 may be disposed in parallel with the second direction DR2. The first alignment mark M1 may be oriented so that the first main alignment mark M11 is located on the upper side in the second direction DR2 and the first auxiliary alignment mark M12 is located on the lower side in the second direction DR2. That is to say, the first alignment mark M1 is disposed on the left side of the peripheral area AHA so that the first main alignment mark M11 is disposed on the upper side and the first auxiliary alignment mark M12 is disposed on the lower side when viewed from the top.

The second alignment mark M2 may be spaced apart from the first alignment mark M1 in the first direction DR1 and disposed on the right side of the peripheral area AHA when viewed from the top. The distance between the second alignment mark M2 and the first alignment mark M1 in the first direction DR1 may be greater than the length of the hole AH in the first direction DR1. In an exemplary embodiment, when the hole AH has a circular shape when viewed from the top, the distance between the second alignment mark M2 and the first alignment mark M1 in the first direction DR1 may be larger than the diameter of the hole AH.

The second alignment mark M2 may be oriented so that it is symmetric to the first alignment mark M1 with respect to a center point AHP of the hole AH. Therefore, the location of the main alignment mark M11 of the first alignment mark M1 may be opposite to the location of the main alignment mark M21 of the second alignment mark M2. The longer sides of the second alignment mark M2 may be disposed in parallel with the second direction DR2. The second alignment mark M2 may be oriented so that the second main alignment mark M21 is located on the lower side in the second direction DR2 and the second auxiliary alignment mark M22 is located on the upper side in the second direction DR2. That is to say, the second alignment mark M2 may be formed so that the second main alignment mark M21 is located on the lower side while the second auxiliary alignment mark M22 is located on the upper side when viewed from the top.

The third alignment mark M3 may be spaced apart from the first alignment mark M1 and the second alignment mark M2.

The third alignment mark M3 may be disposed on the lower side of the peripheral area AHA when viewed from the top. The longer sides of the third alignment mark M3 may be disposed in parallel in the first direction DR1. The third alignment mark M3 may be oriented so that the third main alignment mark M31 is located on one side in the first direction DR1 and the third auxiliary alignment mark M32 is located on the other side in the first direction DR1. That is to say, the third alignment mark M3 may be formed so that the third main alignment mark M31 is located on the right side while the third auxiliary alignment mark M32 is located on the left side when viewed from the top.

The fourth alignment mark M4 may be spaced apart from the third alignment mark M3 in the second direction DR2 and disposed on the upper side of the peripheral area AHA when viewed from the top. The distance between the fourth alignment mark M4 and the third alignment mark M3 in the second direction DR2 may be greater than the diameter of the hole AH in the second direction DR2.

The fourth alignment mark M4 may be oriented so that it is symmetric to the third alignment mark M3 with respect to a center point AHP of the hole AH. Therefore, the location of the main alignment mark M31 of the third alignment mark M3 may be opposite to the location of the main alignment mark M41 of the fourth alignment mark M4. The longer sides of the fourth alignment mark M4 may be disposed in parallel in the first direction DR1. The fourth alignment mark M4 may be oriented so that the fourth main alignment mark M41 is located on the other side in the first direction DR1 and the fourth auxiliary alignment mark M42 is located on the side in the first direction DR1. That is to say, the fourth alignment mark M4 may be formed so that the fourth main alignment mark M41 is located on the left side while the fourth auxiliary alignment mark M42 is located on the right side when viewed from the top.

One side of the first main alignment mark M11 facing the first auxiliary alignment mark M12 and one side of the second main alignment mark M21 facing the second auxiliary alignment mark M22 may be on a first extension line MPL1. In an exemplary embodiment, the side of the first main alignment mark M11 on the first extension line MPL1 may be the lower side of the first main alignment mark M11, and the side of the second main alignment mark M21 on the first extension line MPL1 may be the upper side of the second main alignment mark M21 when viewed from the top. The first extension line MPL1 may pass through the center of the main hole area MH, that is, the center point AHP of the hole AH. It is, however, to be understood that the present disclosure is not limited thereto.

One side of the third main alignment mark M31 facing the third auxiliary alignment mark M32 and one side of the fourth main alignment mark M41 facing the fourth auxiliary alignment mark M42 may be on a second extension line MPL2. In an exemplary embodiment, the side of the third main alignment mark M31 that is on the second extension line MPL2 may be the left side of the third main alignment mark M31, and the side of the fourth main alignment mark M41 that is on the second extension line MPL2 may be the right side of the fourth main alignment mark M41 when viewed from the top. The second extension line MPL2 may pass through the center of the main hole area MH, that is, the center point AHP of the hole AH. It is, however, to be understood that the present disclosure is not limited thereto. In addition, the first extension line MPL1 and the second extension line MPL2 may be perpendicular to each other and may cross each other at the center point AHP of the hole AH.

The dam area DMA may be disposed between the main hole area MH and the peripheral area AHA. In the dam area DMA, dams DM and grooves GRV each formed between the dams DM may be disposed (see FIG. 11).

The dam area DMA may surround the main hole area MH. The dam area DMA may be formed in, but is not limited to, a ring shape when viewed from the top. That is to say, because the dam area DMA surrounds the main hole area MH overlapping the hole AH, the shape of the dam area DMA may conform to the shape of the main hole area MH when viewed from the top.

Figure 11:
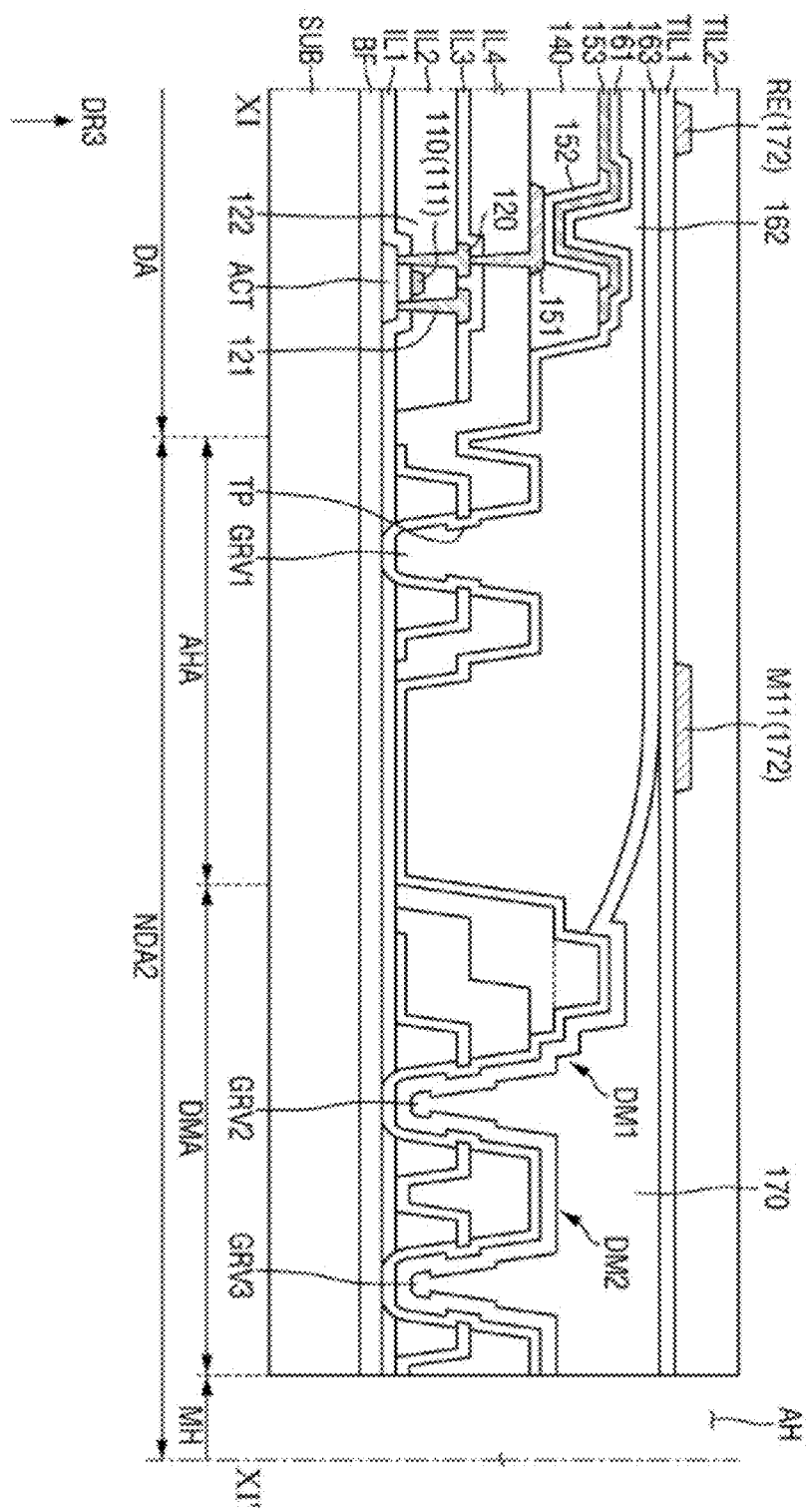
FIG. 11 is a cross-sectional view illustrating an example, taken along line XI-XI' of FIG. 9.

FIG. 11 is a cross-sectional view illustrating an example, taken along line XI-XI' of FIG. 9.

Hereinafter, the stack structure of the second non-display area NDA2 surrounding the main hole area MH in which the hole AH is formed will be described in detail with reference to FIGS. 8, 9 and 11. Because the stack structure of the display area DA has been described above with reference to FIG. 8; and, therefore, the redundant description will be omitted.

Referring to FIGS. 8, 9, and 11, the substrate SUB and the buffer layer BF disposed on the substrate SUB may be disposed in the display area DA and the second non-display area NDA2 surrounding the main hole area MH. Specifically, the substrate SUB and the buffer layer BF disposed on the substrate SUB may be disposed throughout the display area DA, the peripheral area AHA and the dam area DMA.

On the buffer layer BF of the second non-display area NDA2, the first insulating layer ILL the second insulating layer IL2, the third insulating layer IL3 and the fourth insulating layer IL4 exposing at least a part of the buffer layer BF may be disposed.

The display device may further include a plurality of dams DM1 and DM2. The dams DM1 and DM2 may be disposed in the dam area DMA of the substrate SUB. The dams DM1 and DM2 may have a closed curve shape surrounding the hole AH when viewed from the top. According to this exemplary embodiment of the present disclosure, the plurality of dams DM1 and DM2 may have a ring shape surrounding the hole AH when viewed from the top. The dams DM1 and DM2 may have a diameter larger than the diameter of the hole AH.

The plurality of dams DM1 and DM2 may include the first dam DM1 and the second dam DM2. The first dam DM1 may be disposed in the dam area DMA and may be disposed adjacent to the peripheral area AHA. The second dam DM2 may be disposed between the first dam DM1 and the main hole area MH. The first dam DM1 may be spaced apart from the second dam DM2.

The first dam DM1 may be formed of the second insulating layer IL2, the third insulating layer IL3 and the fourth insulating layer IL4 disposed in the dam area DMA. The fourth insulating layer IL4 of the first dam DM1 may include a level difference. In an exemplary embodiment, the height from the upper surface of the substrate SUB to the upper surface of the fourth insulating layer IL4 forming the first dam DM1 disposed in the dam area DMA may be larger than the height of the upper surface of the fourth insulating layer IL4 disposed in the display area DA.

Likewise, the second dam DM2 may be formed of the second insulating layer IL2, the third insulating layer IL3 and the fourth insulating layer IL4 disposed in the dam area DMA. The height from the upper surface of the substrate SUB to the upper surface of the fourth insulating layer IL4 forming the second dam DM2 disposed in the dam area DMA may be substantially equal to the height of the upper surface of the fourth insulating layer IL4 disposed in the display area DA. That is to say, the height of the first dam DM1 (that is, the distance from the upper surface of the substrate SUB to the upper surface of the fourth insulating layer IL4 of the first dam DM1) may be larger than the height of the second dam DM2 (that is, the distance from the upper surface of the substrate SUB to the upper surface of the fourth insulating layer IL4 of the second dam DM2).

The first dam DM1 and the second dam DM2 may block a permeation path via which oxygen or moisture is introduced from the hole AH. In addition, the first dam DM1 may define the limit in which the organic layer 162 of the thin-film encapsulation layer TFEL is to be formed. In addition, the second dam DM2 may prevent damage to the hole AH and elements formed in the second non-display area NDA2 adjacent to the main hole area MH where the hole AH is formed from the external impact.

Although there are two dams DM1 and DM2 surrounding the hole AH in the drawings, the number of the plurality of dams is not limited thereto. The display device may include more than two dams.

The display device may further include a plurality of grooves GRV1, GRV2 and GRV3. The grooves GRV1, GRV2 and GRV3 may be disposed on the dam area DMA and the peripheral area AHA of the substrate SUB. The plurality of grooves GRV1, GRV2 and GRV3 may have a closed curve shape surrounding the hole AH when viewed from the top. According to exemplary embodiments of the present disclosure, the plurality of grooves GRV1, GRV2 and GRV3 may have a ring shape surrounding the hole AH when viewed from the top. Each of the plurality of grooves GRV1, GRV2 and GRV3 may have a diameter larger than the diameter of the hole AH.

The plurality of grooves GRV1, GRV2 and GRV3 may be formed by recessing the second insulating layer IL2, the third insulating layer IL3 and the fourth insulating layer IL4 in the opposite direction of the third direction DR3, for example, downward. Specifically, the plurality of grooves GRV1, GRV2 and GRV3 are formed by removing at least a part of the second insulating layer IL2, the third insulating layer IL3 and the fourth insulating layer IL4 disposed in the second non-display area NDA2.

The plurality of grooves GRV1, GRV2, and GRV3 may include a first groove GRV1, a second groove GRV2, and a third groove GRV3.

The first groove GRV1 may be disposed in the peripheral area AHA. The first groove GRV1 may be formed by recessing the second insulating layer IL2, the third insulating layer IL3 and the fourth insulating layer IL4 disposed in the peripheral area AHA in the opposite direction of the third direction DR3. The first groove GRV1 may include an undercut. Specifically, the first groove GRV1 may have a tip TP formed as the third insulating layer IL3 protrudes due to a difference in etch selectivity between the second insulating layer IL2 and the fourth insulating layer IL4 including the organic insulating material and the third insulating layer IL3 including the inorganic insulating material.

The second groove GRV2 and the third groove GRV3 may be disposed in the dam area DMA. The second groove GRV2 may be formed between the first dam DM1 and the second dam DM2. The third groove GRV3 may be formed between the second groove GRV2 and the hole AH. That is to say, the second groove GRV2 and the third groove GRV3 may be formed between the plurality of dams in the dam area DMA.

The second groove GRV2 and the third groove GRV3 may be formed generally similarly to the first groove GRV1. The second groove GRV2 and the third groove GRV3 may be formed by recessing the second insulating layer IL2, the third insulating layer IL3 and the fourth insulating layer IL4 disposed in the dam area AHA in the opposite direction of the third direction DR3. The second groove GRV2 and the third groove GRV3 may include undercuts similar to the undercut described regarding GRV1.

The first groove GRV1, the second groove GRV2 and the third groove GRV3 may be spaced apart from one another. The diameter of the first groove GRV1 may be larger than that of the second groove GRV2, and the diameter of the second groove GRV2 may be larger than that of the third groove GRV3.

Although there are three grooves GRV1, GRV2 and GRV3 surrounding the hole AH in the drawings, the present disclosure is not limited thereto. For example, the display device may include four or more grooves.

The grooves GRV1, GRV2 and GRV3 adjacent to the hole AH are recessed from the second insulating layer IL2, the third insulating layer IL3 and the fourth insulating layer IL4 in the opposite direction of the third direction DR3. Using the grooves and the dam structures it is possible to block the permeation path of oxygen or moisture flowing from the hole AH to areas of the device away from the hole AH. As a result, it is possible to protect the light-emitting element layer EML and the transistors in the display area DA.

The first inorganic layer 161 of the thin-film encapsulation layer TFEL may be disposed on the fourth insulating layer IL4 in the peripheral area AHA and the dam area DMA. Specifically, the first inorganic layer 161 disposed on the second electrode 153 in the display area DA may be extended to the peripheral area AHA and the dam area DMA in the second non-display area NDA2, and may be disposed in the entire area of the peripheral area AHA and the dam area DMA.

The organic layer 162 may be disposed on the first inorganic layer 161 in the peripheral area AHA. Specifically, the organic layer 162 disposed on the first inorganic layer 161 in the display area DA may be extended to the peripheral area AHA in the second non-display area NDA2. The organic layer 162 may be disposed on the entire area of the peripheral area AHA, and may overlap at least a part of the first dam DM1. The organic layer 162 may not overlap with the second dam DM2.

The first dam DM1 may define a region in which a liquid organic material spreads in the process of forming the organic layer 162. The organic layer may be formed by applying a liquid organic material onto the first inorganic layer 161 by inkjet printing. In doing so, the first dam DM1 sets the boundary of the region where the liquid organic material is disposed, and prevents the liquid organic material from overflowing into the dam area DMA.

The second inorganic layer 163 may be disposed on the organic layer 162 in the peripheral area AHA and the first inorganic layer 161 in the dam area DMA. Specifically, the second inorganic layer 163 disposed on the organic layer 162 in the display area DA may be extended to the peripheral area AHA and the dam area DMA in the second non-display area NDA2, and may be disposed in the entire area of the peripheral area AHA and the dam area DMA.

The organic layer 162 may be interposed between the first inorganic layer 161 and the second inorganic layer 163 in the peripheral area AHA so that they may be spaced apart from each other in the third direction DR3. Therefore, the first inorganic layer 161 formed in the first groove GRV1 may not be in contact with the second inorganic layer 163.

The first inorganic layer 161 and the second inorganic layer 163 in the dam area DMA may be in contact with each other. Accordingly, the second inorganic layer 163 may be disposed on the upper surface of the first inorganic layer 161 formed on the plurality of dams DM1 and DM2, the second groove GRV2, and the third groove GRV3.

An outer planarization layer 170 may be disposed on the second inorganic layer 163 of the dam area DMA. The outer planarization layer 170 may be disposed on the first dam DM1 and the second dam DM2 to completely cover the first dam DM1 and the second dam DM2. The outer planarization layer 170 may be disposed entirely on the dam area DMA and may be extended toward the peripheral area AHA and may be disposed in a part of the peripheral area AHA.

The outer planarization layer 170 may be formed so that the upper surface of the outer planarization layer 170 disposed in the dam area DMA is flush with the upper surface of the second inorganic layer 163 in the display area DA. The outer planarization layer 170 may work as a planarization layer that provides an even height between the upper surface of the dam area DMA (i.e., the distance from the upper surface of the substrate SUB to the upper surface of the uppermost layer of the dam area DMA) and the upper surface of the second inorganic layer 163 of the display area DA (the distance from the upper surface of the substrate SUB to the upper surface of the second inorganic layer 163 of the display area DA).

The outer planarization layer 170 may include an acrylic, epoxy, or siloxane-based organic insulating material that achieves high planarization efficiency.

Although not illustrated in FIG. 11, as described above, the first sensing conductive layer 171 (illustrated in FIG. 8) may be disposed on the second inorganic layer 163. The first sensing conductive layer 171 may include a second connector BE2 disposed in the display area DA, and a bridge line BER2 disposed in the peripheral area AHA of the second non-display area NDA2.

The first sensing insulating layer TIL1 may be disposed on the second inorganic layer 163 and the outer planarization layer 170. The first sensing insulating layer TIL1 may be disposed entirely on the display area DA, the peripheral area AHA and the dam area DMA. Specifically, the first sensing insulating layer TIL1 may be disposed entirely on the second inorganic layer 163 in the display area DA and the peripheral area AHA. In addition, the first sensing insulating layer TIL1 may be extended from the peripheral area AHA to the main hole area MH to be disposed entirely on the outer planarization layer 170 in the dam area DMA.

The second sensing conductive layer 172 may be disposed on the first sensing insulating layer TIL1. The second sensing conductive layer 172 may include a first sensing electrode RE, a second sensing electrode TE and a first connector BE1 disposed in the display area DA, and may include a plurality of alignment marks M disposed in the peripheral area AHA of the second non-display area NDA2. Although not illustrated in FIG. 11, the second sensing conductive layer 172 may further include the connection lines BET and BER1 disposed in the peripheral area AHA. In such case, the first sensing conductive layer 171 may further include the bridge line BER2 that electrically connects the first connection line BER1 and is disposed in the peripheral area AHA. Although FIG. 11 illustrates only the first alignment mark M1 (specifically, a first main alignment mark M11) disposed in the peripheral area AHA, the second to fourth alignment marks M2, M3 and M4 may also be formed in the same layer as the first alignment mark M1. That is to say, the first to fourth alignment marks M1, M2, M3 and M4 may be formed as the second sensing conductive layer 172.

According to this exemplary embodiment of the present disclosure, when the plurality of alignment marks M is formed as the second sensing conductive layer 172, the second sensing conductive layer 172 may include an opaque, conductive material having low transmittance for light having a particular wavelength band. Therefore, when the particular light is irradiated to the area adjacent to the hole AH of the display device 1, the light cannot pass through the alignment mark M formed as the second sensing conductive layer 172, so that the area may appear as dark portions. More detailed description thereon will be made below with reference to the other drawings.

The first alignment mark M1 or the first main alignment mark M11 disposed in the peripheral area AHA may be disposed adjacent to the dam area DMA in the peripheral area AHA. By disposing the first alignment mark M1 to be adjacent to the dam area DMA in the peripheral area AHA, the distance from one side wall of the hole AH to one side surface of the first alignment mark M1 in the direction DR1 and/or the second direction DR2 can be reduced. As the distance between the side wall of the hole AH and the side surface of each of the alignment marks M1, M2, M3 and M4 is reduced, an error that may occur during the process of inspecting the alignment of the hole AH described later can be reduced, so that the efficiency of alignment inspection can be improved.

The second sensing insulating layer TIL2 may be disposed on the first sensing insulating layer TIL1 and the second sensing conductive layer 172. Specifically, the second sensing insulating layer TIL2 may be disposed on the second sensing conductive layer 172 of the display area DA, the peripheral area AHA and the dam area DMA, and on the first sensing insulating layer TIL1 exposed by the second sensing conductive layer 172. The second sensing insulating layer TIL2 may be disposed entirely on the display area DA and the second non-display area NDA2.

As described above, according to the exemplary embodiment of the present disclosure, the plurality of alignment marks M formed as the second sensing conductive layer 172 may be disposed in the second non-display area NDA2 surrounding the main hole area MH. Accordingly, by forming the alignment marks M by utilizing the second sensing conductive layer 172 without adding any additional conductive layer to form the alignment marks M, process efficiency of the display device can be increased.

Figure 12:
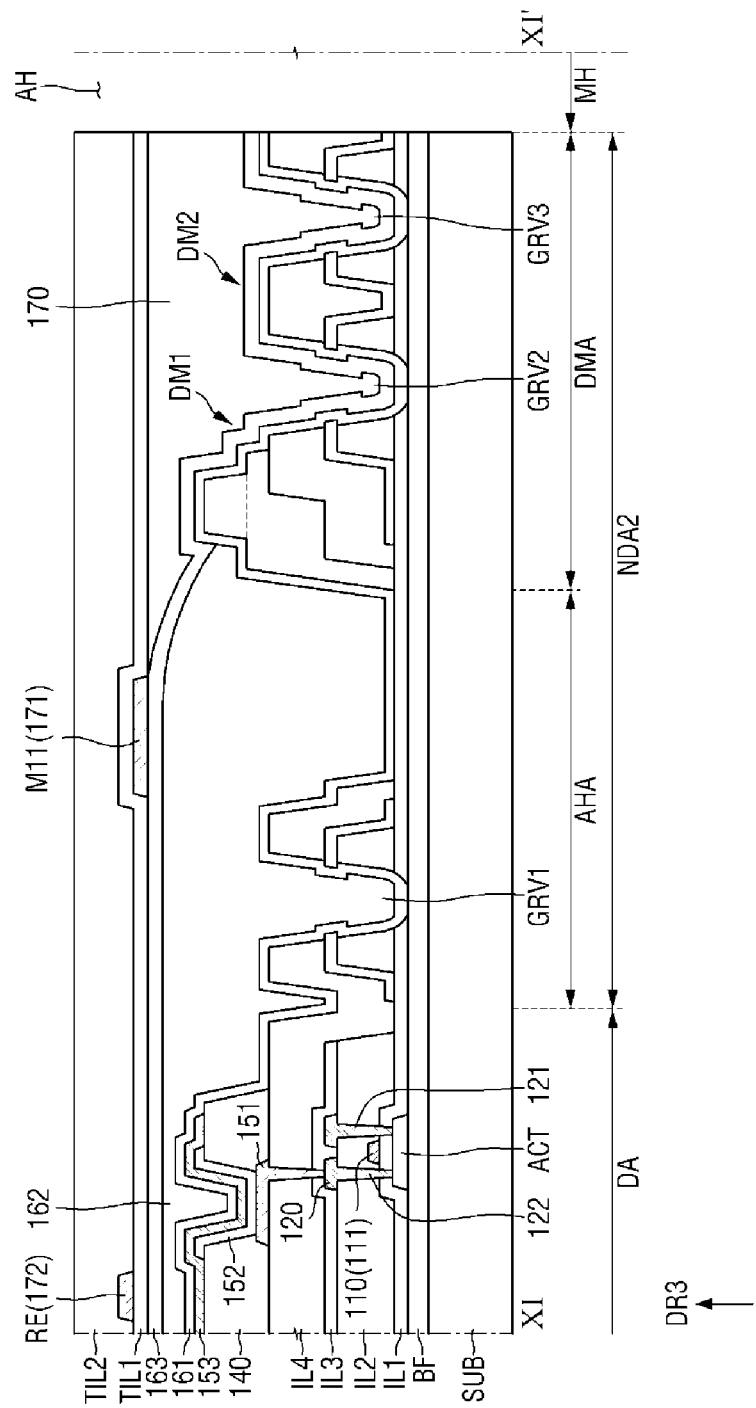
FIG. 12 is a cross-sectional view illustrating another example, taken along line XI-XI' of FIG. 9.

FIG. 12 is a cross-sectional view illustrating another example, taken along line XI-XI' of FIG. 9.

The exemplary embodiment of FIG. 12 is different from the exemplary embodiment of FIG. 11 in that alignment marks M are formed as the first sensing conductive layer 171. In the following description, the same or similar elements will be denoted by the same or similar reference numerals, and redundant descriptions will be omitted or briefly described. Descriptions will be made focusing on differences from the above exemplary embodiment.

According to the exemplary embodiment of the present disclosure, the first sensing conductive layer 171 may be disposed on the second inorganic layer 163 disposed in the peripheral area AHA. The first sensing conductive layer 171 may include a second connector BE2 disposed in the display area DA, and a bridge line BER2 and a plurality of alignment marks M disposed in the peripheral area AHA of the second non-display area NDA2. The bridge line BER2 and the plurality of alignment marks M disposed in the peripheral area AHA may be spaced apart from one another and may not overlap one another.

Although the first alignment mark M1 or the first main alignment mark M11 is disposed on the second inorganic layer 163 disposed in the peripheral area AHA in the drawings, the present disclosure is not limited thereto. For example, the outer planarization layer 170 disposed in the dam area DMA may be disposed on the second inorganic layer 163 in the peripheral area AHA, and the plurality of alignment marks may be disposed on the outer planarization layer 170 disposed in the peripheral area AHA.

When the plurality of alignment marks M is formed as the first sensing conductive layer 171, the first sensing conductive layer 171 may include an opaque, conductive material having low transmittance for light having a particular wavelength band. Therefore, when the particular light is irradiated to the area adjacent to the hole AH of the display device 1, the light cannot pass through the alignment mark M formed as the first sensing conductive layer 171, so that the area may appear as dark portions.

Figure 13:
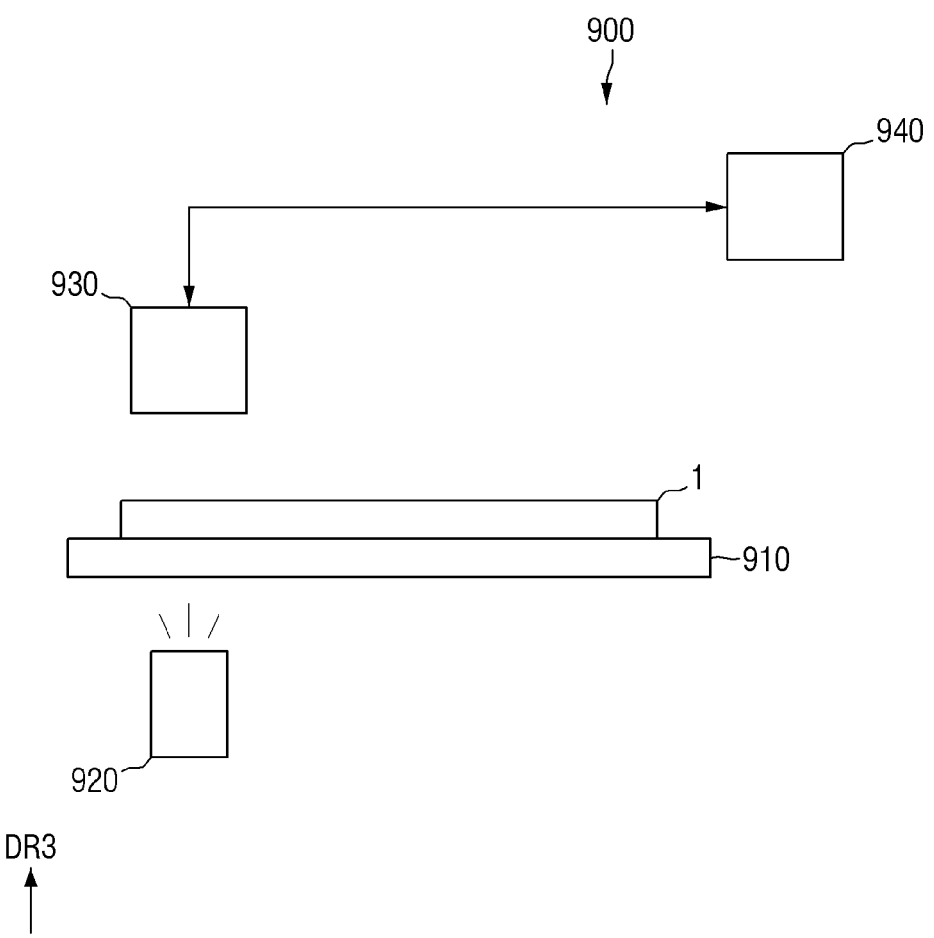
FIG. 13 is a side view schematically illustrating an apparatus configured to inspect the alignment according to an exemplary embodiment of the present disclosure.

FIG. 13 is a side view schematically illustrating an apparatus configured to inspect alignment according to an exemplary embodiment of the present disclosure.

Referring to FIG. 13, an alignment apparatus 900 configured to inspect alignment according to the exemplary embodiment of the present disclosure may include a support 910, a light irradiator 920, a camera 930, and a controller 940. Although not illustrated in the drawings, the alignment apparatus 900 may further include a moving mechanism configured to move the display device 1.

The support 910 supports the lower surface (the surface facing the other side of the third direction DR3) of the display device 1 accommodated in the alignment apparatus 900. The alignment apparatus 900 is configured to inspect the alignment of the hole AH formed in the display device 1. Although the support 910 is placed to support an entire lower surface of the display device 1 in the example illustrated in FIG. 13, the present disclosure is not limited thereto. The support 910 may support the display device 1 depending on the relative position between the light irradiator 920 and the display device 1, which will be described later. The support 910 may be configured such that it does not hinder the light emitted from the light irradiator 920 passes through at least a portion of the display device 1 so that a video or image is output by the camera 930.

Specifically, the support 910 may be configured so that the main hole area MH of the display device 1, the second non-display area NDA2 and at least a part of the display area DA adjacent to the second non-display area NDA2 are exposed in the third direction DR3. For example, the support 910 may support the edge of the display device 1 such as a rectangular frame, or may support at least two opposite sides of four sides of the display device 1. The support 910 may include, but is not limited to, a transparent material having light transmission.

The light irradiator 920 may be placed below the support 910. The light irradiator 920 may be disposed below the support 910 to emit light toward the support 910. Specifically, the light irradiator 920 may emit light toward the lower surface of the display device 1 placed on the support 910 from below the support 910 so that the light can be incident on the lower surface of the display device 1. The range of the wavelength band of the light emitted from the light irradiator 920 is not particularly limited herein. It is to be noted that the light emitted from the light irradiator 920 may have a low transmittance to the sensing conductive layers 171 and 172 forming the plurality of alignment marks M of the display device 1. For example, when the plurality of alignment marks M is formed as the first sensing conductive layer 171, the light emitted from the light irradiator 920 may be in a wavelength band that has a lower transmittance to the first sensing conductive layer 171 forming the alignment marks M and a higher transmittance to the other elements. Likewise, when the plurality of alignment marks M is formed as the second sensing conductive layer 172, the light emitted from the light irradiator 920 may be in a wavelength band that has a lower transmittance to the second sensing conductive layer 172 forming the alignment marks M and a higher transmittance to the other elements.

The camera 930 may be placed above the support 910. The camera 930 above the support 910 may be spaced apart from the light irradiator 920. When the display device 1 is placed on the support 910 and the light irradiator 920 emits light, the camera 930 may capture the display device 1 placed on the support 910 from above the support 910. The camera 930 may capture the main hole area MH, the second non-display area NDA2, and at least a part of the display area DA adjacent to the second non-display area NDA2 of the display device 1. In an exemplary embodiment, in the video (or image) of the display device 1 captured by the camera 930, light emitted from the light irradiator 920 may pass through the main hole area MH, may transmit and/or may be reflected in some portions of the second non-display area DNA2 of the display device 1, and may be absorbed in the other areas. The camera 930 may send image data on the display device 1 captured from above the display device 1 to the controller 940.

The controller 940 may receive the image data (or image) from the camera 930 and determine whether the hole AH formed in the display device 1 is correctly aligned based on the image data (or the image). Specifically, the controller 940 may create two or more image patterns based on the image data received from the camera 930, may measure the distance between the created image patterns, and may determine whether the holes formed in the display device 1 is correctly aligned. For example, the controller 940 may detect a plurality of alignment image patterns corresponding to the alignment marks M1, M2, M3 and M4 and a hole image pattern corresponding to the hole AH, may measure the distance between the alignment image patterns and the hole image pattern, may compare the measured distance between the image patterns with predetermined reference data, and may determine whether the hole AH formed in the display device 1 is correctly aligned.

Hereinafter, a method of inspecting the alignment of the hole of a display device by using an apparatus configured to inspect the alignment according to an exemplary embodiment of the present disclosure with reference to FIGS. 13 to 18.

Figure 14:
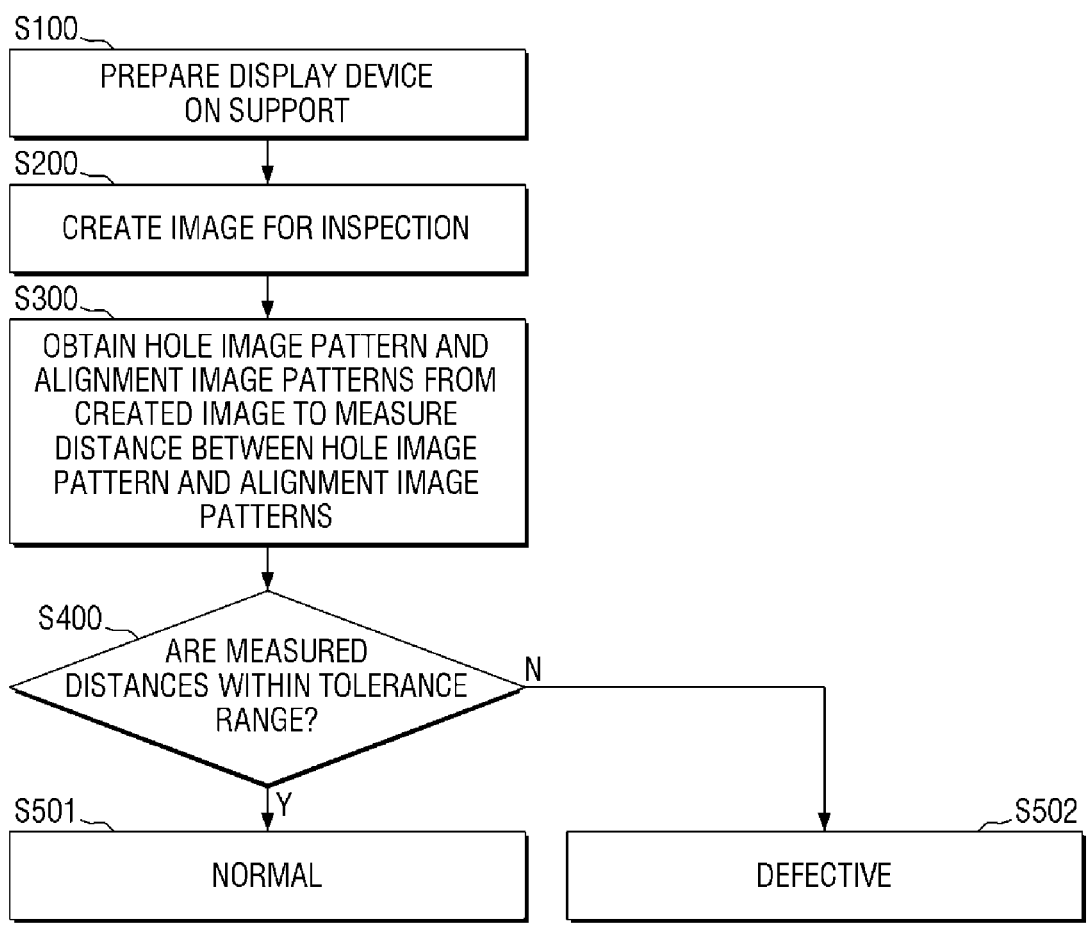
FIG. 14 is a flowchart illustrating a method of inspecting the alignment according to an exemplary embodiment of the present disclosure.
Figure 15:
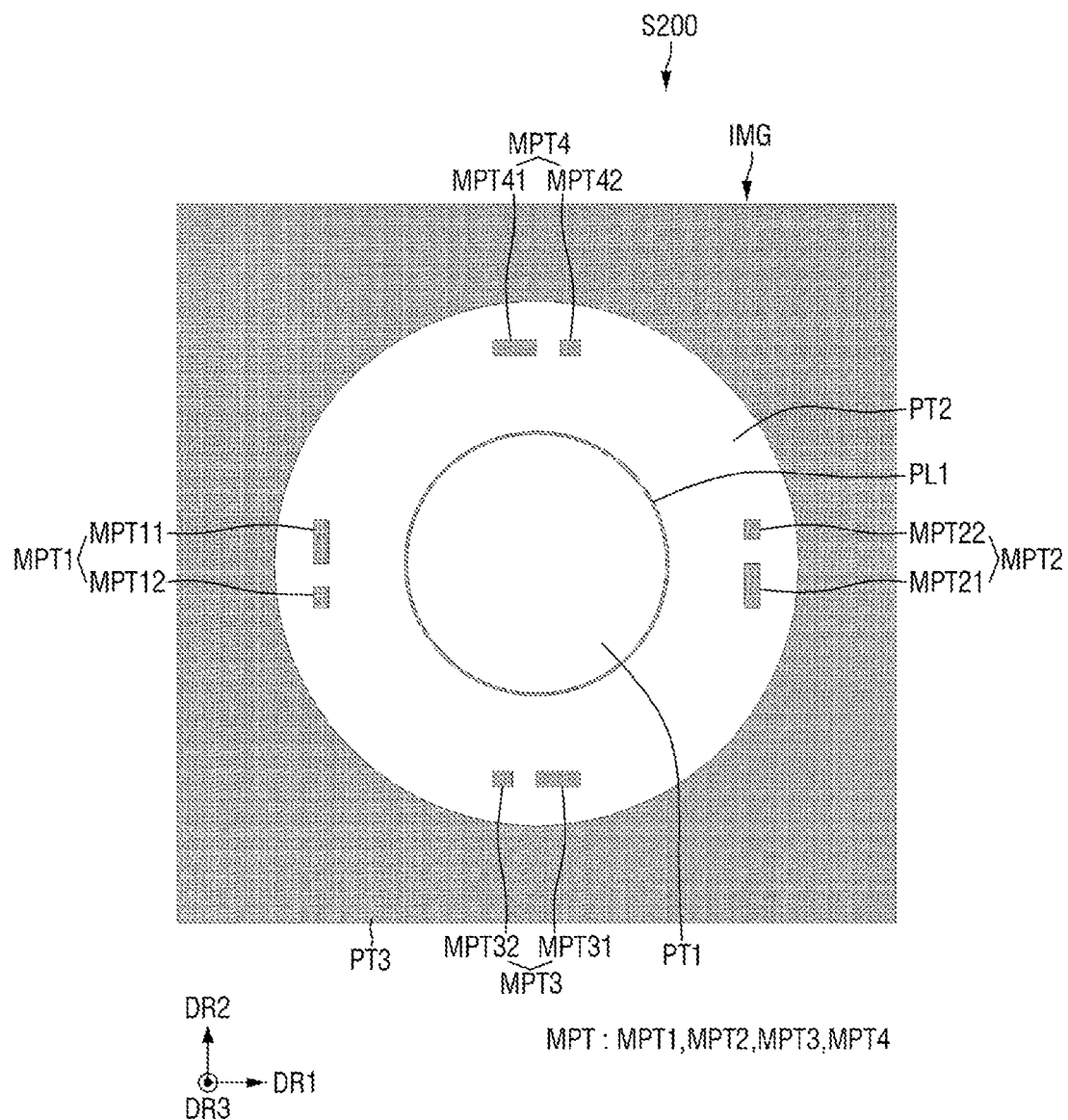
FIG. 15 is an image for inspection created at step S200.
Figure 16:
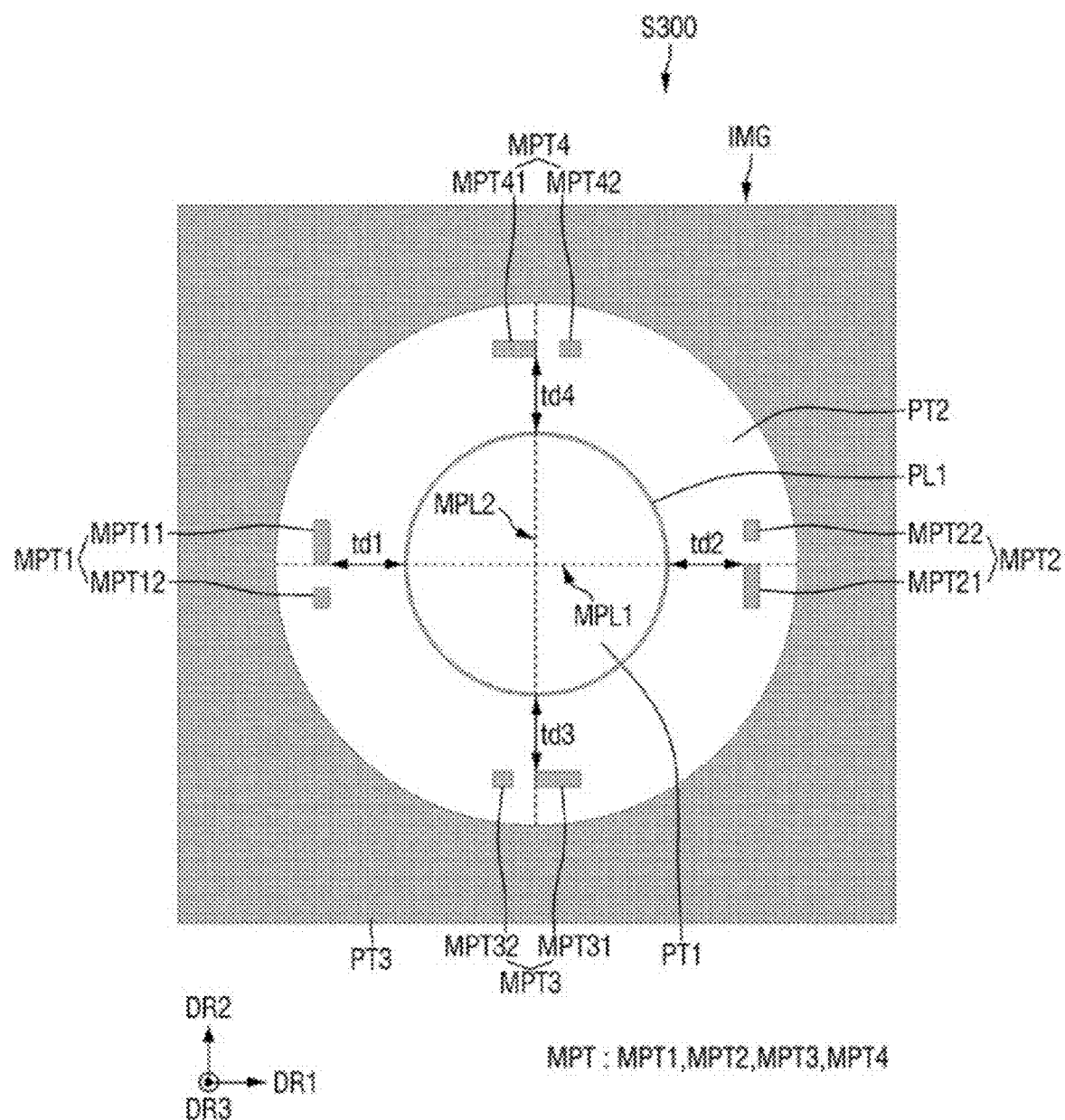
FIG. 16 is an image for inspection illustrating an example of step S300.
Figure 17:
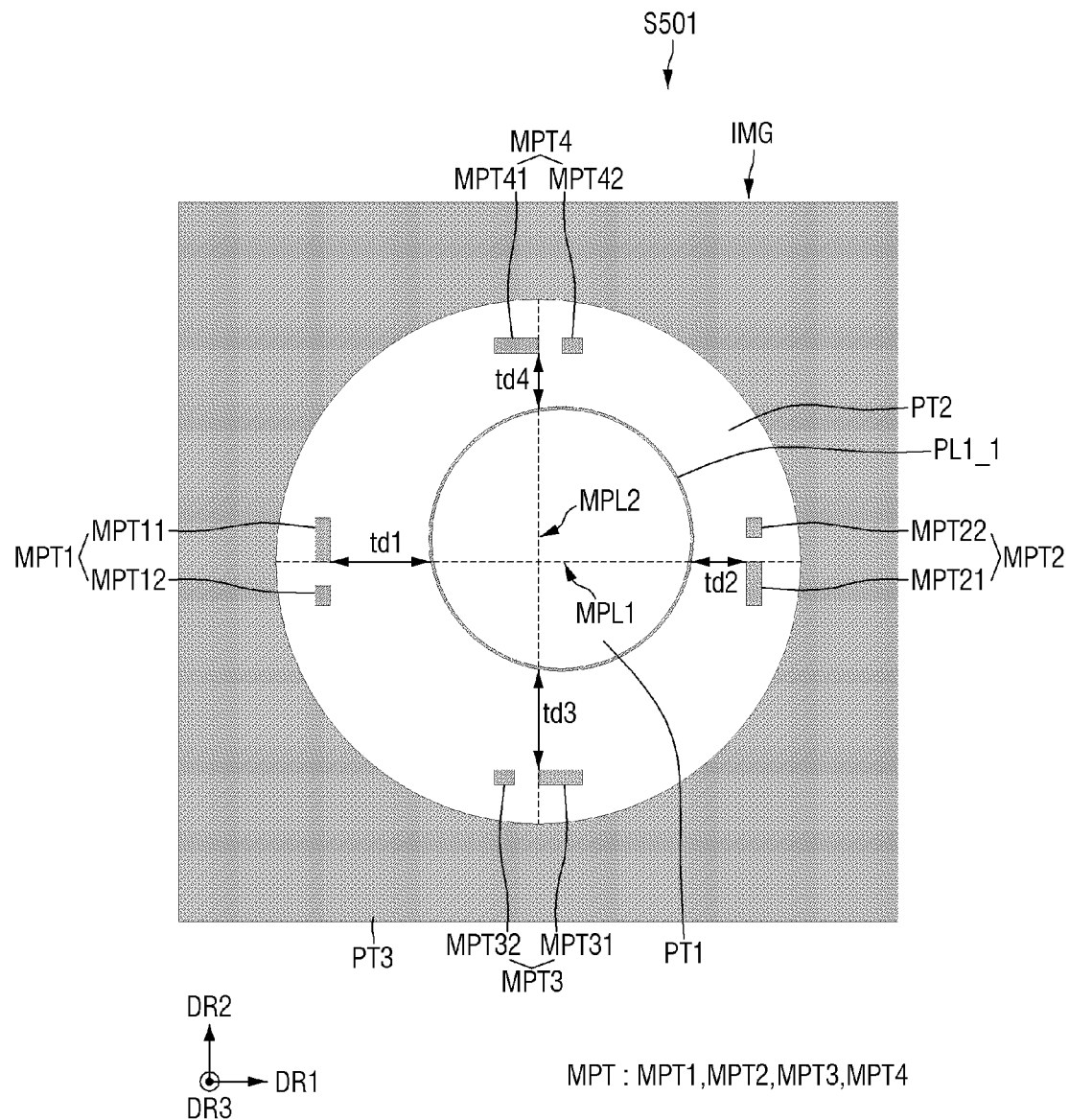
FIG. 17 is an image for inspection illustrating an example of step S501.
Figure 18:
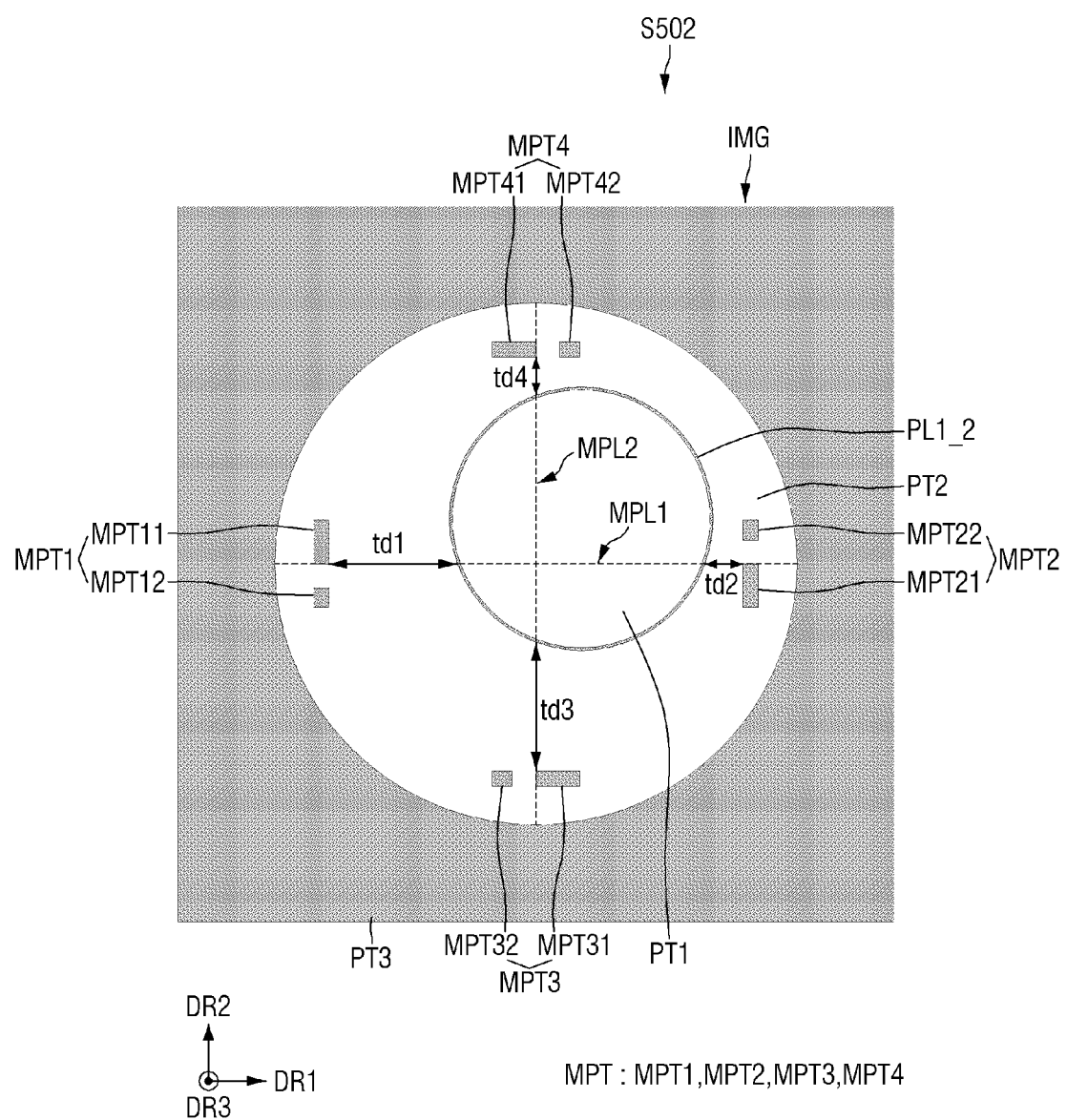
FIG. 18 is an image for inspection illustrating an example of step S502.

FIG. 14 is a flowchart illustrating a method of inspecting the alignment according to an exemplary embodiment of the present disclosure. FIG. 15 is an image for inspection created at step S200. FIG. 16 is an image for inspection illustrating an example of step S300. FIG. 17 is an image for inspection illustrating an example of step S501. FIG. 18 is an image for inspection illustrating an example of step S502.

Referring to FIG. 14, a method of inspecting the alignment may include preparing a display device on a support (step S100), irradiating light from a light irradiator to capture an area where a hole of the display device is formed to create an image for inspection by a camera (step S200), obtaining a hole image pattern and alignment image patterns from the created image to measure distances between the hole image pattern and the alignment image patterns (step S300), comparing the distance between the image patterns to a tolerance value (step S400), and determining whether the hole formed in the display device is correctly aligned (steps S501 and 502).

Initially, a display device in which a hole is formed is prepared on a support (step S100 of FIG. 14).

Specifically, referring to FIGS. 13 and 14, the display device 1 in which the hole AH is formed may be disposed on the support 910. As described above, the display device 1 may include a display panel 10 including a hole AH, a second non-display area NDA2 including a plurality of alignment marks M surrounding the hole AH, and the display area DA surrounding the second non-display area NDA2. The display device 1 including the display panel 10 having the hole AH formed therein may be seated at a predetermined position on the support 910. The display device 1 may be disposed on the support 910 and supported by it. As described above, the relative positional relationship between the display device 1 and the support 910 is not particularly limited as long as the display device 1 is fixed to the support 910 during the alignment inspection of the holes AH formed in the display device 1.

Subsequently, the light irradiator emits light, and the camera captures the part of the display device to create an image for inspection (step S200 of FIG. 14).

Specifically, referring to FIGS. 13 to 15, light may be emitted from the light irradiator 920 disposed below the support 910 on which the display device 1 is prepared toward the display device 1. The light emitted from the light irradiator 920 may be incident on the lower surface of the display device 1 to be transmitted in some areas of the display device 1 and absorbed in the other areas.

The camera 930 may capture the part of the display device 1 and may create an image IMG for inspection represented by white-and-black contrast. Specifically, the part of the display device 1 captured by the camera 930 may be the second non-display area NDA2 where the hole AH is formed, and the part of the display area DA surrounding the second non-display area NDA2 and adjacent to it.

In an exemplary embodiment, the image IMG for inspection captured and created by the camera 930 may include a plurality of image patterns as illustrated in FIG. 15. Light emitted from the light irradiator 920 may have a low transmittance with respect to the first conductive layer 110, the second conductive layer 120, and the second sensing conductive layer 172. The peripheries of the plurality of alignment marks M1, M2, M3 and M4 may be optically transparent. As used herein, the phrase "a portion is optically transparent" may mean that the portion is at least partially transmits light emitted from the light irradiator 920. Therefore, the regions in which the first conductive layer 110, the second conductive layer 120 and the second sensing conductive layer 172 are disposed may be represented by dark portions, whereas regions other than the dark portions may be represented by light portions.

Subsequently, the controller creates a hole image pattern and a plurality of alignment image patterns from the created image for inspection, and measures the distance between the hole image pattern and each of the alignment image patterns (step S300 of FIG. 14).

The controller 940 may obtain a hole image pattern PL1 and a plurality of alignment image patterns MPT from the plurality of patterns of the created image for inspection IMG.

Referring to FIGS. 13, 14 and 16, the image for inspection IMG may include a hole image pattern PL1, a plurality of alignment image patterns MPT and a third image pattern PT3 represented as dark portions, and first and second image patterns PT1 and PT2 represented as light portions.

The plurality of alignment image patterns MPT may correspond to the shapes of the plurality of alignment marks M when viewed from the top, and may be formed as dark portions. The plurality of alignment image patterns MPT may include a first alignment image pattern MPT1, a second alignment image pattern MPT2, a third alignment image pattern MPT3 and a fourth alignment image pattern MPT4.

The first alignment image pattern MPT1, the second alignment image pattern MPT2, the third alignment image pattern MPT3 and the fourth alignment image pattern MPT4 may correspond to the first alignment mark M1, the second alignment mark M2, the third alignment mark M3 and the fourth alignment mark M4, respectively, and may be formed as dark portions. The plurality of alignment image patterns MPT1, MPT2, MPT3 and MPT4 correspond to the plurality of alignment marks M1, M2, M3 and M4, respectively, and the light emitted from the light irradiator 920 may be absorbed by the plurality of alignment marks M1, M2, M3 and M4 formed as the second sensing conductive layer 172 so that they may look dark. It is, however, to be understood that the present disclosure is not limited thereto. When the plurality of alignment marks M1, M2, M3 and M4 are formed as the first sensing conductive layer 171, the light emitted from the light irradiator 920 has a lower transmittance with respect to the first sensing conductive layer 171 and may be absorbed by the alignment marks M1, M2, M3 and M4 and thus they may look dark.

The first alignment image pattern MPT1 may include a first main alignment image pattern MPT11 and a first auxiliary alignment image pattern MPT12. The first main alignment image pattern MPT11 may correspond to the first main alignment mark M11, and the first auxiliary alignment image pattern MPT12 may correspond to the first auxiliary alignment mark M12. The first alignment image pattern MPT1 will be described below. The second to fourth alignment image patterns MPT2, MPT3 and MPT4 is substantially identical to the first alignment image pattern MPT1. Therefore the redundant description will be omitted.

The plurality of image patterns PT1, PT2 and PT3 may include a first image pattern PT1, a second image pattern PT2, and a third image pattern PT3.

The hole image pattern PL1 may correspond to the shape of the hole AH when viewed from the top and may be formed as a dark portion. The first image pattern PT1 defined by the hole image pattern PL1 may correspond to the main hole area MH and may be formed as a light portion.

The second image pattern PT2 is defined by the third image pattern PT3 and may be formed as a light portion. The second image pattern PT2 may correspond to the second non-display area NDA2 surrounding the main hole area MH.

The third image pattern PT3 corresponds to the part of the display area DA adjacent to the second non-display area NDA2 and may be formed as a dark portion. The third image pattern PT3 may look dark because light emitted from the light irradiator 920 may be absorbed by the first conductive layer 110 and the second conductive layer 120 disposed in the display area DA.

Subsequently, the controller 940 may measure the distance between the hole image pattern PL1 and each of the alignment image patterns MPT1, MPT2, MPT3 and MPT4.

Specifically, a first extension line MPL1 passing through the lower side of the first main alignment image pattern MPT11 and the upper side of the second main alignment image pattern MPT21, and a second extension line MPL2 passing through the left side of the third main alignment image pattern MPT31 and the right side of the fourth main alignment image pattern MPT41 may be created. According to an exemplary embodiment of the present disclosure, the first extension line MPL1 may be extended in the first direction DR1, and the second extension line MPL2 may be extended in the second direction DR2.

The controller 940 may measure a first distance td1 between the hole image pattern PL1 and the first alignment image pattern MPT1 spaced apart from each other along the first extension line MPL1. The first distance td1 may be the spacing distance between the hole image pattern PL1 and the first alignment image pattern MPT1 in the first direction DR1.

Likewise, the controller 940 may measure a second distance td2 between the hole image pattern PL1 and the second alignment image pattern MPT2 spaced apart from each other along the first extension line MPL1. The second distance td2 may be the spacing distance between the hole image pattern PL1 and the second alignment image pattern MPT2 in the first direction DR1.

The controller 940 may measure a third distance td3 between the hole image pattern PL1 and the third alignment image pattern MPT3 spaced apart from each other along the second extension line MPL2. The third distance td3 may be the spacing distance between the hole image pattern PL1 and the third alignment image pattern MPT3 in the second direction DR2.

The controller 940 may measure a fourth distance td4 between the hole image pattern PL1 and the fourth alignment image pattern MPT4 spaced apart from each other along the second extension line MPL2. The fourth distance td4 may be the spacing distance between the hole image pattern PL1 and the fourth alignment image pattern MPT4 in the second direction DR2.

Subsequently, the measured distance is compared to a tolerance range.

The controller 940 may compare the measured first to fourth distances td1, td2, td3 and td4 with a predetermined tolerance range. The first to fourth distances td1, td2, td3 and td4 may be compared to different tolerance ranges. The tolerance ranges compared with the first to fourth distances td1, td2, td3 and td4 may be different depending on the shape of the hole AH and the relative positions between the hole AH and the alignment marks M.

Subsequently, if it is determined that all of the measured distances fall within the tolerance ranges, the controller 940 determines that the display device is normal (step S501 in FIG. 14).

For example, when the hole image pattern PL1_1 is obtained as illustrated in FIG. 17, the measured first to fourth distances td1, td2, td3 and td4 all fall within the tolerance ranges, and thus the controller 940 may determine that the hole AH formed in the display device 1 is correctly aligned. Therefore, the controller 940 may determine that the display device 1 is normal.

If it is determined that at least one of the measured distances does not fall within the tolerance ranges, the controller determines that the display device is defective (step S502 in FIG. 14).

For example, when the hole image pattern PL1_2 is obtained as illustrated in FIG. 18, at least one of the measured first to fourth distances td1, td2, td3 and td4 does not fall within the tolerance ranges, and thus the controller 940 may determine that the hole AH formed in the display device 1 is not correctly aligned. Therefore, the controller 940 may determine that the display device 1 is defective.

As described above, according to the exemplary embodiment of the present disclosure, the plurality of alignment marks M formed as the second sensing conductive layer 172 and/or the first sensing conductive layer 171 may be disposed in the second non-display area NDA2 surrounding the main hole area MH. Therefore, by reducing the spacing distance between the boundary of the hole AH and each of the alignment marks M1, M2, M3 and M4, it is possible to reduce the distance difference for the same error rate in the alignment inspection. Therefore, the efficiency of inspecting the alignment of the hole AH can be improved. In addition, by forming the alignment marks M by utilizing the first sensing conductive layer 171 or the second sensing conductive layer 172 without adding any additional conductive layer to form the alignment marks M, the process efficiency of the display device can be increased.

Further, by disposing the plurality of alignment marks M on both sides of the first direction DR1 and on both sides of the second direction DR2 around the hole AH, it is possible to inspect whether the hole AH is correctly aligned by measuring the spacing distance between the boundary of the hole AH and each of the alignment marks, even if the hole AH is not a circle. Accordingly, it is possible to inspect the alignment of the hole AH regardless of the shape of the hole AH, and thus the development cost can be saved used to develop a new alignment inspection method depending on different shapes of holes AH.

Hereinafter, other exemplary embodiments of the present disclosure will be described. In the following description, the same or similar elements will be denoted by the same or similar reference numerals, and redundant descriptions will be omitted or briefly described. Descriptions will be made focusing on differences from the above exemplary embodiment.

Figure 19:
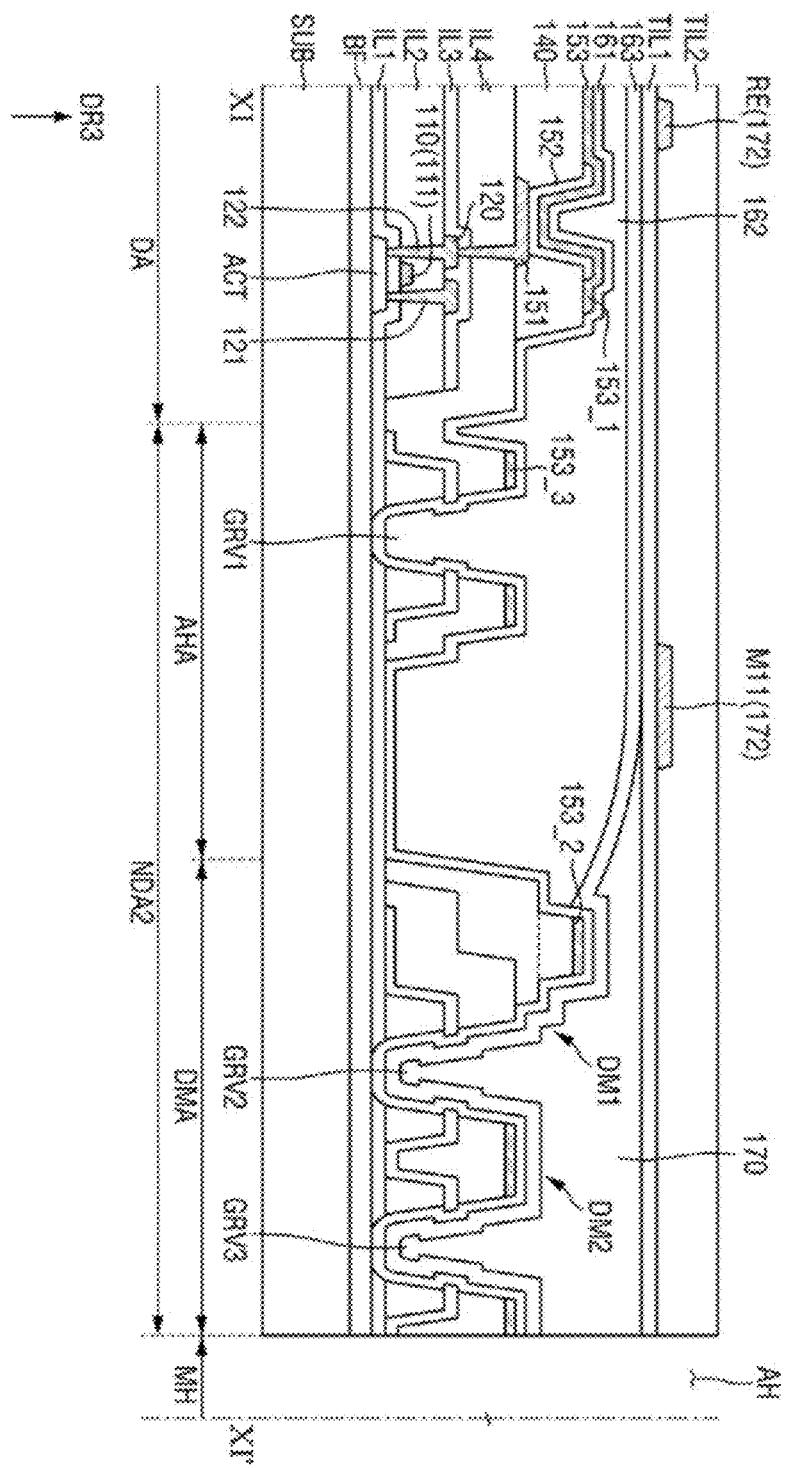
FIG. 19 is a cross-sectional view illustrating yet another example, taken along line XI-XI' of FIG. 9.
Figure 20:
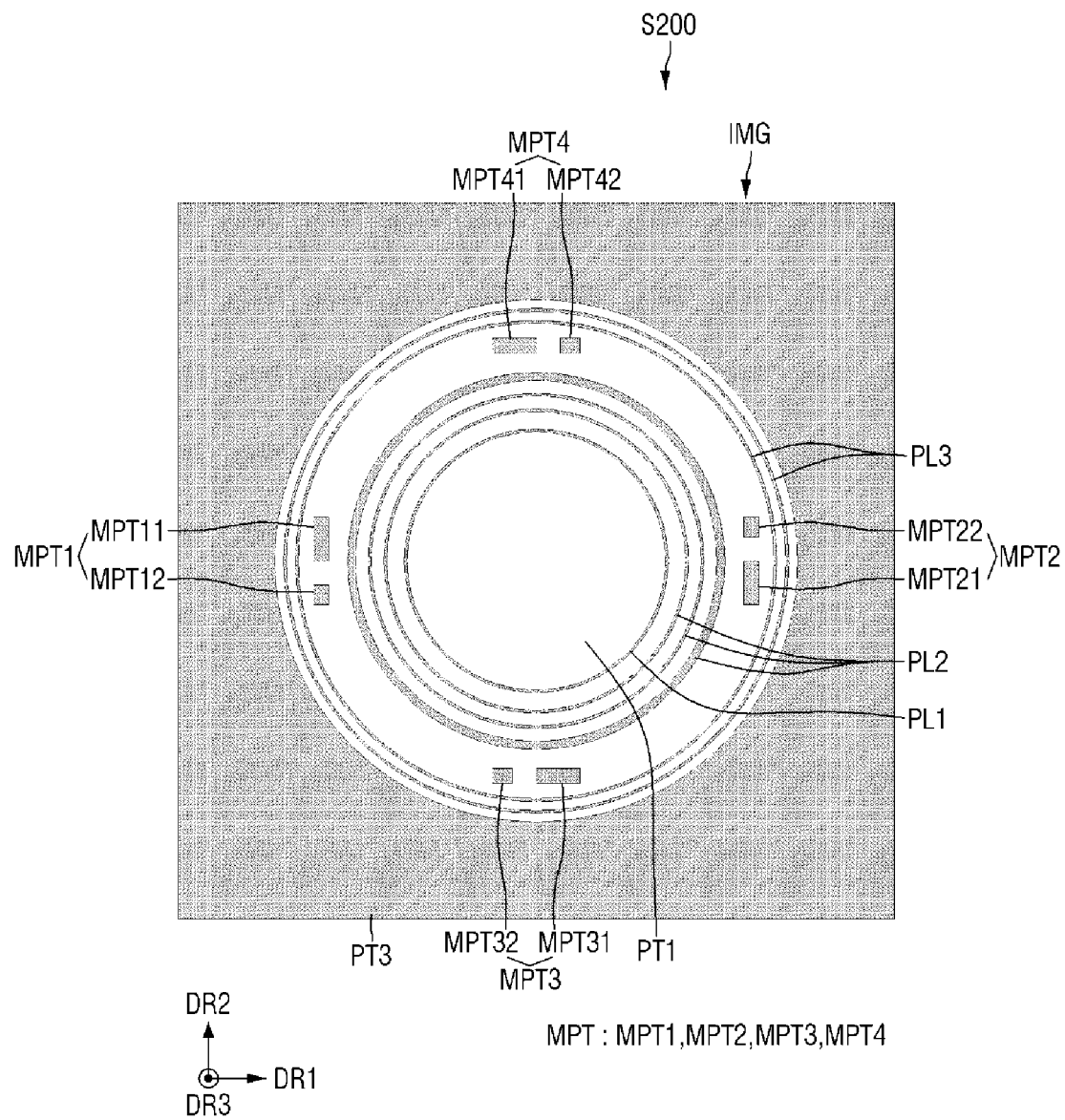
FIG. 20 is an image for inspection on the display device of FIG. 19 captured by the apparatus configured to inspect the alignment according to an exemplary embodiment of the present disclosure.

FIG. 19 is a cross-sectional view illustrating yet another example, taken along line XI-XI' of FIG. 9. FIG. 20 is an image for inspection on the display device of FIG. 19 captured by the apparatus configured to inspect the alignment according to an exemplary embodiment of the present disclosure. The exemplary embodiment of FIG. 19 is different from the exemplary embodiment of FIG. 11 in that a conductive layer formed as the second electrode layer 153 is further formed on the first dam DM1 and the second dam DM2.

Referring to FIG. 19, the second electrode layer 153 may include a first area 153_1 disposed in the display area DA, a second area 153_2 disposed in the dam area DMA, and a third area 153_3 disposed in the peripheral area AHA. The first area 153_1 of the second electrode layer disposed in the display area DA may be the cathode electrode described above. The second area 153_2 of the second electrode layer disposed in the dam area DMA and the third area 153_3 of the second electrode layer disposed in the peripheral area AHA may be disposed on the fourth insulating layer IL4.

The second area 153_2 of the second electrode layer may be formed on the fourth insulating layer IL4 forming the first dam DM1 and the second dam DM2. Side surfaces of the second area 153_2 of the second electrode layer of the first dam DM1 may be formed to be parallel with the side surfaces of the fourth insulating layer IL4. Likewise, the second area 153_2 of the second electrode layer may be formed on the fourth insulating layer IL4 forming the second dam DM2. Side surfaces of the second area 153_2 of the second electrode layer of the second dam DM2 may be formed to be parallel with the side surfaces of the fourth insulating layer IL4. It is, however, to be understood that the present disclosure is not limited thereto. The electrode layer included in the first dam DM1 and the second dam DM2 may be formed as a separate conductive layer other than the second electrode layer 153. The second area 153_2 of the second electrode layer disposed on the first dam DM1 and the second dam DM2 may serve to protect the light-emitting element layer EML and the transistors from an external impact.

Referring to FIGS. 19 and 20, the image IMG for inspection according to the exemplary embodiment may further include a fourth image pattern PL2 corresponding to the second area 153_2 of the second electrode layer disposed in the second non-display area NDA2 and a fifth image pattern PL3 corresponding to a third area 153_3 of the second electrode layer, as well as the hole image pattern PL1, the plurality of alignment image patterns MPT and the third image pattern PT3 corresponding to the display area DA, represented by the dark portions. Also in this instance, it is possible to inspect whether the hole AH is properly aligned by measuring the distance between the hole image pattern PL1 and each of the plurality of alignment image patterns MPT.

Figure 21:
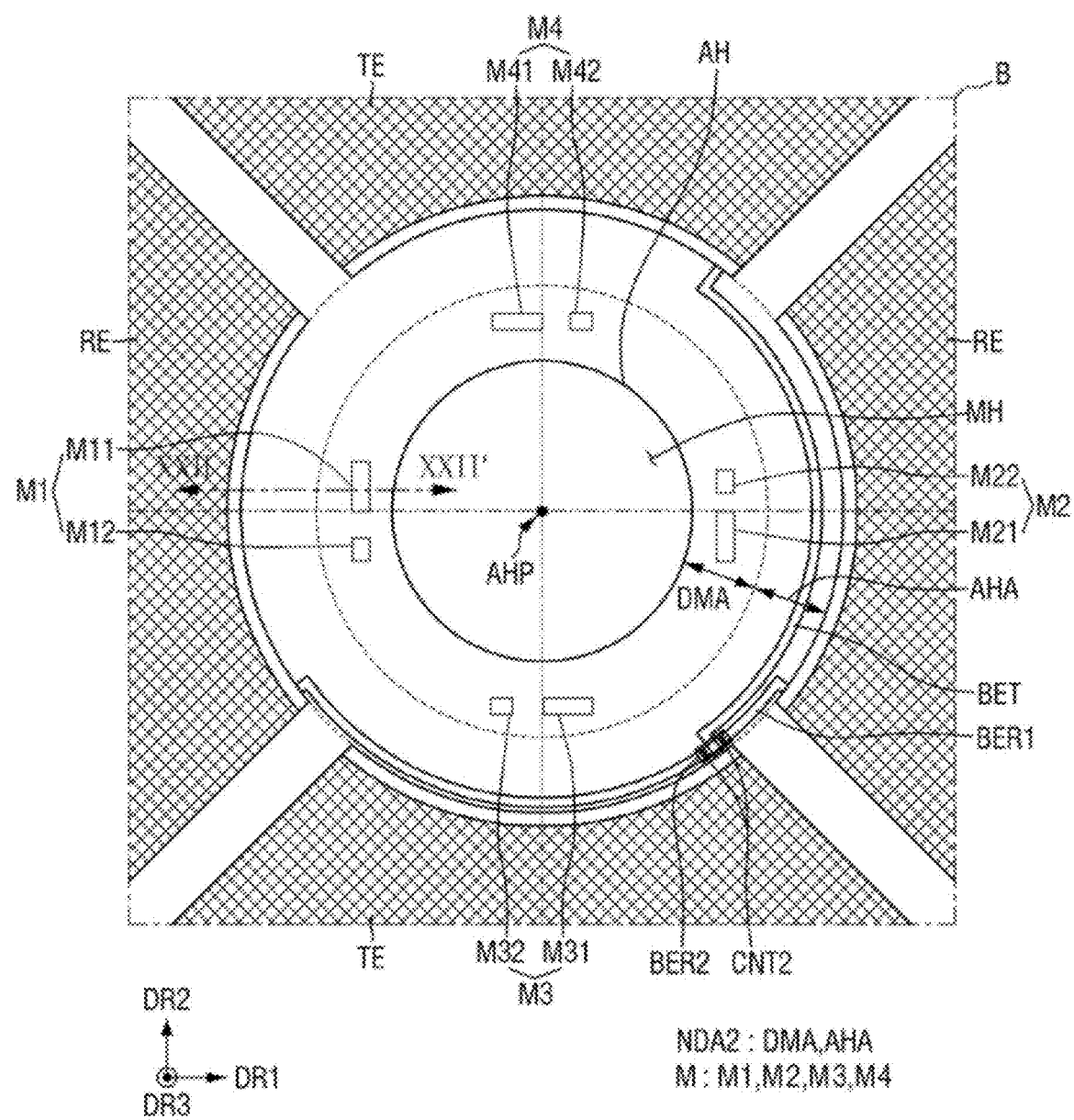
FIG. 21 is an enlarged view illustrating another example of area B of FIG. 5.
Figure 22:
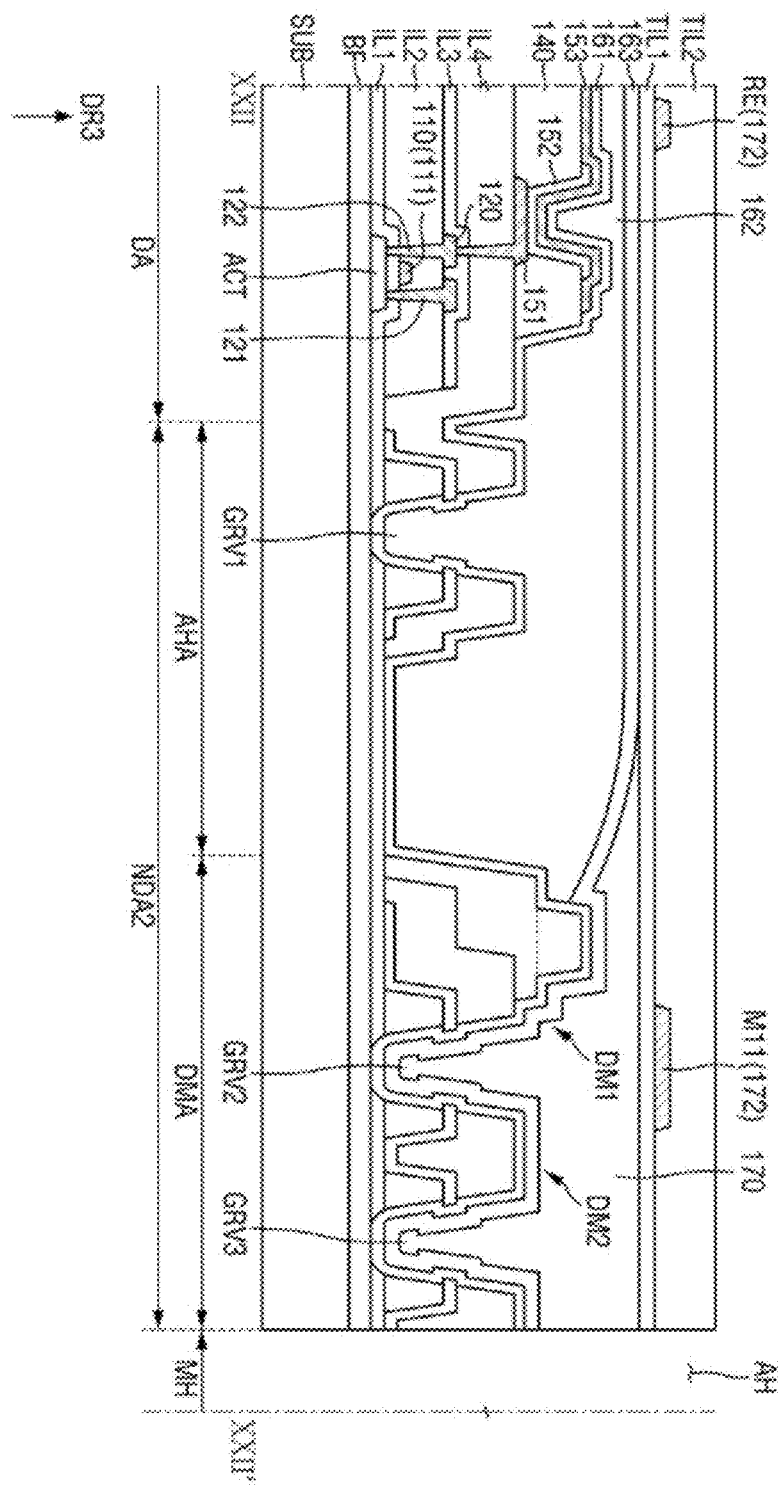
FIG. 22 is a cross-sectional view taken along line XXII-XXII' of FIG. 20.

FIG. 21 is an enlarged view illustrating another example of area B of FIG. 5. FIG. 22 is a cross-sectional view taken along line XXII-XXII' of FIG. 21. The exemplary embodiment of FIG. 21 is different from the exemplary embodiment of FIG. 9 in that a plurality of alignment marks is formed in the dam area.

Referring to FIGS. 21 and 22, the plurality of alignment marks M1, M2, M3 and M4 may be disposed in the dam area DMA. The plurality of alignment marks M1, M2, M3 and M4 may be disposed on the outer planarization layer 170 disposed in the dam area DMA. The plurality of alignment marks M1, M2, M3 and M4 may overlap at least a part of the first dam DM1 and/or the second dam DM2 disposed in the dam area DMA in the third direction DR3.

Figure 23:
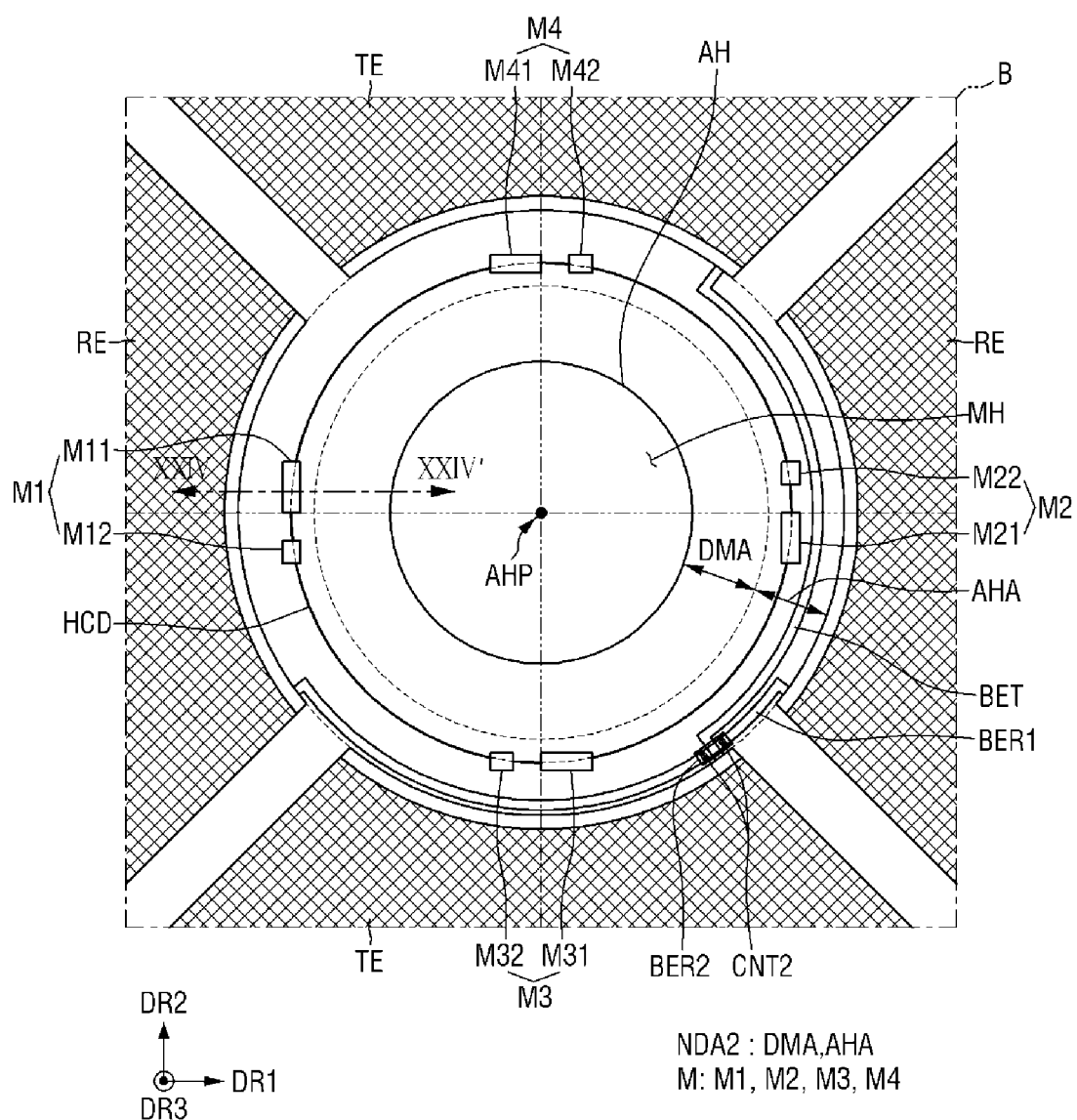
FIG. 23 is an enlarged view illustrating yet another example of area B of FIG. 5.
Figure 24:
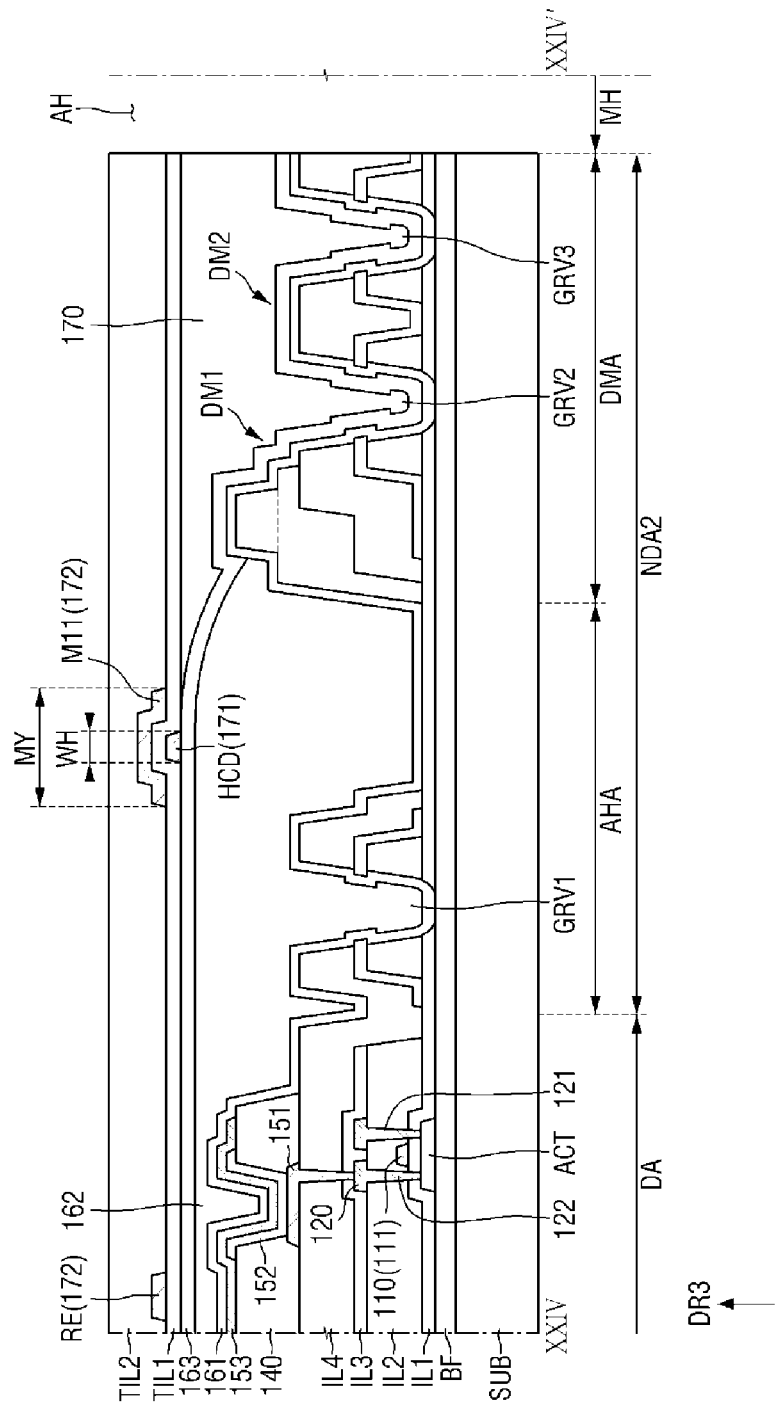
FIG. 24 is a cross-sectional view taken along line XXIV-XXIV' of FIG. 23.
Figure 25:
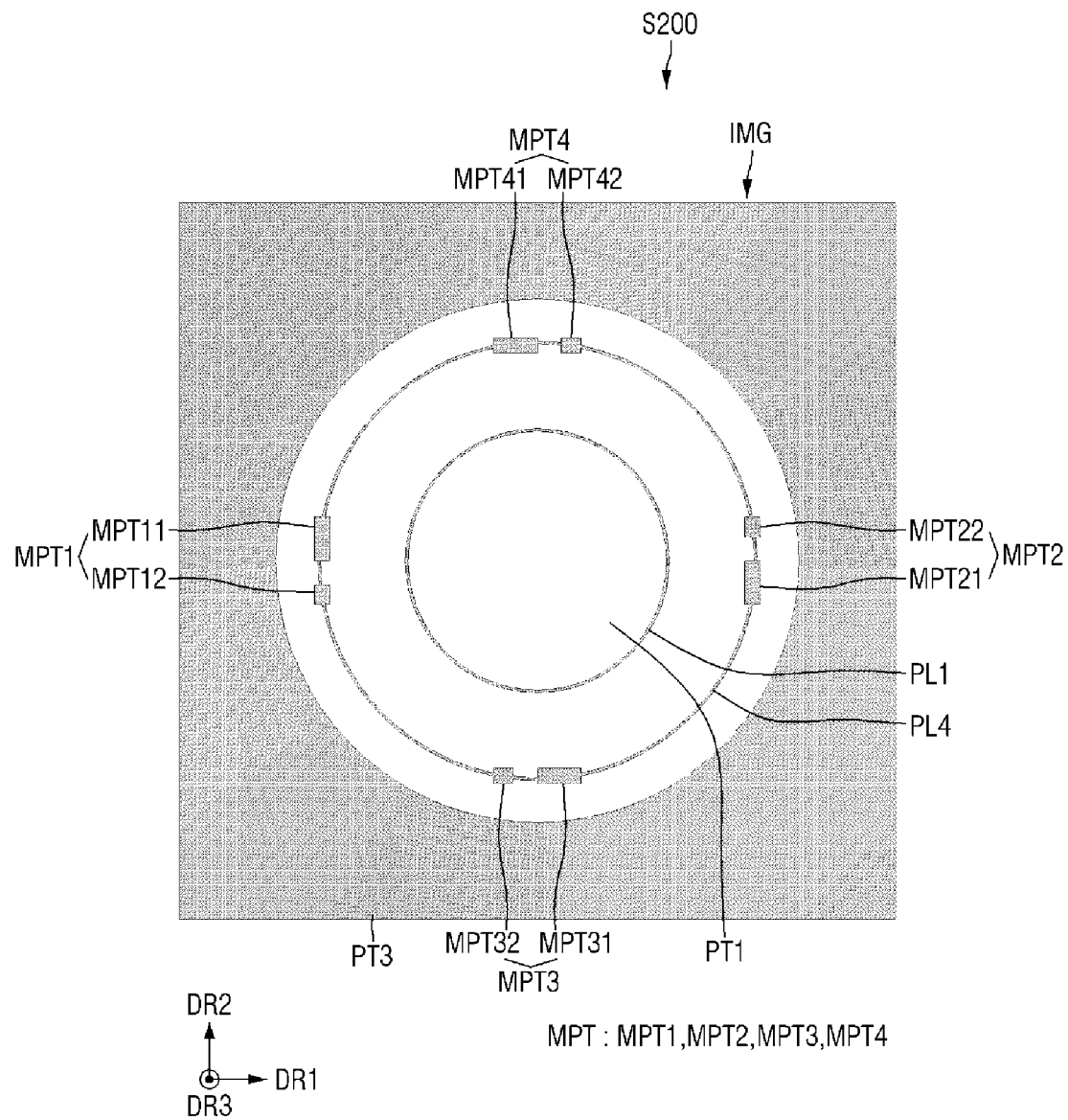
FIG. 25 is an image for inspection on the display device of FIG. 23 captured by the apparatus configured to inspect the alignment according to an exemplary embodiment of the present disclosure.

FIG. 23 is an enlarged view illustrating yet another example of area B of FIG. 5. FIG. 24 is a cross-sectional view taken along line XXIV-XXIV' of FIG. 23. FIG. 25 is an image for inspection on the display device of FIG. 23 captured by the apparatus configured to inspect the alignment according to an exemplary embodiment of the present disclosure. The exemplary embodiment of FIG. 23 is different from the exemplary embodiment of FIG. 9 in that it further includes a test line HCD overlapping the plurality of alignment marks in the third direction DR3.

Referring to FIGS. 23 to 25, the display device may further include a test line HCD disposed in the peripheral area AHA and overlapping the plurality of alignment marks M1, M2, M3 and M4 in the third direction DR3. The test line HCD may have a circular shape when viewed from the top. The test line HCD may be used to check whether the display device 1 is damaged after the process of forming the hole AH.

The test line HCD may be formed as the first sensing conductive layer 171 disposed in the peripheral area AHA. The test line HCD may be disposed on the second inorganic layer 163 of the peripheral area AHA. The width WH of the test line HCD may be smaller than the width MY of the alignment marks M1, M2, M3 and M4. The alignment marks M1, M2, M3 and M4 disposed on the test line HCD may be disposed to completely cover the test line HCD in the third direction DR3. It is, however, to be understood that the present disclosure is not limited thereto. The plurality of alignment marks M1, M2, M3 and M4 may be formed as the first sensing conductive layer 171, and the test line HCD may be formed as the second sensing conductive layer 172.

The transmittance of the light emitted from the light irradiator 920 of the apparatus configured to inspect the alignment of FIG. 13 with respect to the test line HCD may be different from that with respect to the alignment marks M1, M2, M3 and M4. In an exemplary embodiment, the transmittance of the light emitted from the light irradiator 920 with respect to the test line HCD may be higher than that of the alignment marks M1, M2, M3 and M4. That is to say, when the test line HCD is formed as the first sensing conductive layer 171 and the plurality of alignment marks M1, M2, M3 and M4 is formed as the second sensing conductive layer 172, the transmittance of the light emitted from the light irradiator 920 with respect to the first sensing conductive layer 171 may be higher than that with respect to the second sensing conductive layer 172. Therefore, in the alignment inspection process, when the light emitted from the light irradiator 920 has a high transmittance with respect to the test line HCD, the pattern corresponding to the test line HCD is represented as a light portion in the image IMG for inspection captured and created by the camera 930, and thus may not be included in it.

It is, however, to be understood that the present disclosure is not limited thereto. The transmittance of the light emitted from the light irradiator 920 of the apparatus configured to inspect the alignment of FIG. 13 with respect to the test line HCD may be similar to that with respect to the alignment marks M1, M2, M3 and M4. That is to say, the transmittance of the light emitted from the light irradiator 920 with respect to the first sensing conductive layer 171 may be similar to that with respect to the second sensing conductive layer 172. In such case, as illustrated in FIG. 25, the image IMG for inspection captured and created by the camera 930 may include a pattern corresponding to the test line HCD represented as the dark portion.

Referring to FIG. 25, when the transmittance of the light emitted from the light irradiator 920 with respect to the test line HCD is similar to that with respect to the alignment marks M1, M2, M3 and M4, the image for inspection IMG may further include a test image pattern PL4 corresponding to the test line HCD. However, even in this case, because the width of the test image pattern PL4 is smaller than that of the alignment image patterns MPT1, MPT2, MPT3 and MPT4, the alignment image patterns MPT1, MPT2, MPT3 and MPT4 may be recognized as alignment image patterns.

According to the exemplary embodiment of the present disclosure, and illustrated in FIG. 23, the plurality of alignment marks M1, M2, M3 and M4 and the test line HCD disposed in the peripheral area AHA overlap each other in the third direction DR3, thereby reducing the width of the second non-display area NDA2 surrounding the hole AH. In addition, as the widths of the alignment marks M1, M2, M3 and M4 are larger than the width of the test line HCD, even if the alignment marks M1, M2, M3 and M4 overlap the test line HCD, it is still possible to inspect the alignment of the hole AH formed in the display device 1 using the alignment marks M1, M2, M3 and M4.

Figure 26:
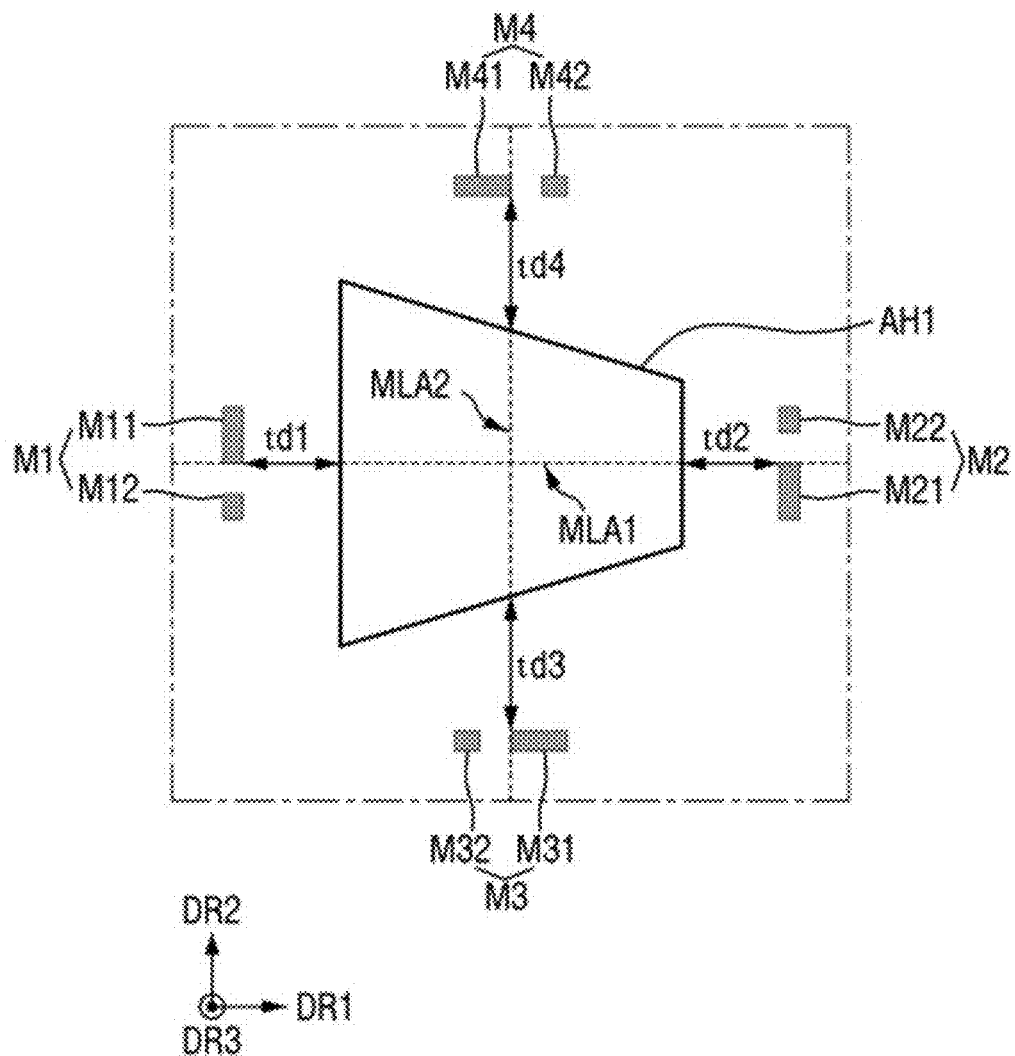
FIG. 26 is a view illustrating a layout of a hole and alignment marks according to another exemplary embodiment of the present disclosure.

FIG. 26 is a view illustrating a layout of a hole and alignment marks according to another exemplary embodiment of the present disclosure. The exemplary embodiment of FIG. 26 is different from the exemplary embodiment of FIG. 9 in that the hole AH has a polygonal shape.

Referring to FIG. 26, a hole AH1 of the display device 1 may have a quadrangular shape when viewed from the top. Even when the hole AH1 has the quadrangular shape when viewed from the top, it is possible to determine whether the hole AH1 formed in the display device 1 is properly aligned by measuring the spacing distance between the boundary of the hole AH1 and each of the alignment marks M1, M2, M3 and M4. Accordingly, it is possible to inspect the alignment by using the relative distance between the hole AH1 and each of the alignment marks M1, M2, M3 and M4 that are disposed on the first to fourth sides, respectively, and are spaced apart from one another, regardless of the shape of the hole AH1. Therefore, it is not necessary to develop different alignment inspection methods for different shapes of holes and thus it is possible to save the time and cost.

Figure 27:
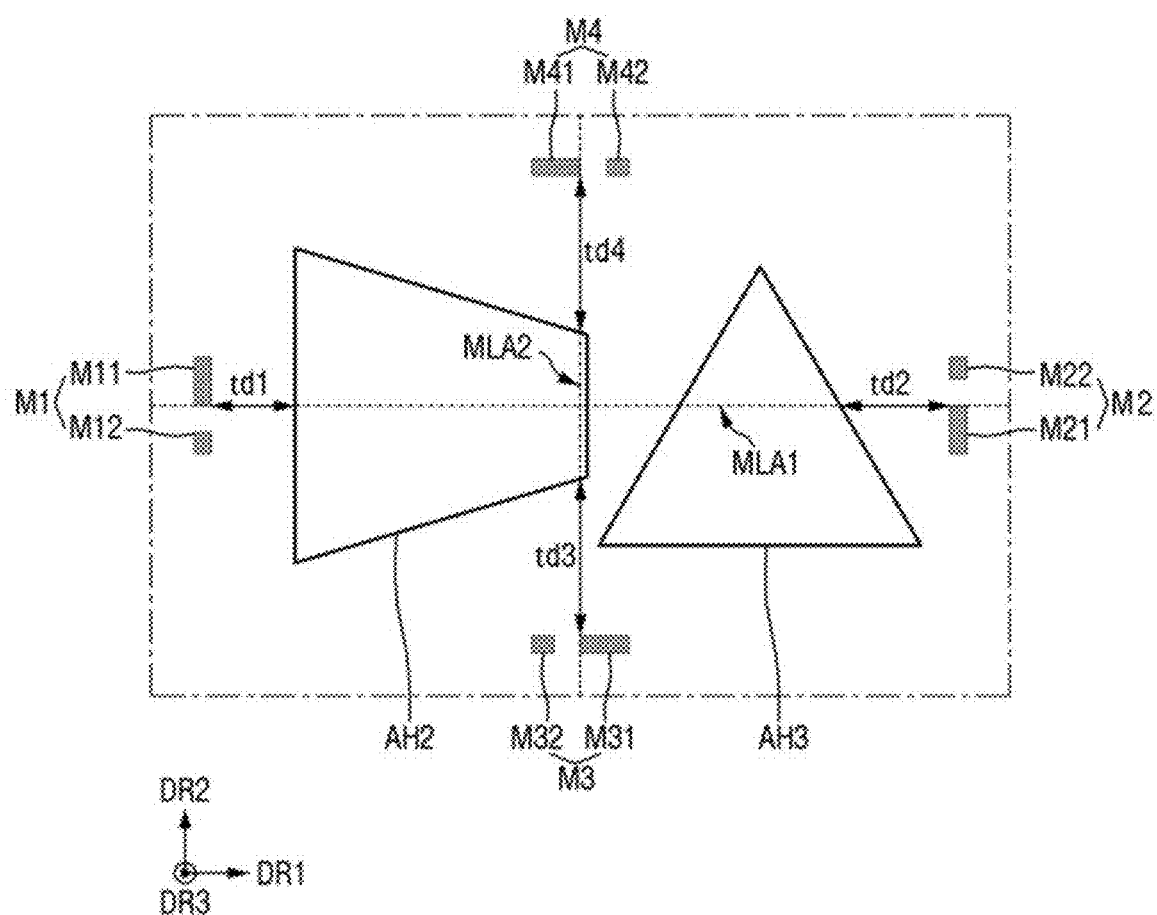
FIG. 27 is a view illustrating a layout of a hole and alignment marks according to yet another exemplary embodiment of the present disclosure.

FIG. 27 is a view illustrating a layout of holes and alignment marks according to yet another exemplary embodiment of the present disclosure.

Referring to FIG. 27, the display device 1 may include a plurality of holes AH2 and AH3. The plurality of holes AH2 and AH3 formed in the display panel 10 of the display device 1 may include a first hole AH2 and a second hole AH3. The first hole AH2 and the second hole AH3 may be spaced apart from each other. The shapes of the first hole AH2 and the second hole AH3 when viewed from the top may be different from each other. It is, however, to be understood that the present disclosure is not limited thereto. The first hole AH2 and the second hole AH3 may have a same shape of different shapes when viewed from the top. In an exemplary embodiment, the first hole AH2 and the second hole AH3 may be spaced apart from each other in the first direction DR1. For example, the second hole AH3 may be disposed on the right side of the first hole AH2.

The plurality of alignment marks M may be disposed in the second non-display area NDA2 surrounding the first hole AH2 and the second hole AH3. The plurality of alignment marks M1, M2, M3 and M4 may be disposed on the first to fourth sides, respectively, and may be spaced apart from the outermost sides of the plurality of holes AH2 and AH3. Specifically, the first alignment mark M1 may be disposed on the left side of the first hole AH2. The second alignment mark M2 may be disposed on the right side of the second hole AH3. The third alignment mark M3 may be disposed on the lower side of the first hole AH2 and the second hole area AH3. The fourth alignment mark M4 may be disposed on the upper side of the first hole AH2 and the second hole AH3.

Figure 28:
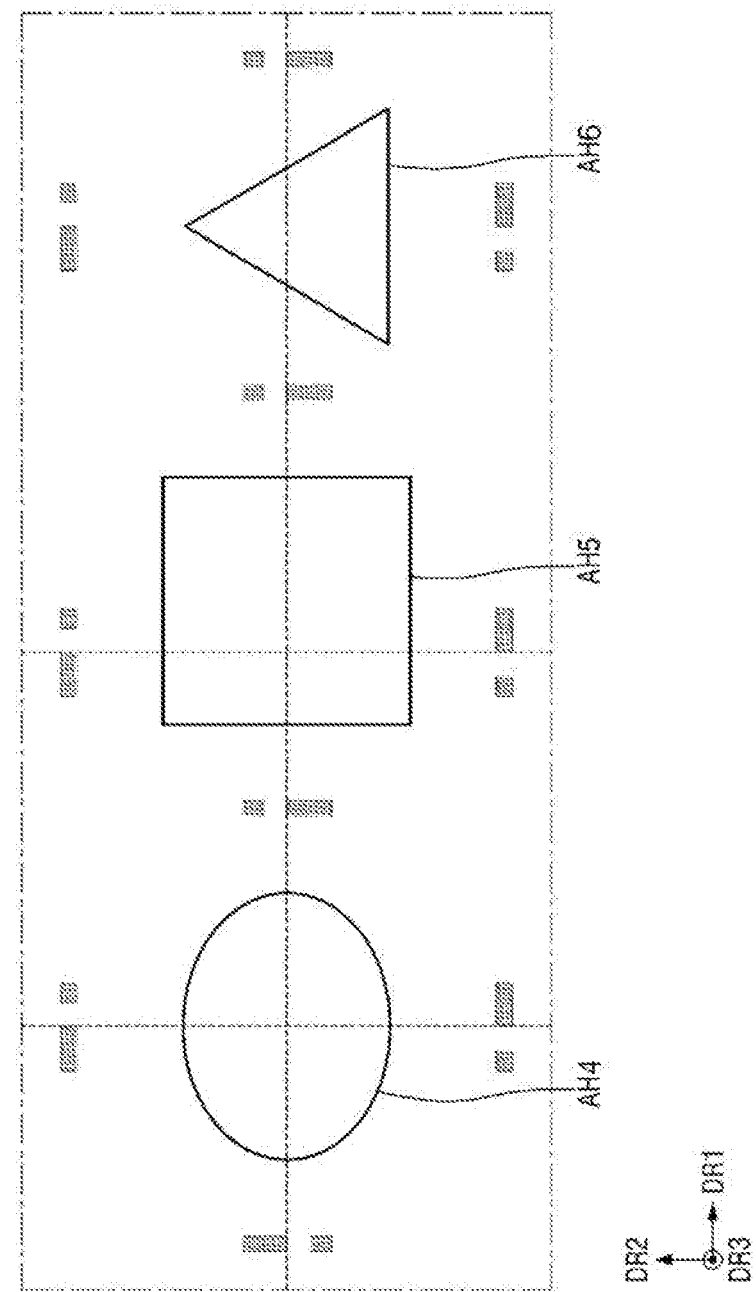
FIG. 28 is a view illustrating a layout of a hole and alignment marks according to yet another exemplary embodiment of the present disclosure.

FIG. 28 is a view illustrating a layout of holes and alignment marks according to yet another exemplary embodiment of the present disclosure.

Referring to FIG. 28, the display device 1 may include a plurality of holes AH4, AH5 and AH6. The plurality of holes may include a first hole AH4, a second hole AH5, and a third hole AH6. The second hole AH5 may be disposed on and spaced apart from the right side of the first hole AH4. The third hole AH6 may be disposed on and spaced apart from the right side of the second hole AH5. The plurality of alignment marks may be further disposed between the holes AH4, AH5 and AH6. According to the exemplary embodiment of the present disclosure, the alignment marks are formed around each of the holes AH4, AH5 and AH6, thereby improving the alignment error rate of the plurality of holes.

Figure 29:
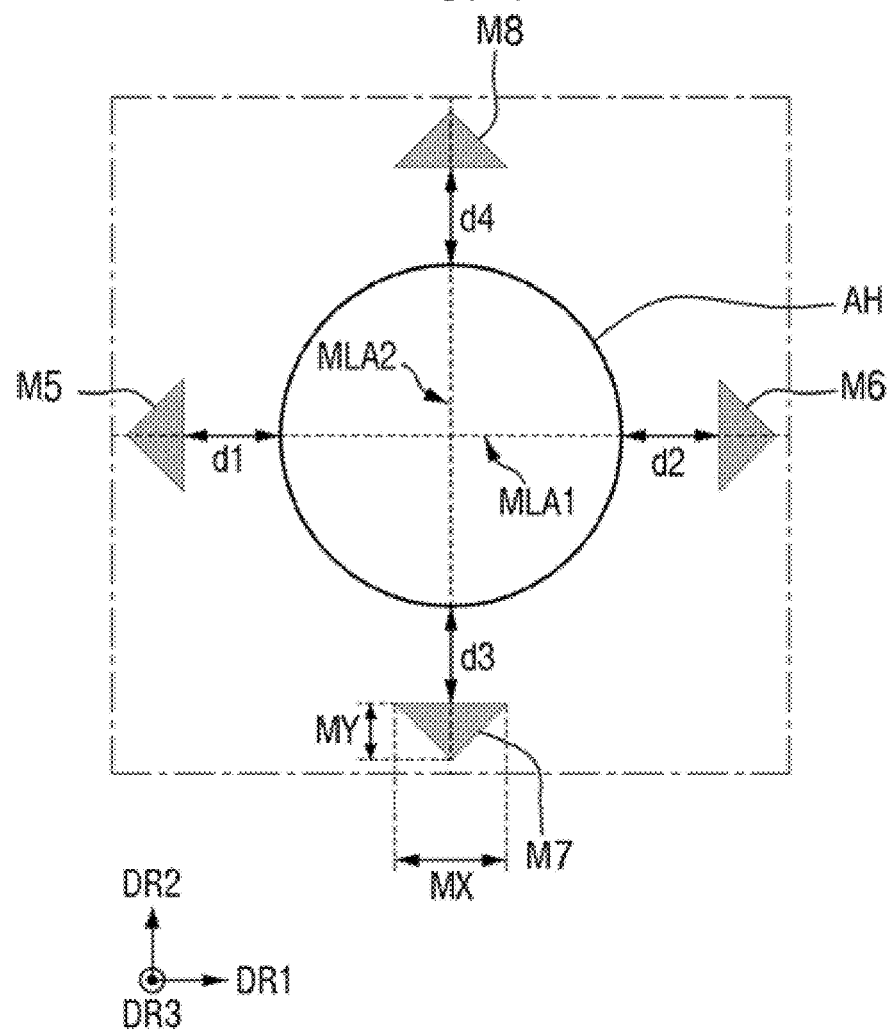
FIG. 29 is a view illustrating a layout of a hole and alignment marks according to yet another exemplary embodiment of the present disclosure.
Figure 30:
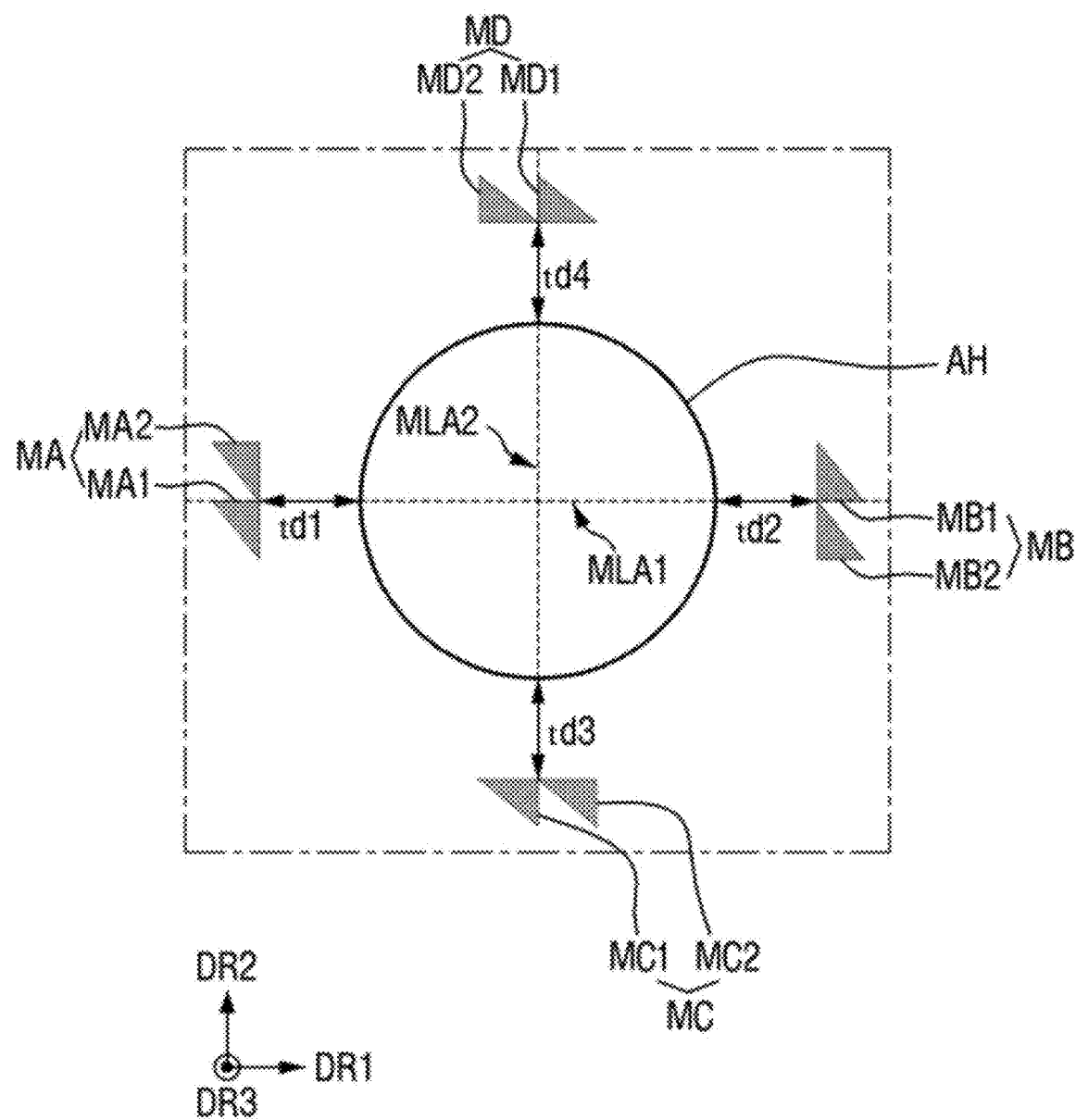
FIG. 30 is a view illustrating a layout of a hole and alignment marks according to yet another exemplary embodiment of the present disclosure.

FIG. 29 is a view illustrating a layout of a hole and alignment marks according to yet another exemplary embodiment of the present disclosure. FIG. 30 is a view illustrating a layout of a hole and alignment marks according to yet another exemplary embodiment of the present disclosure. The exemplary embodiment of FIGS. 29 and 30 is different from the exemplary embodiment of FIG. 9 in that the alignment marks M5, M6, M7 and M8 are formed in a shape other than a bar shape when viewed from the top.

Specifically, the shapes of the alignment marks M5, M6, M7 and M8 may be substantially the same when viewed from the top, but the locations and/or orientations of the alignment marks M5, M6, M7 and M8 may be different from one another. Therefore, the shape of the third alignment mark M7 and MC will be described in detail with respect to FIGS. 29 and 30 respectively; and, the other alignment marks M5, M6, M8, MA, MB, and MD will not be described.

Referring to FIG. 29, a third alignment mark M7 may have a triangle shape such as isosceles, right triangle, or other triangular shape when viewed from the top. The length Mx of the bottom side of the third alignment mark M7 may be greater than its height My. In an exemplary embodiment, the length Mx of the lower side of the third alignment mark M7 may be approximately 100 μm or more. Preferably, the length Mx of the lower side of the third alignment mark M7 may be approximately 150 μm or more. The height My of the third alignment mark M7 may range approximately from 50 μm to 100 μm.

The first alignment mark M5 may be oriented so that vertexes of the first alignment mark M5 face the opposite side in the first direction DR1, that is, the left side when viewed from the top. The second alignment mark M6 may be disposed symmetric to the first alignment mark M5 with respect to the center point of the hole AH. Accordingly, the second alignment mark M6 may be oriented so that the vertexes of the second alignment mark M6 face one side in the first direction DR1, that is, the right side when viewed from the top. The third alignment mark M7 may be oriented so that the vertexes of the third alignment mark M7 face the opposite side in the second direction DR2, that is, the lower side when viewed from the top. The fourth alignment mark M8 may be disposed symmetric to the third alignment mark M7 with respect to the center point of the hole AH. Accordingly, the fourth alignment mark M8 may be oriented so that the vertexes of the fourth alignment mark M8 face one side in the second direction DR2, that is, the upper side when viewed from the top.

According to the exemplary embodiment of the present disclosure, it is possible to measure the distances d1 and d2 between the hole AH and the first and second alignment marks M5 and M6 with respect to an extension line MLA1 connecting a vertex of the first alignment mark M1 and a vertex of the second alignment mark M6 spaced apart from each other in the first direction DR1. Specifically, the controller 940 may measure the first distance d1 between the boundary of the hole AH and the first alignment mark M5 spaced apart from each other along the first extension line MLA1. In addition, the controller 940 may measure the second distance d2 between the boundary of the hole AH and the second alignment mark M6 spaced apart from each other along the first extension line MLA1. Similarly, it is possible to measure the distances d3 and d4 between the hole AH and the third and fourth alignment marks M7 and M8 with respect to an extension line MLA2 connecting a vertex of the third alignment mark M7 and a vertex of the fourth alignment mark M8 spaced apart from each other in the second direction DR2. Specifically, the controller 940 may measure the third distance d3 between the boundary of the hole AH and the third alignment mark M7 spaced apart from each other along the second extension line MLA2. In addition, the controller 940 may measure the fourth distance d4 between the boundary of the hole AH and the fourth alignment mark M8 spaced apart from each other along the second extension line MLA2.

Referring to FIG. 30, the third alignment mark MC may have a double-triangle shape when viewed from the top. The third alignment mark MC may include a third main alignment mark MC1 and a third auxiliary alignment mark MC2. The third main alignment mark MC1 and the third auxiliary alignment mark MC2 may be formed in the same shape and size. Each of the third main alignment mark MC1 and the third auxiliary alignment mark MC2 may have a right-triangle shape.

According to the exemplary embodiment of the present disclosure, it is possible to inspect whether the hole AH is properly aligned by using the first extension line MLA1 extended from the sides of the first main alignment mark MA1 and the second main alignment mark MB1, and the second extension line MLA2 extended from the sides of the third main alignment mark MC1 and the fourth main alignment mark MD1. For example, the controller 940 may measure the distance d1 between the hole AH and the first alignment mark MA and the distance d2 between the hole AH and the second alignment mark MB, spaced apart from each other along the first extension line MLA1, and the distance d3 between the hole AH and the third alignment mark MC and the distance d4 between the hole AH and the fourth alignment mark MD, spaced apart from each other along the second extension line MLA2, to determine whether the hole AH is properly aligned.

In concluding the detailed description, those skilled in the art will appreciate that many variations and modifications can be made to the preferred embodiments without substantially departing from the principles of the present invention. Therefore, the disclosed preferred embodiments of the invention are used in a generic and descriptive sense only and not for purposes of limitation.

Some of the advantages that may be achieved by exemplary implementations/embodiments of the invention and/or exemplary methods of the invention include . . . .

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a substrate comprising a hole, a first non-display area surrounding the hole, and a display area surrounding the first non-display area, wherein the hole penetrates the substrate;
a display unit disposed on the substrate and comprising pixels disposed in the display area; and
sensing electrodes disposed in the display area and a first alignment mark disposed in the first non-display area on the display unit.

2. The display device of claim 1, wherein the substrate further comprises a peripheral area disposed between the first non-display area and the display area, and
wherein the display device further comprises: connection lines disposed in the peripheral area and connecting between the sensing electrodes on the display unit.

3. The display device of claim 1, further comprising: a second alignment mark disposed in the first non-display area on the display unit and spaced apart from the first alignment mark.

4. The display device of claim 3, wherein a minimum distance between the first alignment mark and the second alignment mark is greater than a diameter of the hole.

5. The display device of claim 3, wherein the first alignment mark is symmetric to the second alignment mark with respect to a center point of the hole.

6. The display device of claim 3, further comprising: a third alignment mark disposed in the first non-display area on the display unit and spaced apart from the first alignment mark and the second alignment mark.

7. The display device of claim 1, wherein the sensing electrodes comprise first sensing electrodes electrically connected in a first direction, second sensing electrodes electrically connected in a second direction crossing the first direction, and connectors connecting between the first sensing electrodes adjacent to each other in the first direction,
wherein the connectors are disposed on the display unit, and
wherein the first sensing electrodes and the second sensing electrodes are disposed on a sensing insulating layer disposed on the connectors.

8. The display device of claim 7, wherein the first alignment mark is disposed on the sensing insulating layer.

9. The display device of claim 8, wherein the first alignment mark comprises a same material as the first sensing electrodes and the second sensing electrodes.

10. The display device of claim 7, wherein the first alignment mark is disposed on the display unit.

11. The display device of claim 10, wherein the first alignment mark comprises a same material as the connectors.

12. The display device of claim 1, wherein the first alignment mark comprises a first main alignment mark and a first auxiliary alignment mark having different sizes and spaced apart from each other in a first direction.

13. The display device of claim 12, further comprising:
a second alignment mark disposed in the first non-display area on the display unit and spaced apart from the first alignment mark in a second direction intersecting the first direction.

14. The display device of claim 13, wherein the first alignment mark is symmetric to the second alignment mark with respect to a center point of the hole.

15. The display device of claim 1, wherein the display area fully surrounds the first non-display area, and
wherein the substrate further comprises a second non-display area fully surrounding the display area.

16. A display device comprising:
a substrate comprising a hole, a non-display area surrounding the hole, and a display area surrounding the non-display area;
a display unit disposed on the substrate and comprising pixels disposed in the display area; and
sensing electrodes disposed in the display area and a first alignment mark disposed in the non-display area on the display unit:
a test line disposed in the non-display area on the display unit and overlapping the first alignment mark,
wherein the sensing electrodes comprise first sensing electrodes electrically connected in a first direction, second sensing electrodes electrically connected in a second direction crossing the first direction, and connectors connecting between the first sensing electrodes adjacent to each other in the first direction,
wherein the connectors are disposed on the display unit, and
wherein the first sensing electrodes and the second sensing electrodes are disposed on a sensing insulating layer disposed on the connectors.

17. The display device of claim 16, wherein a light transmittance of the test line is greater than a light transmittance of the first alignment mark.

18. The display device of claim 16, wherein a width of the test line is less than a width of the first alignment mark.

19. The display device of claim 16, wherein the test line is disposed on the display unit, and wherein the first alignment mark is disposed on the sensing insulating layer.

20. The display device of claim 19, wherein the test line comprises a same material as the connectors, and
wherein the first alignment mark comprises a same material as the first sensing electrodes and the second sensing electrodes.

21. A method of inspecting alignment, the method comprising:
placing a display panel on a support, the display panel comprising a hole, a non-display area surrounding the hole and comprising a first alignment mark, and a display area surrounding the non-display area, wherein the hole penetrates the display panel;
capturing an image for inspection on the hole and the first alignment mark in the non-display area from above the hole and the non-display area; and
determining that the display panel is normal if a distance between a first alignment image pattern and a hole image pattern of the image for inspection in a direction is within a tolerance range.

22. The method of claim 21, wherein the first alignment image pattern is associated with the first alignment mark, and
wherein the hole image pattern is associated with the hole.

23. A method of inspecting alignment, the method comprising:
placing a display panel on a support, the display panel comprising a hole, a non-display area surrounding the hole and comprising a first alignment mark, and a display area surrounding the non-display area;
capturing an image for inspection on the hole and the first alignment mark in the non-display area from above the hole and the non-display area;
determining that the display panel is normal if a distance between a first alignment image pattern and a hole image pattern of the image for inspection in a direction is within a tolerance range; and
determining that the display panel is defective if the distance between the first alignment image pattern and the hole image pattern in the image for inspection is not within the tolerance range.

24. A method of inspecting alignment, the method comprising:
placing a display panel on a support, the display panel comprising a hole, a non-display area surrounding the hole and comprising a first alignment mark, and a display area surrounding the non-display area;
capturing an image for inspection on the hole and the first alignment mark in the non-display area from above the hole and the non-display area;
determining that the display panel is normal if a distance between a first alignment image pattern and a hole image pattern of the image for inspection in a direction is within a tolerance range; and
wherein the display panel further comprises a second alignment mark disposed in the non-display area, and
wherein a side of the first alignment image pattern and a side of the second alignment image pattern associated with the second alignment mark are arranged in parallel in the image for inspection.

* * * * *